US012426267B2

(12) United States Patent
Zhou et al.

(10) Patent No.: US 12,426,267 B2
(45) Date of Patent: Sep. 23, 2025

(54) THREE-DIMENSIONAL MEMORY DEVICE AND METHOD OF MAKING THEREOF USING SACRIFICIAL MATERIAL REGROWTH

(71) Applicant: SANDISK TECHNOLOGIES LLC, Addison, TX (US)

(72) Inventors: Bing Zhou, San Jose, CA (US); Senaka Kanakamedala, San Jose, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 539 days.

(21) Appl. No.: 17/821,677

(22) Filed: Aug. 23, 2022

(65) Prior Publication Data

US 2024/0074200 A1 Feb. 29, 2024

(51) Int. Cl.
*H01L 21/285* (2006.01)
*H01L 21/3063* (2006.01)
(Continued)

(52) U.S. Cl.
CPC ....... *H10B 43/35* (2023.02); *H01L 21/28562* (2013.01); *H01L 21/3063* (2013.01);
(Continued)

(58) Field of Classification Search
CPC ........ H10B 43/35; H10B 41/10; H10B 41/35; H10B 43/10; H10B 43/27; H01L 21/28562; H01L 21/3063
See application file for complete search history.

(56) References Cited

U.S. PATENT DOCUMENTS 9,768,192 B1 * 9/2017 Nakamura ............. H10B 43/27
9,780,034 B1 10/2017 Tsutsumi et al.
(Continued)

OTHER PUBLICATIONS

U.S. Appl. No. 17/355,955, filed Jun. 23, 2021, SanDisk Technologies LLC.

(Continued)

*Primary Examiner* — Galina G Yushina

(74) *Attorney, Agent, or Firm* — THE MARBURY LAW GROUP PLLC

(57) ABSTRACT

A first-tier alternating stack of first-tier insulating layers and first-tier sacrificial material layers is formed over a substrate. A first-tier memory opening is formed, and is filled with a first-tier sacrificial memory opening fill structure. A second-tier alternating stack of second-tier insulating layers and second-tier sacrificial material layers is formed. An etch mask layer is formed, and a second-tier memory opening is formed through the second-tier alternating stack. An etch mask removal process is performed which collaterally removes a top portion of the first-tier sacrificial memory opening fill structure. A sacrificial pillar structure is formed by performing a selective material deposition process. An inter-tier memory opening is formed by removing the first-tier sacrificial memory opening fill structure and at least a central portion of the sacrificial pillar structure. A memory opening fill structure is formed, and the sacrificial material layers are replaced with electrically conductive layers.

14 Claims, 48 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.
CPC ............. *H10B 41/10* (2023.02); *H10B 41/27* (2023.02); *H10B 41/35* (2023.02); *H10B 43/10* (2023.02); *H10B 43/27* (2023.02)

(56) References Cited

U.S. PATENT DOCUMENTS

| | | | | |
|---|---|---|---|---|
| 9,991,280 | B2 | 6/2018 | Nakamura et al. | |
| 10,056,399 | B2 | 8/2018 | Costa et al. | |
| 10,103,169 | B1 | 10/2018 | Ge et al. | |
| 10,242,994 | B2 | 3/2019 | Inomata et al. | |
| 10,672,780 | B1 * | 6/2020 | Kawamura | H10B 43/27 |
| 10,847,376 | B2 | 11/2020 | Osawa et al. | |
| 10,854,513 | B2 | 12/2020 | Kawasaki et al. | |
| 11,018,152 | B2 | 5/2021 | Hinoue et al. | |
| 11,101,284 | B2 | 8/2021 | Pachamuthu et al. | |
| 11,296,101 | B2 | 4/2022 | Lee et al. | |
| 2017/0179154 | A1 * | 6/2017 | Furihata | H10D 89/911 |
| 2017/0236835 | A1 | 8/2017 | Nakamura et al. | |
| 2017/0271261 | A1 | 9/2017 | Tsutsumi et al. | |
| 2017/0271352 | A1 | 9/2017 | Nakamura et al. | |
| 2018/0006049 | A1 | 1/2018 | Inomata et al. | |
| 2018/0182771 | A1 | 6/2018 | Costa et al. | |
| 2018/0331117 | A1 | 11/2018 | Titus et al. | |
| 2020/0006080 | A1 | 1/2020 | Osawa et al. | |
| 2020/0227318 | A1 | 7/2020 | Kawasaki et al. | |
| 2020/0251479 | A1 * | 8/2020 | Sakakibara | H01L 21/76895 |
| 2020/0251485 | A1 * | 8/2020 | Kakazu | H10B 41/35 |
| 2020/0251486 | A1 * | 8/2020 | Tsutsumi | H10B 41/10 |
| 2021/0005627 | A1 | 1/2021 | Hinoue et al. | |
| 2021/0391345 | A1 * | 12/2021 | Otsu | H10B 43/35 |
| 2022/0208785 | A1 * | 6/2022 | Titus | H10B 41/10 |
| 2022/0246636 | A1 * | 8/2022 | Tobioka | H10B 43/35 |

OTHER PUBLICATIONS

U.S. Appl. No. 17/485,949, filed Sep. 21, 2021, SanDisk Technologies LLC.
U.S. Appl. No. 17/494,114, filed Oct. 5, 2021, SanDisk Technologies LLC.
U.S. Appl. No. 17/508,036, filed Oct. 22, 2021, SanDisk Technologies LLC.
U.S. Appl. No. 17/590,278, filed Feb. 1, 2022, SanDisk Technologies LLC.
U.S. Appl. No. 17/657,521, filed Mar. 31, 2022, SanDisk Technologies LLC.
U.S. Appl. No. 17/660,265, filed Apr. 22, 2022, SanDisk Technologies LLC.
U.S. Appl. No. 17/660,278, filed Apr. 22, 2022, SanDisk Technologies LLC.
Endoh et al., "Novel Ultra High-Density Memory with a Stacked-Surrounding Gate Transistor (S-SGT) Structured Cell," IEDM Proc. (2001) 33-36.

* cited by examiner

B

THREE-DIMENSIONAL MEMORY DEVICE AND METHOD OF MAKING THEREOF USING SACRIFICIAL MATERIAL REGROWTH

FIELD

The present disclosure relates generally to the field of semiconductor devices, and particularly to a three-dimensional memory device and a method of making thereof by selectively growing sacrificial pillar structures to suppress of memory opening widening.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a semiconductor structure is provided, which comprises: forming a first-tier alternating stack of first-tier insulating layers and first-tier sacrificial material layers over a substrate; forming a first-tier memory opening through the first-tier alternating stack; forming a first-tier sacrificial memory opening fill structure in the first-tier memory opening; forming a second-tier alternating stack of second-tier insulating layers and second-tier sacrificial material layers over the first-tier alternating stack; forming an etch mask layer comprising an opening therethrough over the second-tier alternating stack; forming a second-tier memory opening through the second-tier alternating stack, wherein a top surface of the first-tier sacrificial memory opening fill structure is physically exposed underneath the second-tier memory opening; removing the etch mask layer employing an etch mask removal process that collaterally removes a top portion of the first-tier sacrificial memory opening fill structure; forming a sacrificial pillar structure by performing a selective material deposition process that grows a sacrificial fill material from a top surface of a remaining portion of the first-tier sacrificial memory opening fill structure while suppressing growth of the sacrificial fill material from physically exposed surfaces of the first-tier alternating stack and the second-tier alternating stack; forming an inter-tier memory opening by removing the first-tier sacrificial memory opening fill structure and at least a central portion of the sacrificial pillar structure; forming a memory opening fill structure in the inter-tier memory opening, wherein the memory opening fill structure comprises a vertical stack of memory elements that are formed at levels of the first-tier sacrificial material layers and the second-tier sacrificial material layers; and replacing the first-tier sacrificial material layers and the second-tier sacrificial material layers with electrically conductive layers.

According to another aspect of the present disclosure, a memory device is provided, which comprises: a first-tier alternating stack of first-tier insulating layers and first-tier electrically conductive layers; a second-tier alternating stack of second-tier insulating layers and second-tier electrically conductive layers located over the first-tier alternating stack; a memory opening fill structure vertically extending through the second-tier alternating stack and the first-tier alternating stack and comprising a memory film and a vertical semiconductor channel; and a tubular carbon-based structure laterally surrounded by a topmost first-tier insulating layer within the first-tier alternating stack and laterally surrounding and contacting the memory opening fill structure.

According to yet another aspect of the present disclosure, a memory device is provided, which comprises: a first-tier alternating stack of first-tier insulating layers and first-tier electrically conductive layers; a second-tier alternating stack of second-tier insulating layers and second-tier electrically conductive layers located over the first-tier alternating stack; and a memory opening fill structure vertically extending through the second-tier alternating stack and the first-tier alternating stack and comprising a memory film and a vertical semiconductor channel, wherein the memory opening fill structure comprises: a first straight section comprising a first cylindrical straight sidewall that vertically extends through each of the first-tier electrically conductive layers, a second straight section comprising a second cylindrical straight sidewall that vertically extends through each of the second-tier electrically conductive layers, and a laterally-protruding section that laterally protrudes outward from a top periphery of the first cylindrical straight sidewall and from a bottom periphery of the second cylindrical straight sidewall; and wherein a bottom portion of the second straight section has a greater lateral dimension than a top portion of the first straight section.

DETAILED DESCRIPTION

Figure 1A:
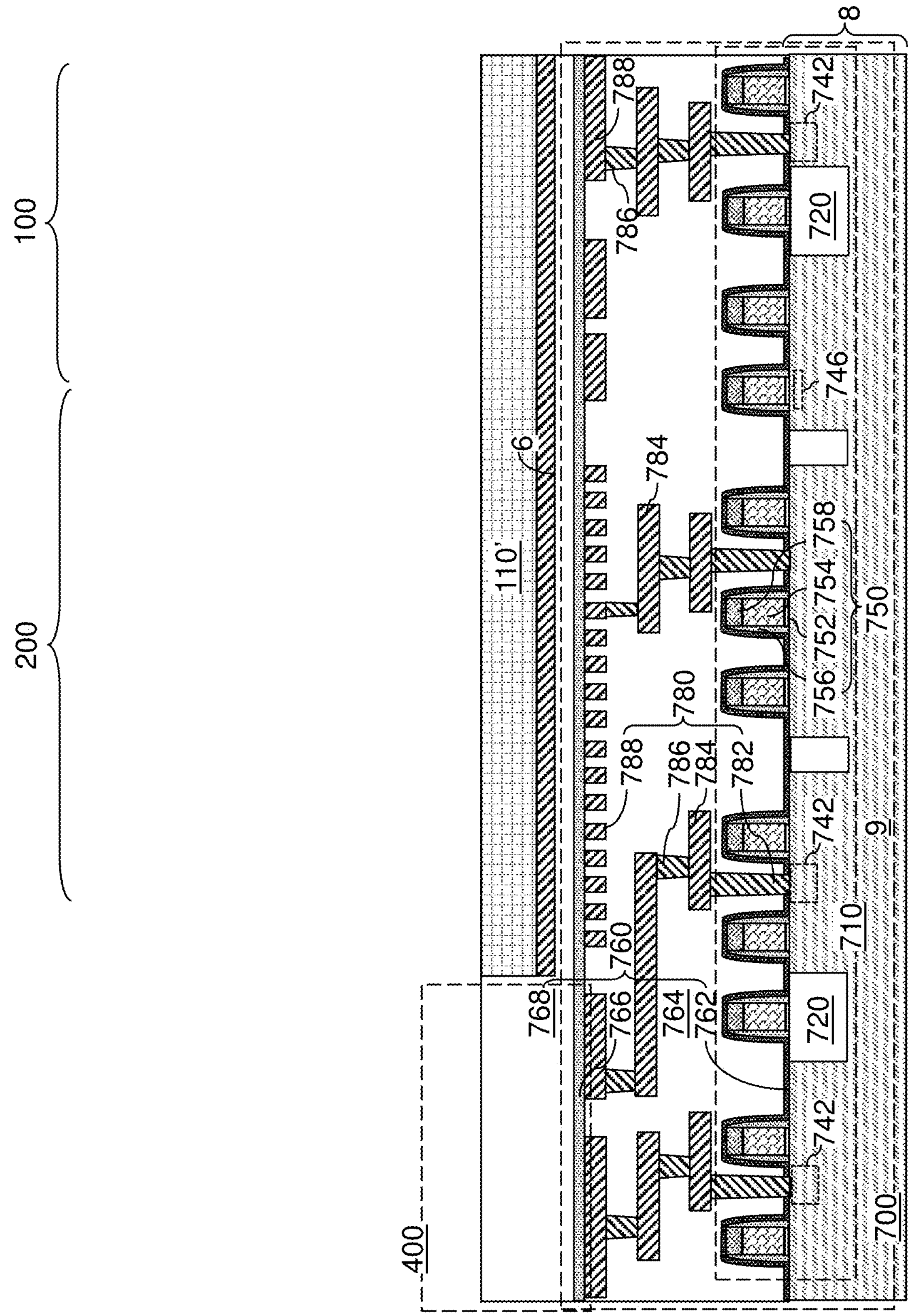
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

Embodiments of the present disclosure are directed to a three-dimensional memory device and a method of making thereof by selectively growing sacrificial pillar structures to suppress of memory opening widening. The embodiments of the present disclosure may be used to form various semiconductor devices, such as three-dimensional memory Devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

In a multi-tier 3D NAND structure, memory openings vertically extend through multiple tier structures (e.g., alternating stacks of insulating layers and electrically conductive layers comprising word lines and select gate electrodes). Portions of memory openings in a lower-tier structure (such as a bottom-tier structure) tend to become wider due to subsequent etch steps, recess steps, and clean steps that are performed after initial formation of portions of the memory opening through the lower-tier structure. The increase in the lateral dimension of each portion of the memory opening in the lower-tier structure through the various etch steps, recess steps, and clean steps is herein referred to as an integration critical dimension (CD) bias. The greater the total number of tiers in a 3D NAND structure, the larger the integration CD bias for the portions of the memory openings in a lower tier. In comparative exemplary methods, the lower portions of the memory openings may be initially formed with a smaller lateral dimension to compensate for the integration CD bias for the portions of the memory openings in the lower tier. The reduction in the lateral dimension of the lower portions of the memory openings employing a reactive ion etch process is difficult because etch rate of materials in a high aspect ratio opening is reduced significantly. The reduction in the etch rate during the reactive ion etch process limits the total stack height for the lower tier, and thus also limits the total number of memory bits that can be stored within the lower tier per memory opening fill structure.

According to an aspect of the present disclosure, selective regrowth of a sacrificial fill material after collateral recessing of a pre-existing sacrificial fill material can be employed to reduce the impact of a memory opening widening only to upper tier structures. In this case, the integration CD bias decreases for a lower tier, and the memory openings through the lower tier may be formed with greater lateral dimensions, and thus, at a higher etch rate during a reactive ion etch process. The selective regrowth of a sacrificial memory opening fill material can be employed to reduce the integration CD bias and to reduce the memory opening aspect ratio for the tier structures for which the selective regrowth is employed. Generally, the selective regrowth sacrificial material may comprise carbon-based material such as undoped or doped carbon.

Figure 1B:
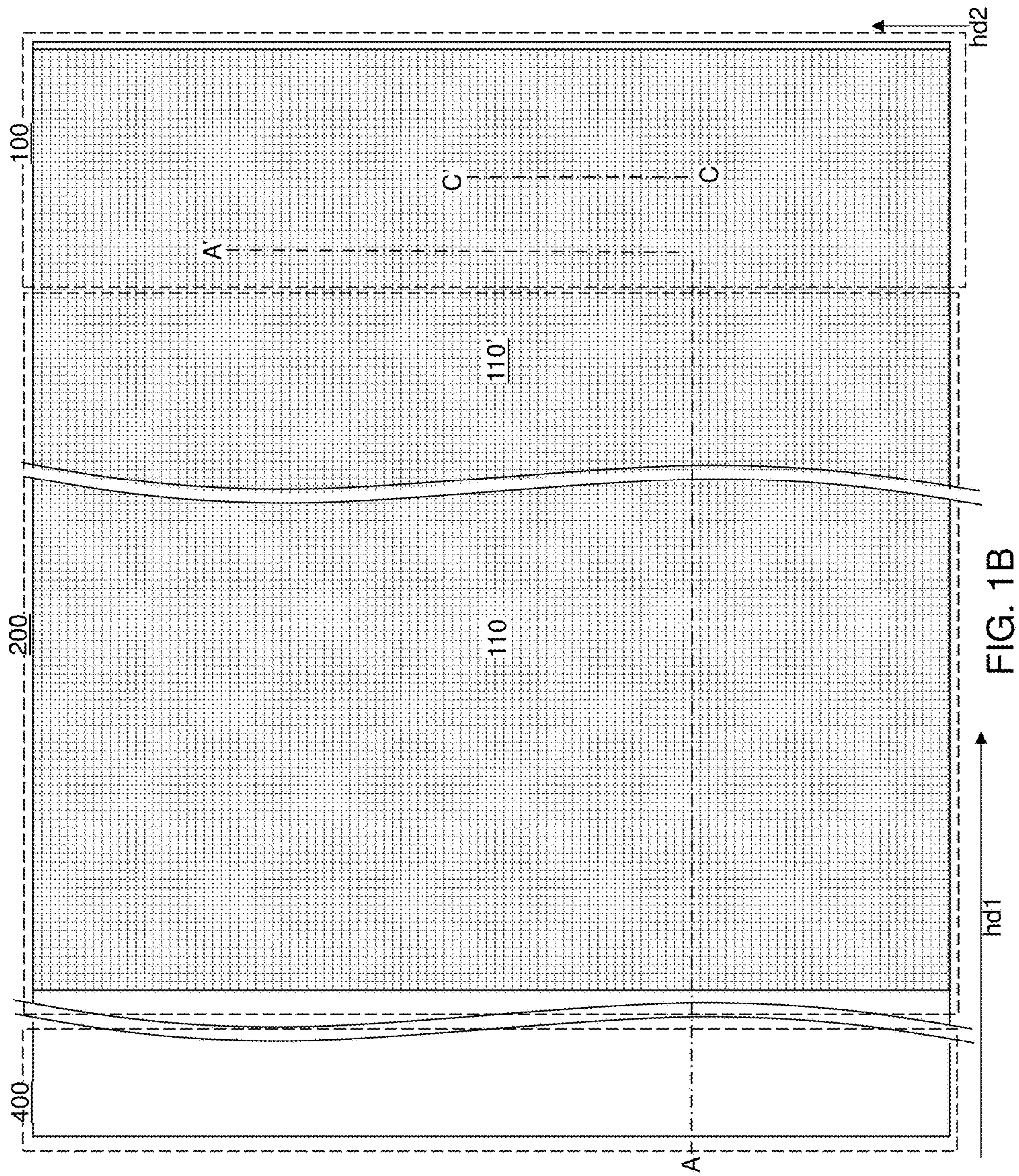
FIG. 1B is a top-down view of the exemplary structure of FIG. 1A. The hinged vertical plane A-A' is the plane of the vertical cross-sectional view of FIG. 1A.
Figure 1C:
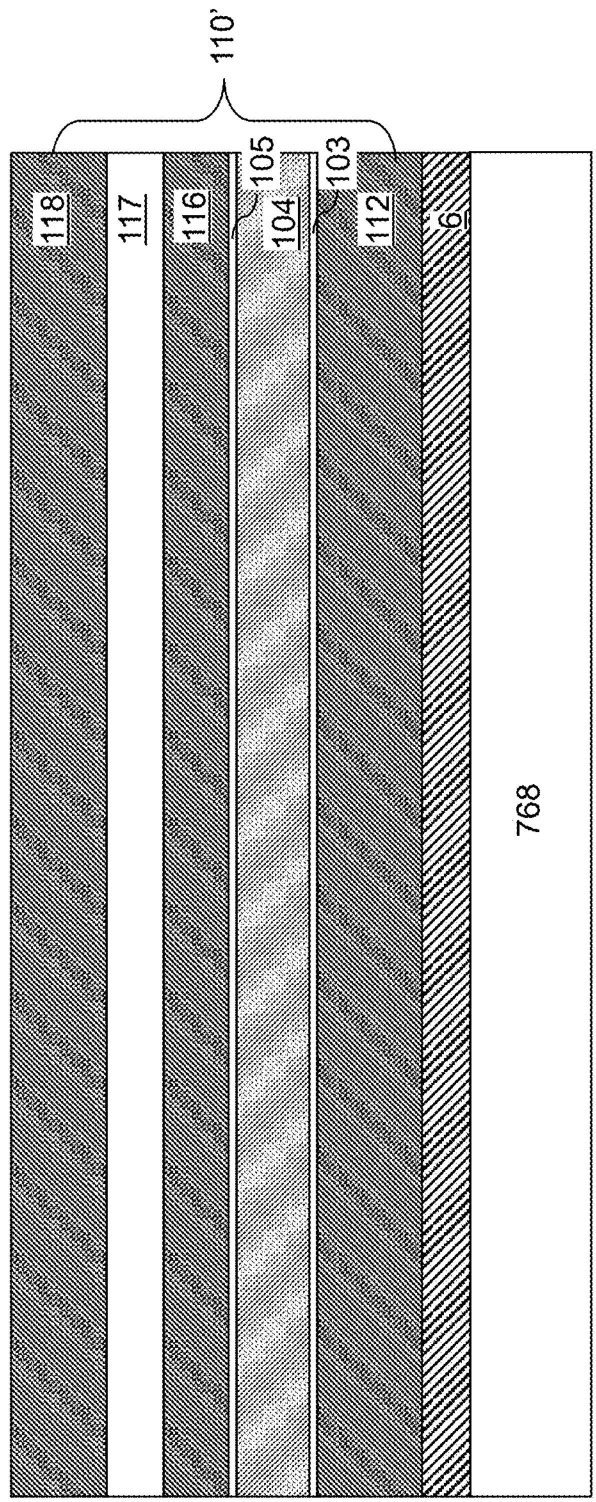
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
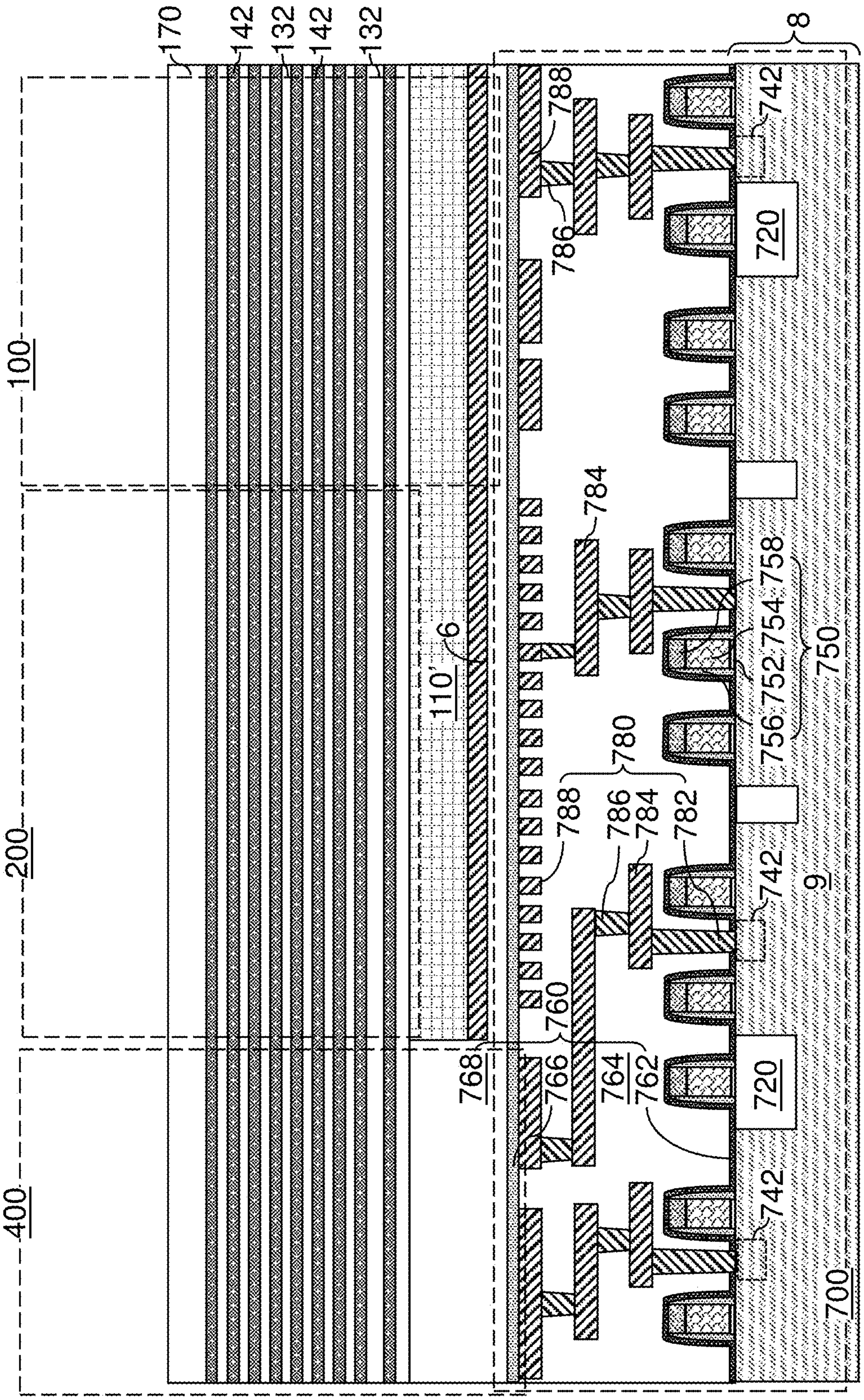
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
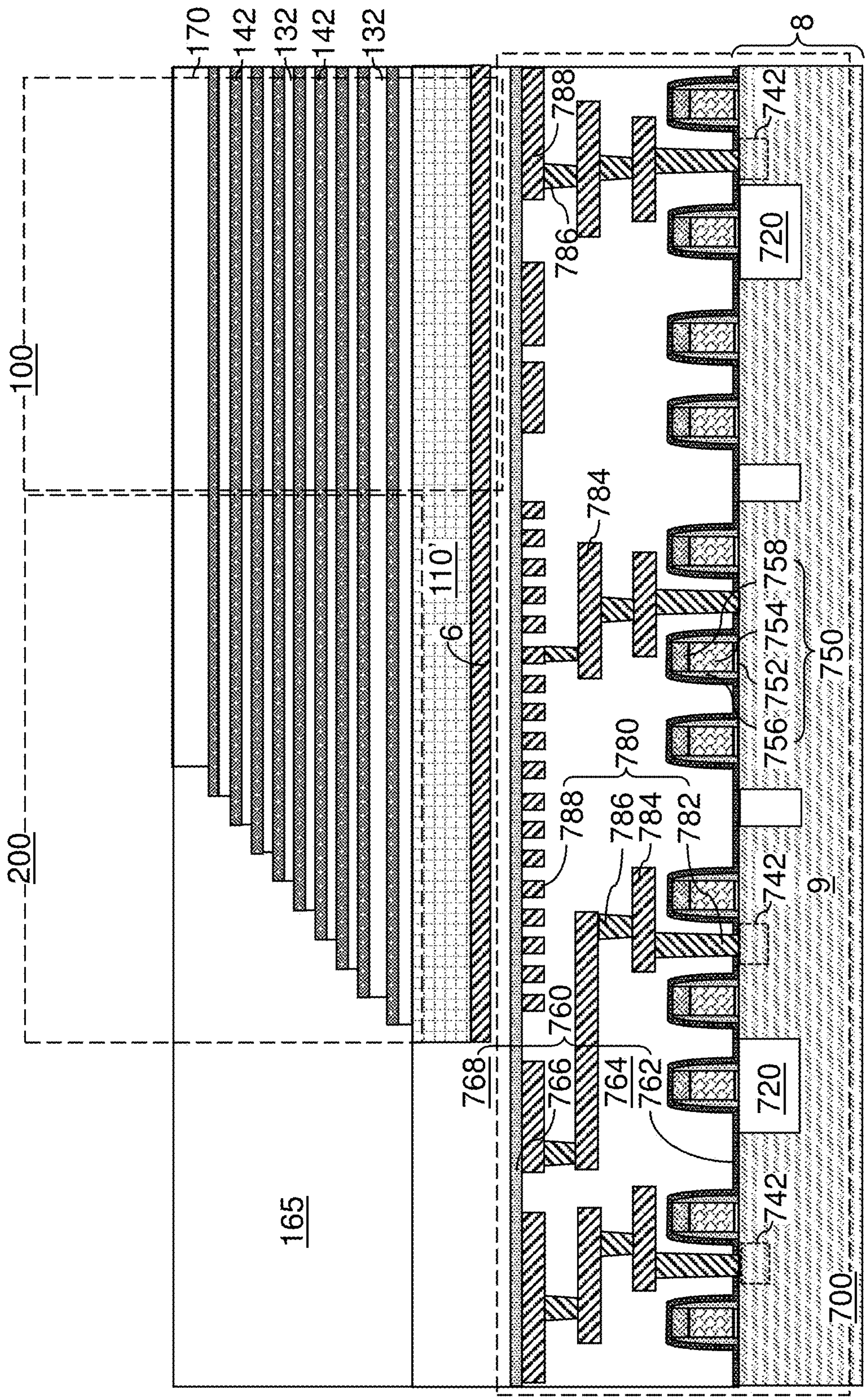
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

Figure 4A:
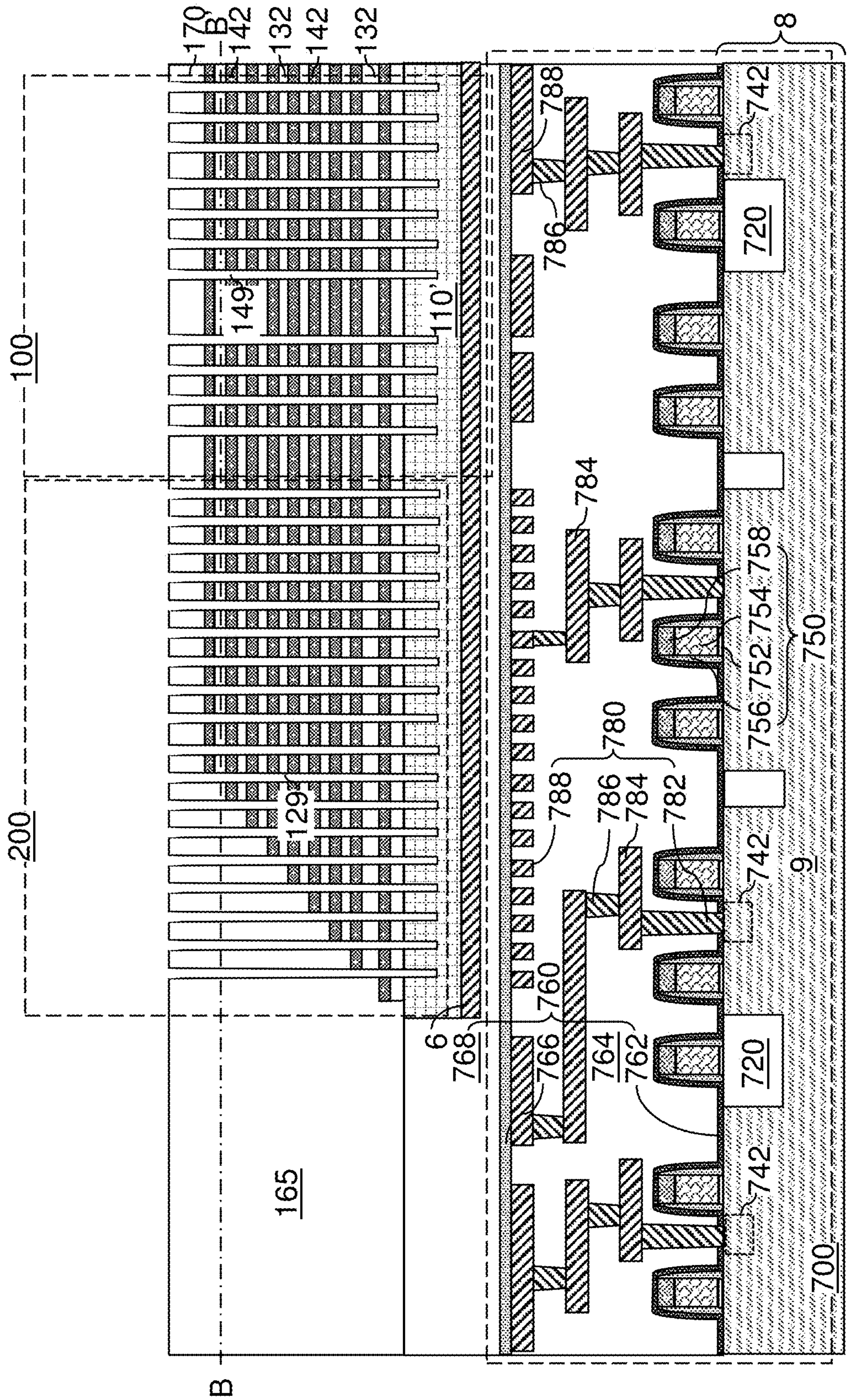
FIG. 4A is a vertical cross-sectional view of the exemplary structure after formation of first-tier memory openings and first-tier support openings according to an embodiment of the present disclosure.
Figure 4B:
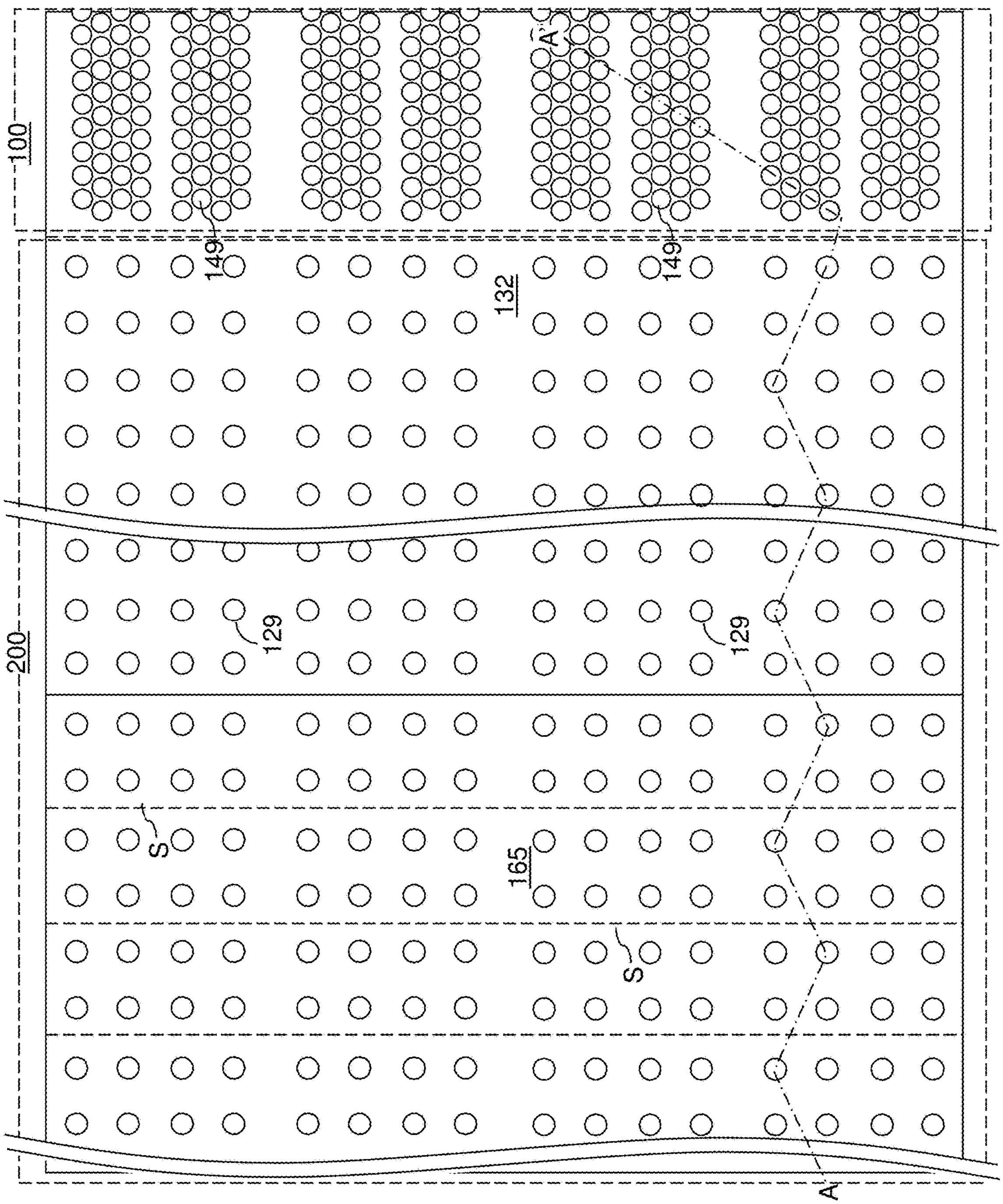
FIG. 4B is a horizontal cross-sectional view of the exemplary structure along the horizontal plane B-B' of FIG. 4A. The hinged vertical plane A-A' corresponds to the plane of the vertical cross-sectional view of FIG. 4A.

Referring to FIGS. 4A and 4B, various first-tier openings (149, 129) may be formed through the first-tier structure (132, 142, 170, 165) and into the in-process source-level material layers 110'. A carbon-based hard mask layer (e.g., amorphous carbon Advanced Patterning Film available from Applied Materials, Inc., or another carbon hard mask layer, not shown) may be formed over the tier-tier structure (132, 142, 170, 165), and a photoresist layer (not shown) may be formed over the carbon-based hard mask layer. The photoresist layer may be lithographically patterned to form various openings therethrough. The pattern of openings in the photoresist layer may be transferred through the carbon-based hard mask layer and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

The photoresist layer may be consumed during the first anisotropic etch process, and the patterned carbon-based hard mask layer may be employed as an etch mask during a remainder of the first anisotropic etch process. After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The patterned carbon-based hard mask layer may be subsequently removed, for example, by ashing.

Figure 5:
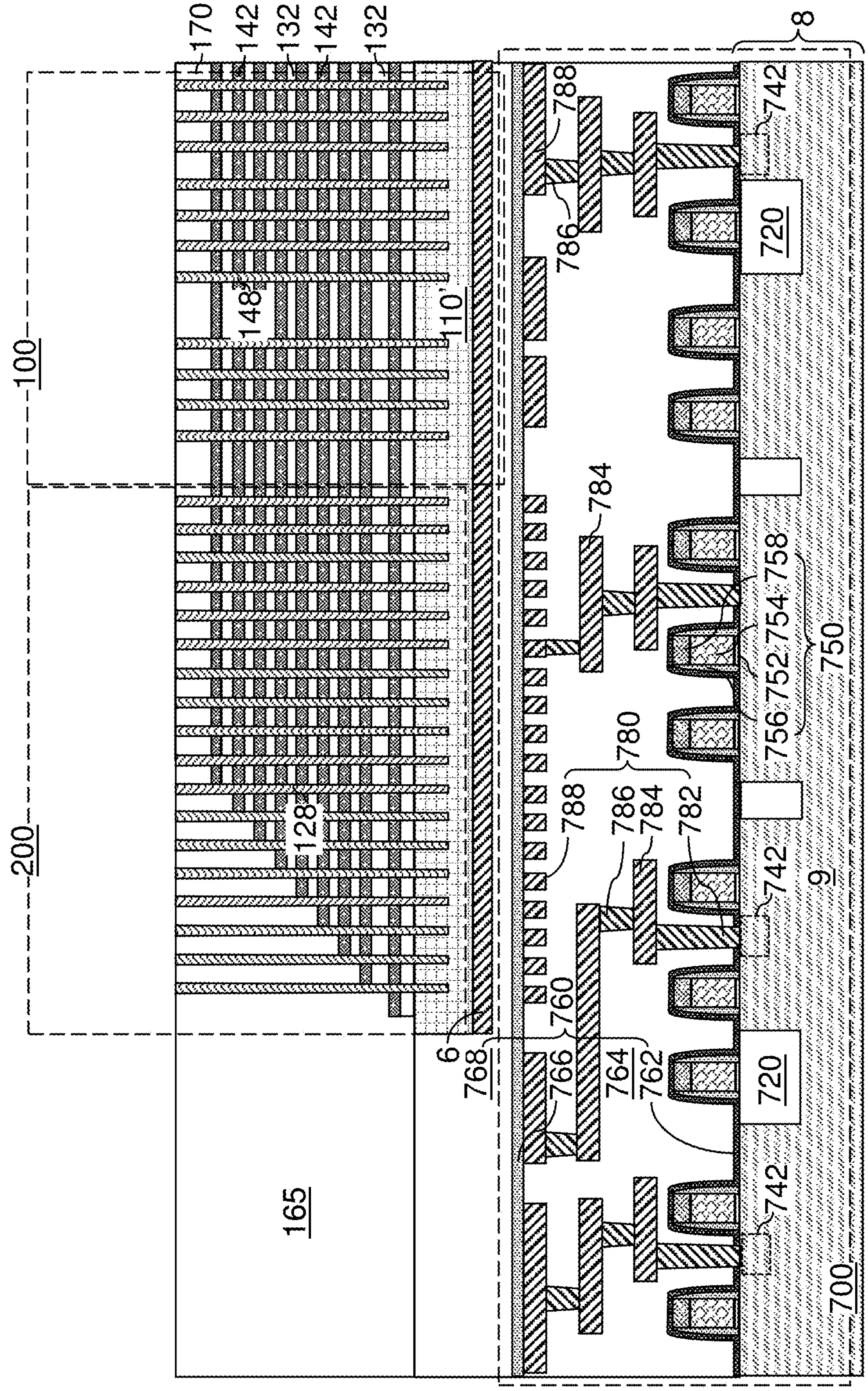
FIG. 5 is a vertical cross-sectional view of the exemplary structure after formation of various sacrificial fill structures according to an embodiment of the present disclosure.

Referring to FIG. 5, sacrificial first-tier opening fill material portions (148, 128) may be formed in the various first-tier openings (149, 129). For example, a first-tier sacrificial fill material is concurrently deposited in each of the first-tier openings (149, 129). The first-tier sacrificial fill material includes a material that may be subsequently removed selective to the materials of the first insulating layers 132 and the first sacrificial material layers 142.

In one embodiment, the first-tier sacrificial fill material may include a first carbon-based material. In one embodiment, the first carbon-based material may comprise carbon atoms at an atomic concentration greater than 90%, such as 95 to 100 atomic percent. In one embodiment, the first-tier sacrificial fill material may comprise amorphous carbon, diamond-like carbon (DLC), or a doped carbon material that may be amorphous or nanocrystalline. The first-tier sacrificial fill material may be formed by a non-conformal deposition or a conformal deposition method. For example, the first-tier sacrificial fill material may be formed by chemical vapor deposition or spin-coating. Excess portions of the first-tier sacrificial fill material may be removed from above the horizontal plane including the top surface of the first insulating cap layer 170 by a recess etch or by chemical mechanical polishing.

Remaining portions of the first-tier sacrificial fill material comprise sacrificial first-tier opening fill material portions (148, 128). Specifically, each remaining portion of the sacrificial material in a first-tier memory opening 149 constitutes a sacrificial first-tier memory opening fill material portion 148. Each remaining portion of the sacrificial material in a first-tier support opening 129 constitutes a sacrificial first-tier support opening fill material portion 128. The various sacrificial first-tier opening fill material portions (148, 128) are concurrently formed, i.e., during a same set of processes including the deposition process that deposits the first-tier sacrificial fill material and the planarization process that removes the first-tier deposition process from above the first-tier alternating stack (132, 142). The top surfaces of the sacrificial first-tier opening fill material portions (148, 128) may be coplanar with the top surface of the first-tier structure (132, 142, 170, 165). Each of the sacrificial first-tier opening fill material portions (148, 128) may, or may not, include cavities therein.

Figure 6:
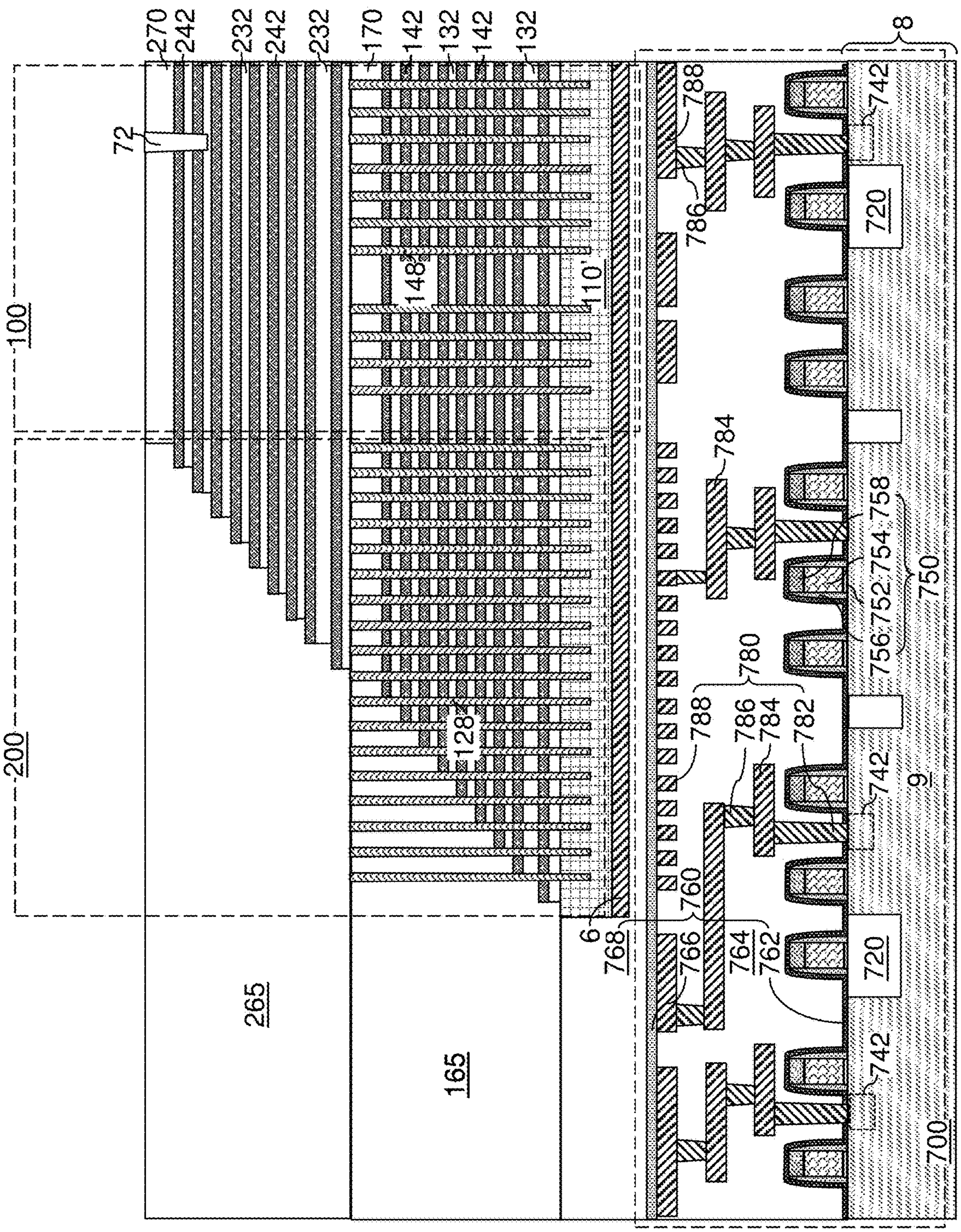
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride. Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
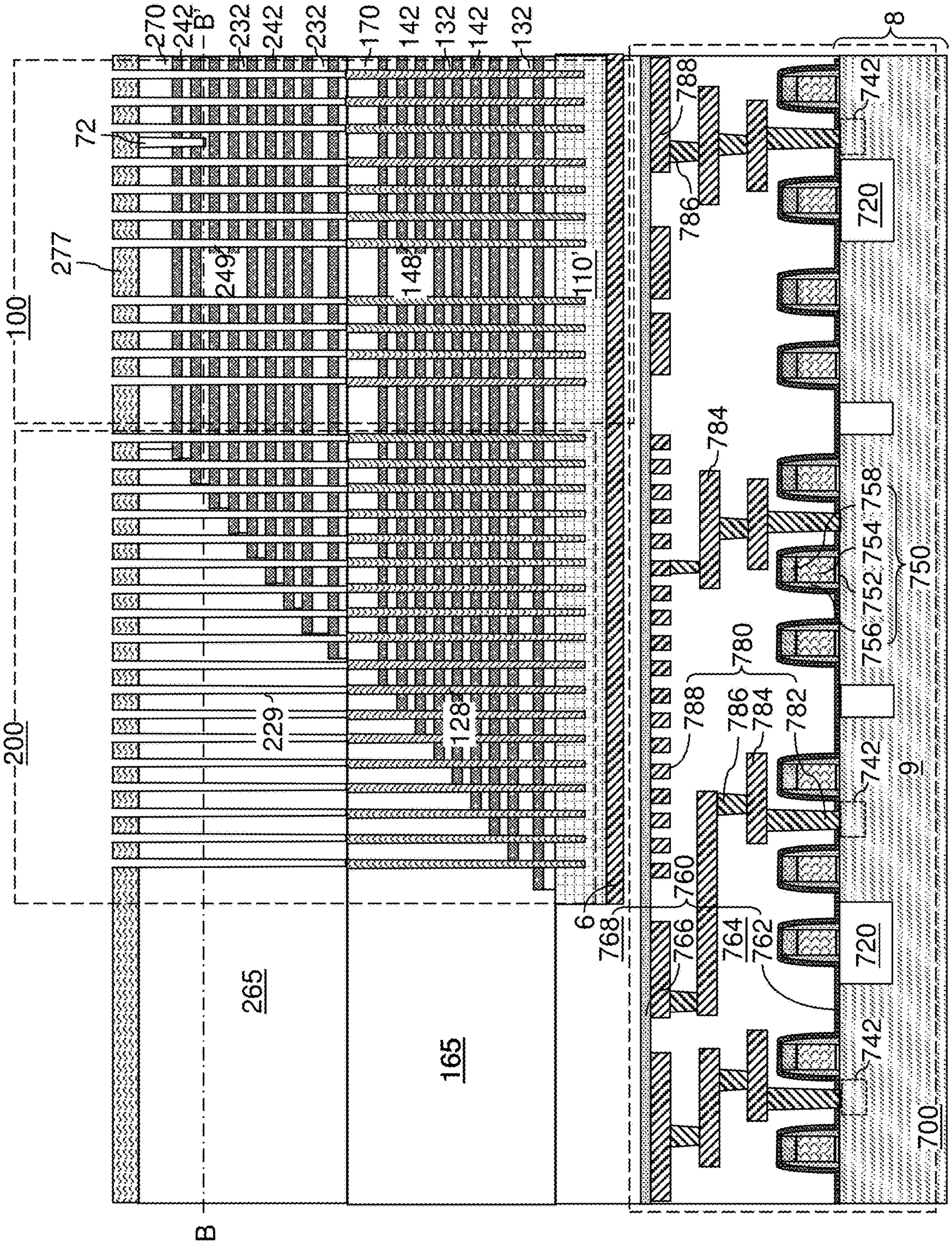
FIG. 7A is a vertical cross-sectional view of the exemplary structure after formation of second-tier memory openings and second-tier support openings according to an embodiment of the present disclosure.
Figure 7B:
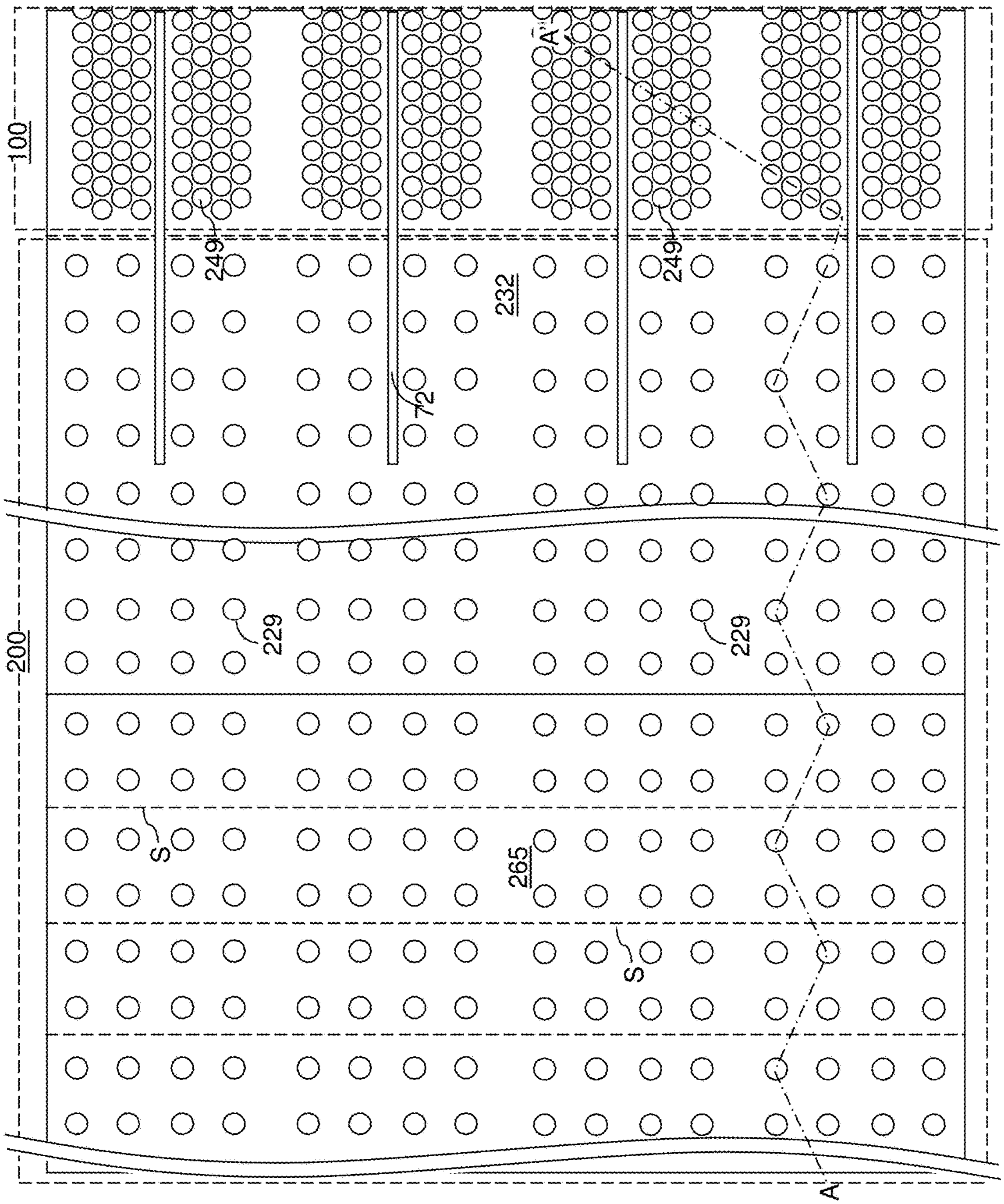
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A and 7B, an etch mask layer 277 comprising a second carbon-based material can be formed over the second-tier structure (232, 242, 270, 265). The second carbon-based material may be a carbon hard mask material that can be employed to assist in enhancing an etch profile of openings to be subsequently formed through the second-tier structure (232, 242, 270, 265). In one embodiment, the second carbon-based material comprises carbon atoms at an atomic concentration greater than 90%, such as 95 to 100 atomic percent. The thickness of the etch mask layer 277 may be in a range from 0.7 microns to 3 microns, such as from 0.8 microns to 2 microns, although lesser and greater thicknesses may also be employed. In one embodiment, the second carbon-based material may comprise an inorganic carbon-based material such as amorphous carbon, diamond-like carbon (DLC), or a doped carbon material that may be amorphous or nanocrystalline. The second carbon-based material may be the same as, or may be different from, the first carbon-based material.

A photoresist layer (not shown) may be applied over the etch mask layer 277, and may be lithographically patterned to form various openings therethrough. The pattern of the openings may be the same as the pattern of the various first-tier openings (149, 129), which is the same as the sacrificial first-tier opening fill material portions (148, 128). Thus, the lithographic mask used to pattern the first-tier openings (149, 129) may be used to pattern the photoresist layer. The pattern of openings in the photoresist layer may be transferred through the etch mask layer 277, and subsequently through the second-tier structure (232, 242, 265, 270, 72) by a second anisotropic etch process to form various second-tier openings (249, 229) concurrently, i.e., during the second anisotropic etch process. The photoresist layer may be consumed during the second anisotropic etch process, and the patterned etch mask layer 277 may be partially consumed and its remaining portion is employed thereafter as an etch mask that defines the pattern of the second-tier openings (249, 229). The various second-tier openings (249, 229) may include second-tier memory openings 249 and second-tier support openings 229.

The second-tier memory openings 249 are formed directly on a top surface of a respective one of the sacrificial first-tier memory opening fill material portions 148. In one embodiment, a top surface of a respective first-tier sacrificial memory opening fill structure 148 is physically exposed underneath each second-tier memory opening 249. The second-tier support openings 229 are formed directly on a top surface of a respective one of the sacrificial first-tier support opening fill material portions 128. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill material portion (148, 128). The thickness of the remaining portion of the etch mask layer 277 after the second anisotropic etch process may be in a range from 0.1 micron to 1 micron, such as from 0.3 micron to 0.7 micron, although lesser and greater thicknesses may also be employed.

Figure 8:
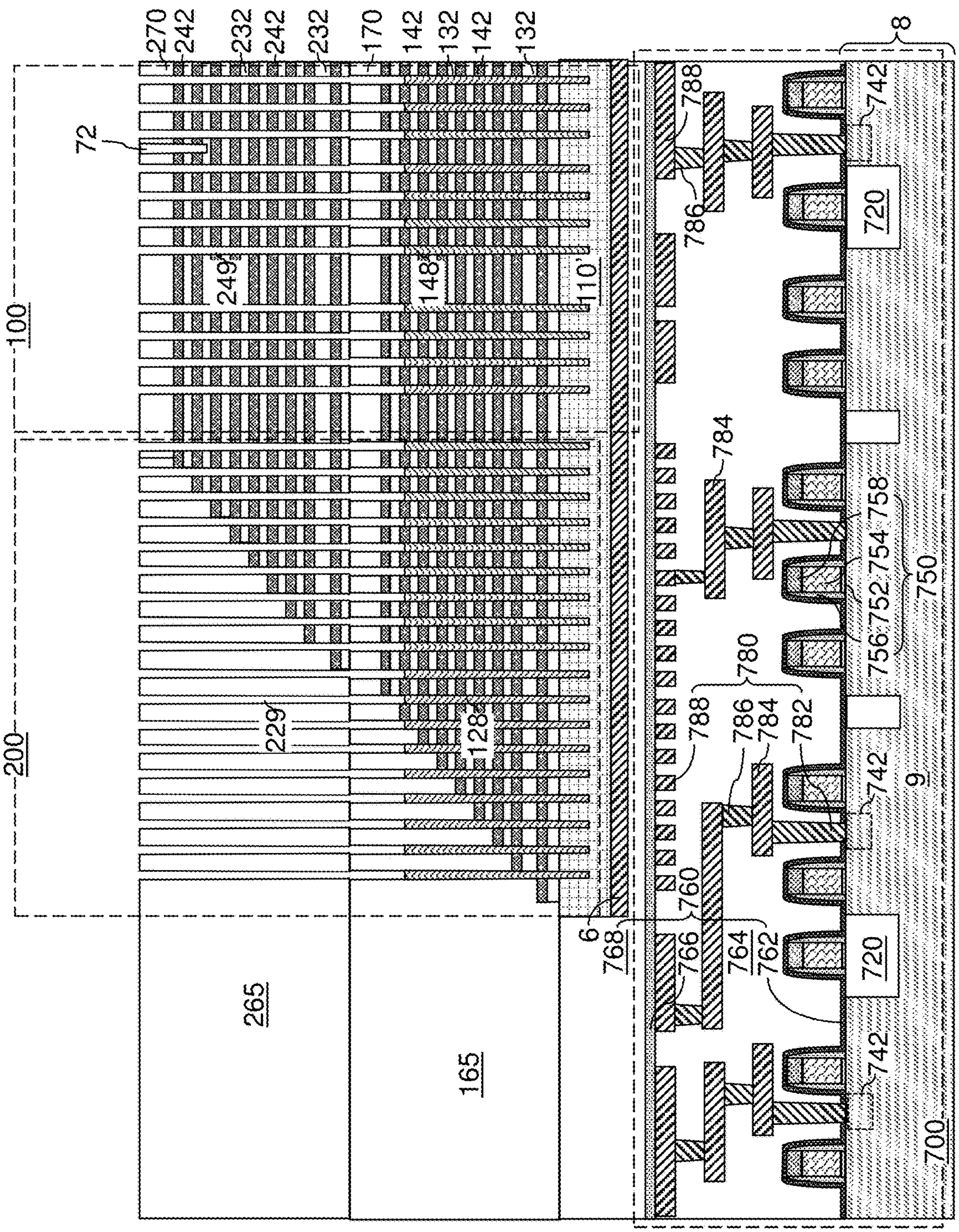
FIG. 8 is a vertical cross-sectional view of the exemplary structure after removal of an etch mask layer and collateral removal of top portions of the first-tier sacrificial opening fill structures according to an embodiment of the present disclosure.

Referring to FIG. 8, an ashing process can be performed to remove the second carbon-based material of the etch mask layer 277. Top portions of the first-tier sacrificial opening fill structures (148, 128) may be collaterally removed during removal of the etch mask layer 277. Generally, the etch mask layer 277 may be removed employing an etch mask removal process that collaterally removes top portions of the first-tier sacrificial memory opening fill structures 148 and the first-tier sacrificial support opening fill structures 128. The vertical recess distance by which top surfaces of the first-tier sacrificial memory opening fill structures 148 and the first-tier sacrificial support opening fill structures 128 are recessed may be in a range from 50 nm to 1 micron, such as from 100 nm to 500 nm. In one embodiment, each remaining portion of the first-tier sacrificial memory opening fill structures 148 and the first-tier sacrificial support opening fill structures 128 may have a top surface that is formed underneath a horizontal plane including a bottom surface of a topmost first-tier sacrificial material layer 142 of the first-tier sacrificial material layers 142. In one embodiment, the number of first-tier sacrificial material layers 142 overlying the horizontal plane including the recessed top surface of the first-tier sacrificial memory opening fill structures 148 and the first-tier sacrificial support opening fill structures 128 may be in a range from 1 to 10, such as from 1 to 5.

Figure 9:
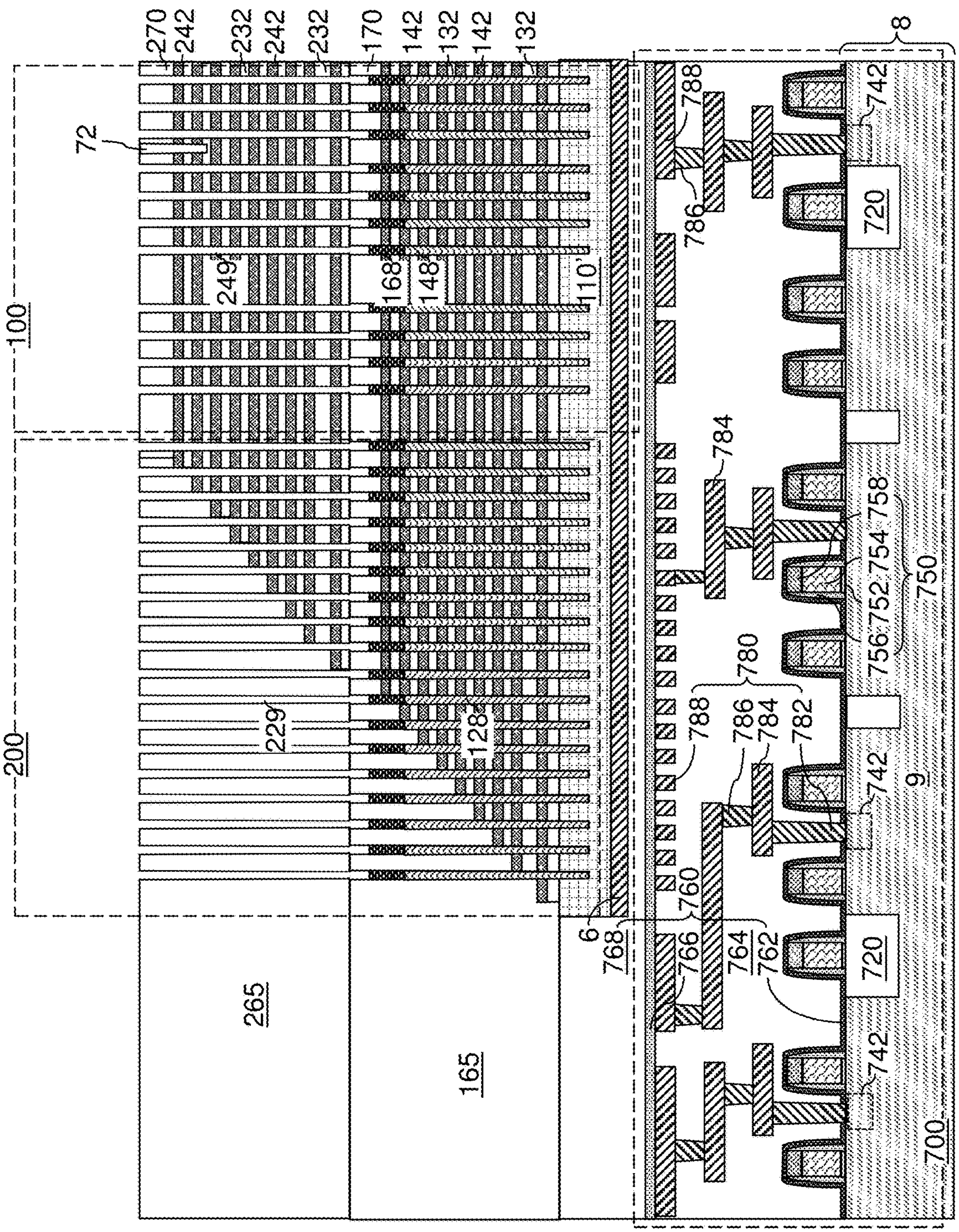
FIG. 9 is a vertical cross-sectional view of the exemplary structure after formation of sacrificial pillar structures employing a selective growth process according to an embodiment of the present disclosure.

Referring to FIG. 9, a sacrificial pillar structure 168 can be grown from physically exposed top surfaces of the first-tier sacrificial memory opening fill structures 148 and the first-tier sacrificial support opening fill structures 128. According to an aspect of the present disclosure, a selective material deposition process can be performed to grows a sacrificial fill material from the top surfaces of the remaining portions of the first-tier sacrificial memory opening fill structures 148 and the first-tier sacrificial support opening fill structures 128. The sacrificial fill material is also referred to as a sacrificial pillar material. The selective material deposition process suppresses growth of the sacrificial fill material from physically exposed surfaces of the first-tier alternating stack (132, 142), the second-tier alternating stack (232, 242), the first insulating cap layer 170, the second insulating cap layer, the first retro-stepped dielectric material portion 165, and the second retro-stepped dielectric material portion 265.

In one embodiment, the sacrificial fill material that is grown during the selective material deposition process may comprise a third carbon-based material. The third carbon-based material may comprise, for example, amorphous carbon, diamond-like carbon, or a doped carbon material in an amorphous phase or in a nanocrystalline phase. In one embodiment, the third carbon-based material may comprise carbon atoms at an atomic concentration greater than 90%, such as 95 to 100 atomic percent. The third carbon-based material may, or may not, have a same material composition as the first carbon-based material and/or as the second carbon-based material. In one embodiment, the sacrificial fill material (i.e., the sacrificial pillar material) may be grown employing a selective chemical vapor deposition process employing a carbon-based precursor gas and an etchant gas. In this case, the nucleation rate of the third carbon-based material on surfaces of carbon-based materials due to the carbon-based precursor gas may be greater than the etch rate of the third carbon-based material due to the etchant gas. Further, the nucleation rate of the third carbon-based material on surfaces of the first insulating cap layer 170, the second insulating cap layer, the first retro-stepped dielectric material portion 165, and the second retro-stepped dielectric material portion 265 (which may comprise silicon oxide surface and silicon nitride surfaces) due to the carbon-based precursor gas is less than the etch rate of the third carbon-based material due to the etchant gas. Thus, the third carbon-based material grows only from the physically exposed surfaces of the first-tier sacrificial memory opening fill structures 148 and the first-tier sacrificial support opening fill structures 128, while growth of the third carbon-based material from surfaces of the first insulating cap layer 170, the second insulating cap layer, the first retro-stepped dielectric material portion 165, and the second retro-stepped dielectric material portion 265 is avoided.

The deposited portions of the third carbon-based material form pillar-shaped structures, which are herein referred to as the sacrificial pillar structures 168. According to an aspect of the present disclosure, the duration of the selective material deposition process may be selected such that the top surfaces of the sacrificial pillar structures 168 are formed above a horizontal plane including the top surface of the topmost first-tier sacrificial material layer 142 of the first-tier sacrificial material layers 142, and underneath a horizontal plane including a topmost surface of the first-tier structure. In one embodiment, the top surfaces of the sacrificial pillar structures 168 are formed above a horizontal plane including the bottom surface of the first insulating cap layer 170, and underneath a horizontal plane including a top surface of the first insulating cap layer 170.

Figure 10:
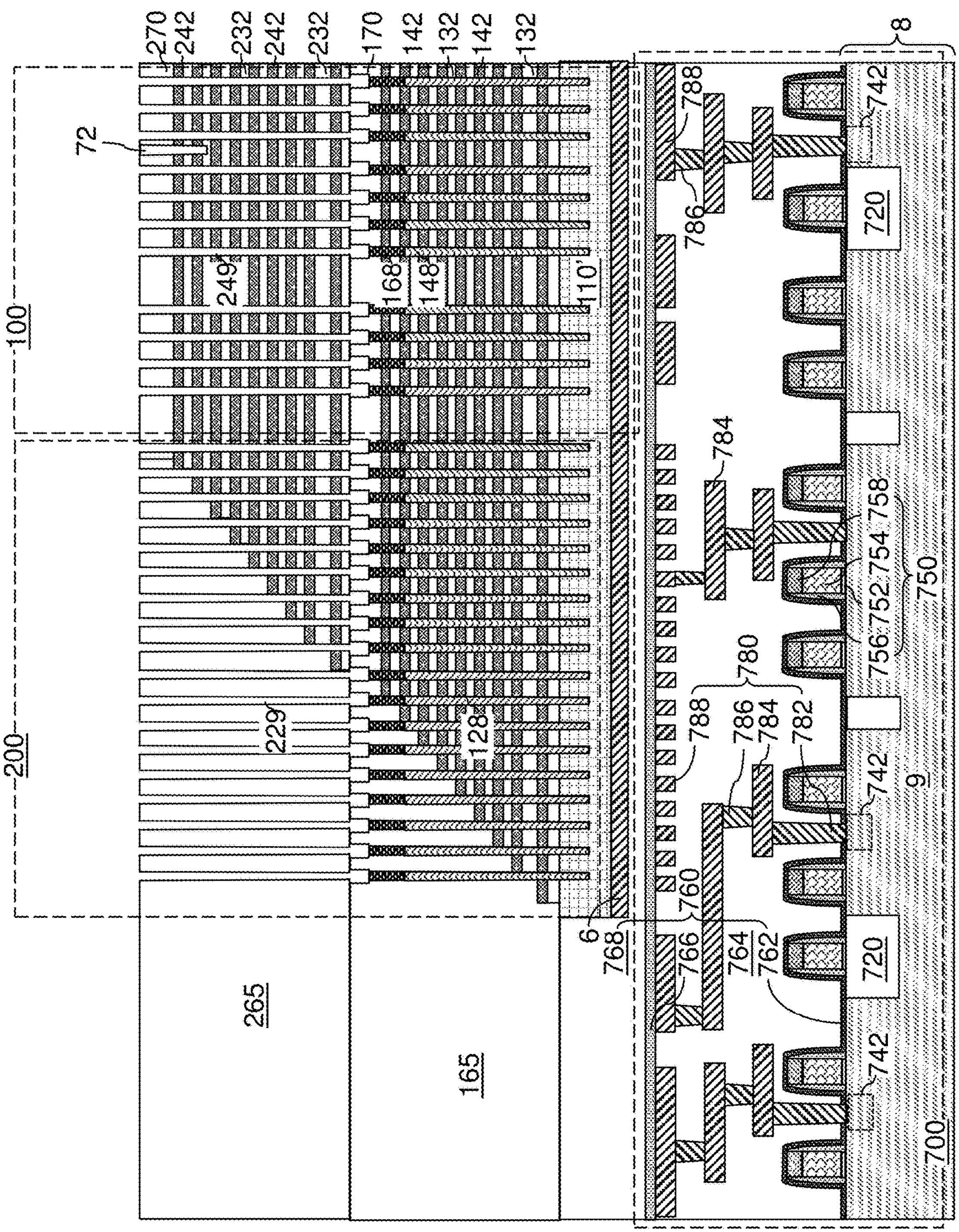
FIG. 10 is a vertical cross-sectional view of the exemplary structure after laterally expanding second-tier openings and top portions of the first-tier opening according to an embodiment of the present disclosure.

Referring to FIG. 10, at least one isotropic etch process may be optionally performed to isotropically recess materials of the second-tier insulating layers 232 and the second-tier sacrificial material layers 242. In this case, each of the second-tier openings (249, 229) and optionally top portions of the first-tier openings (149, 129) that overlies top surfaces of the sacrificial pillar structures 168 may be laterally expanded by the at least one isotropic etch process. In one embodiment, the second-tier memory openings 249 and the top portions of the first-tier memory openings 149 are laterally expanded by performing a first isotropic etch process and a second isotropic etch process. The first isotropic etch process may laterally recess physically exposed sidewalls of the second-tier insulating layers 232 and an upper subset of the first-tier insulating layer 132 within the first-tier alternating stack (132, 142) by a first lateral recess distance, which may be in a range from 0.5 nm to 5 nm. The second isotropic etch process may laterally recess physically exposed sidewalls of the second-tier sacrificial material layers 242 by a second lateral recess distance, which may be in a range from 0.5 nm to 5 nm.

The second isotropic etch process may be performed before or after the first isotropic etch process. In an illustrative example, the second-tier insulating layers 232, the first-tier insulating layers 132, and the first insulating cap layer 170 may comprise silicon oxide, and the first isotropic etch process may comprise a wet etch process employing dilute hydrofluoric acid. Further, the second-tier sacrificial material layers 242 and the first-tier sacrificial material layers 142 may comprise silicon nitride, and the second isotropic etch process may comprise a wet etch process employing phosphoric acid. In one embodiment, the second-tier memory openings 249 and the top portion of the first-tier memory openings 149 may be laterally expanded such that a lateral dimension (i.e., a maximum lateral extent such as a diameter or a major axis) of a bottom portion of a second-tier memory opening 249 has a greater lateral dimension than a lateral dimension (i.e., a maximum lateral extent such as a diameter or a major axis) of a bottom portion of an underlying first-tier memory opening 149 (i.e., the bottom portion of an underlying first-tier sacrificial memory opening fill structure 148). Further, a lateral dimension (i.e., a maximum lateral extent such as a diameter or a major axis) of a top-portion of the second-tier memory opening 249 has a greater lateral dimension than a lateral dimension (i.e., a maximum lateral extent such as a diameter or a major axis) of the underlying first-tier memory opening 149 at a height of a top surface of the topmost first-tier sacrificial material layer 142.

Figure 11:
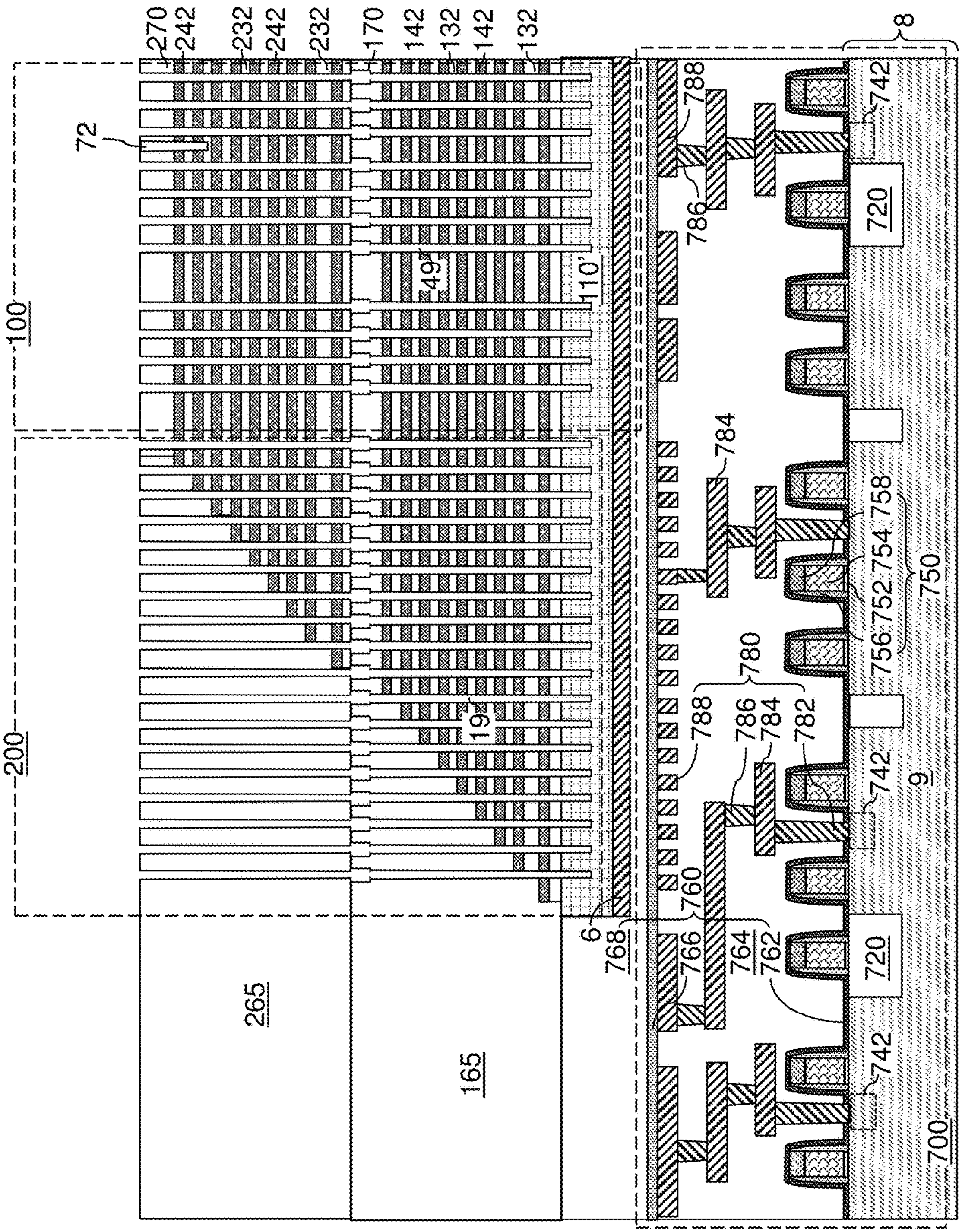
FIG. 11 is a vertical cross-sectional view of the exemplary structure after formation of inter-tier memory openings and inter-tier support openings according to an embodiment of the present disclosure.

Referring to FIG. 11, the first-tier sacrificial fill materials of the sacrificial pillar structures 168 and the sacrificial first-tier opening fill material portions (148, 128) may be removed by performing an ashing process or an anisotropic etch process. At least a center portion, and optionally the entirety, of each of the sacrificial pillar structures 168 can be removed. In case an ashing process is employed to remove the sacrificial pillar structures 168, the entirety of each sacrificial pillar structures 168 is removed. In case an anisotropic etch process is employed to remove the sacrificial pillar structures 168, a tubular portion of each sacrificial pillar structure 168 may remain after the anisotropic etch process or the entirety of each sacrificial pillar structure 168 may be removed. The entirety of the sacrificial first-tier memory opening fill material portions 148 and the sacrificial first-tier support opening fill material portions 128 can be removed. A memory opening 49, which is also referred to as an inter-tier memory opening 49, is formed in each combination of a second-tier memory openings 249 and a volume from which a sacrificial pillar structure 168 and a sacrificial first-tier memory opening fill material portion 148 are removed. A support opening 19, which is also referred to as an inter-tier support opening 19, is formed in each combination of a second-tier support openings 229 and a volume from which a sacrificial pillar structure 168 and a sacrificial first-tier support opening fill material portion 128 are removed.

FIGS. 12A-12K are sequential vertical cross-sectional views of a first alternative embodiment of the exemplary structure during processing steps employed to form inter-tier memory openings 49 according to an embodiment of the present disclosure. In the first alternative embodiment of the exemplary structure, three tier structures are sequentially formed, which comprise a first-tier structure, a second-tier structure, and a third-tier structure.

Figure 12B:
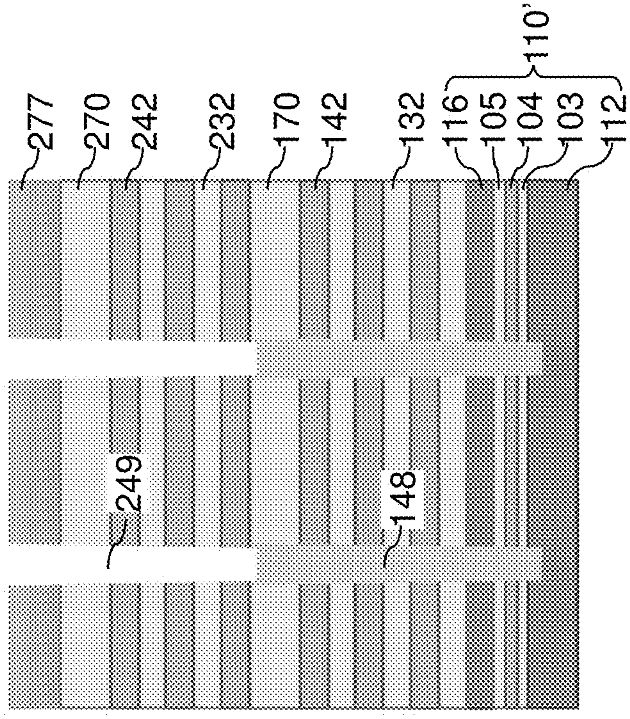
FIGS. 12A-12K are sequential vertical cross-sectional views of a first alternative embodiment of the exemplary structure during processing steps employed to form inter-tier memory openings according to an embodiment of the present disclosure.
Figure 12A:
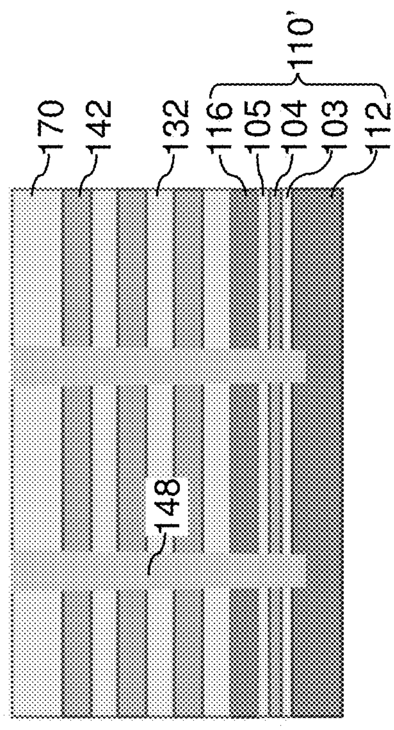

Referring to FIG. 12A, a portion of the first alternative embodiment of the exemplary structure is illustrated. At this processing step, the first alternative embodiment of the exemplary structure may be the same as the exemplary structure illustrated in FIG. 5.

Referring to FIG. 12B, the processing steps described above with reference to FIGS. 6, 7A, and 7B may be performed. The first alternative embodiment of the exemplary structure may be the same as the exemplary structure illustrated in FIGS. 7A and 7B. The etch mask layer 277 may be referred to as a first etch mask layer hereafter.

Figure 12D:
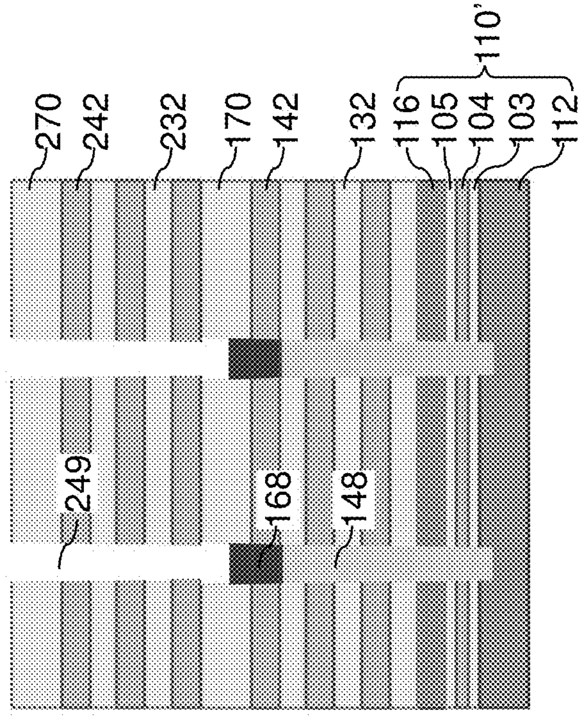
Figure 12C:
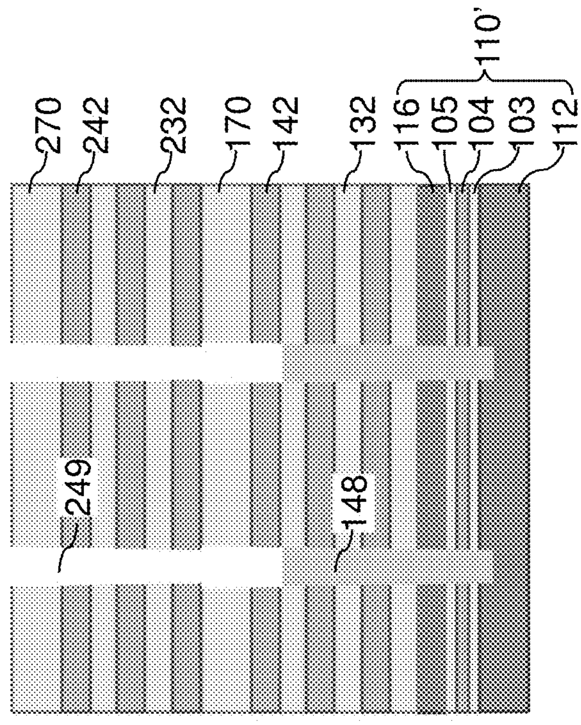

Referring to FIG. 12C, the processing steps described above with reference to FIG. 8 may be performed. The first alternative embodiment of the exemplary structure may be the same as the exemplary structure illustrated in FIG. 8.

Referring to FIG. 12D, the processing steps described above with reference to FIG. 9 may be performed. The first alternative embodiment of the exemplary structure may be the same as the exemplary structure illustrated in FIG. 9. The sacrificial pillar structures 168 may be referred to as first sacrificial pillar structures 168 hereafter.

Figure 12F:
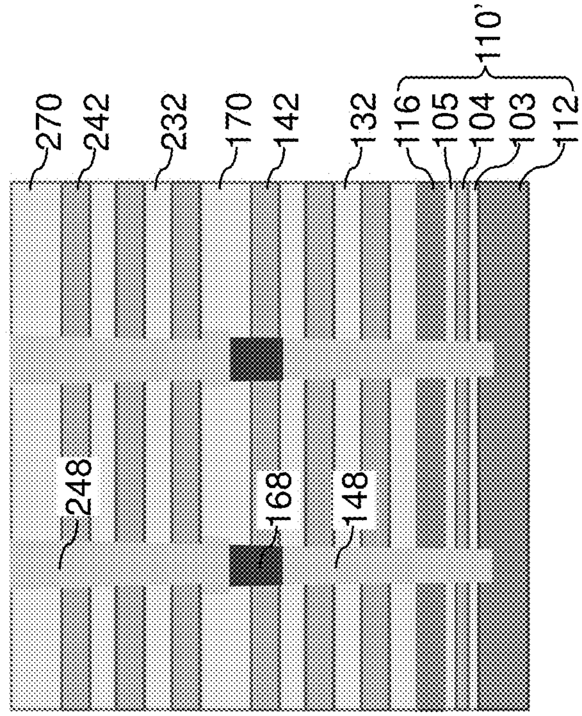
Figure 12E:
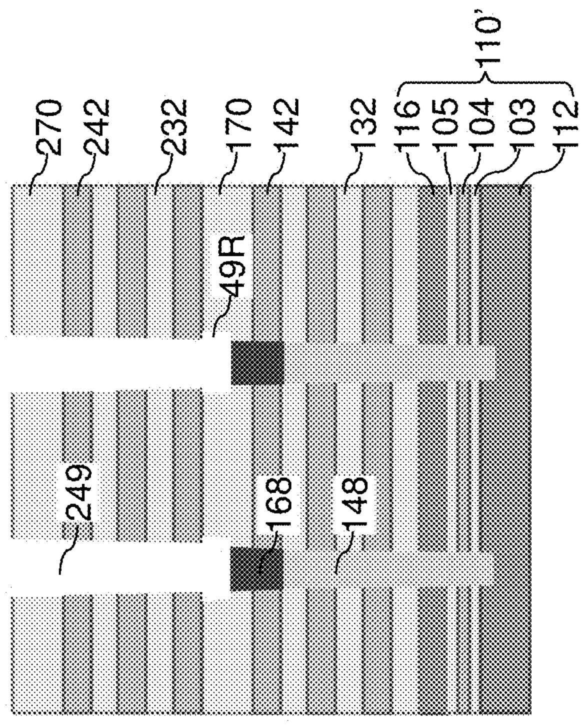

Referring to FIG. 12E, the processing steps described above with reference to FIG. 10 may be optionally performed. The first alternative embodiment of the exemplary structure may be the same as the exemplary structure illustrated in FIG. 10. In one embodiment, the processing steps described with reference to FIG. 10 may be omitted in the first alternative embodiment.

In one embodiment, the first and second insulating cap layers (170, 270) may comprise material which have a higher etch rate than the first and second insulating layers (132, 232) in the etchant used during the first isotropic etching step. For example, the first and second insulating cap layers (170, 270) may comprise a doped silicon oxide, such as borosilicate glass, phosphosilicate glass or borophosphosilicate glass, while the first and second insulating layers (132, 232) may comprise undoped silicon oxide (e.g., silicon dioxide). In this case, the first and second insulating cap layers (170, 270) may be laterally recessed father than first and second insulating layers (132, 232) during the first isotropic etching step. This forms lateral recesses 49R at the level of at least first insulating cap layer 170 above the top surface of the first sacrificial pillar structures 168 and optionally at the level of the second insulating cap layer 270.

Referring to FIG. 12F, the processing steps described above with reference to FIG. 5 can be performed again with any needed changes to fill the second-tier openings (249, 219) with sacrificial first-tier opening fill material portions (148, 128). Specifically, the second-tier openings (249, 219) can be filled with a carbon-based sacrificial fill material, which may, or may not, be the same as the first carbon-based material described above. A second-tier sacrificial memory opening fill structure 248 can be formed in each second-tier memory opening 249 on a top surface of a respective underlying sacrificial pillar structure 168. A second-tier support opening fill material portions can be formed in each second-tier support opening 229 on a top surface of a respective underlying sacrificial pillar structure 168.

Figure 12H:
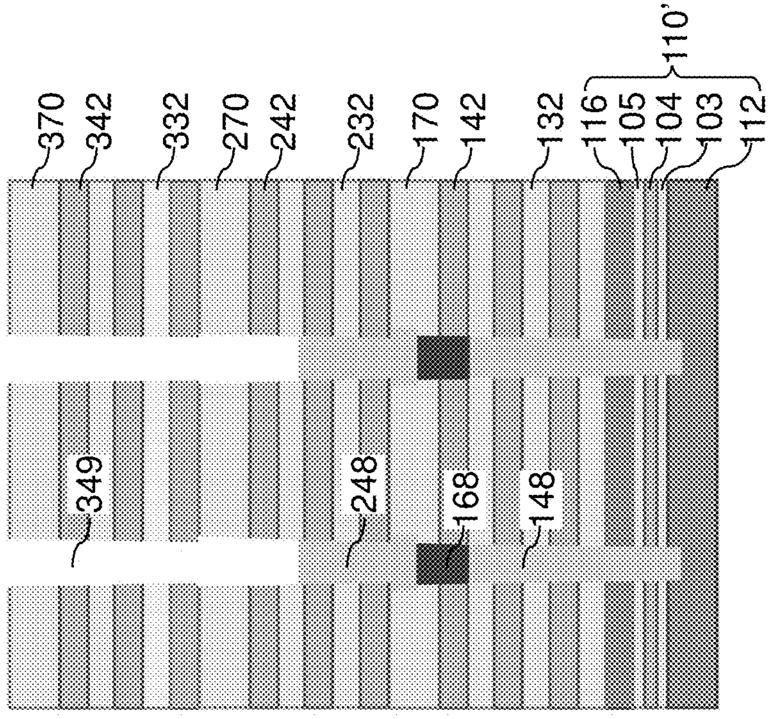
Figure 12G:
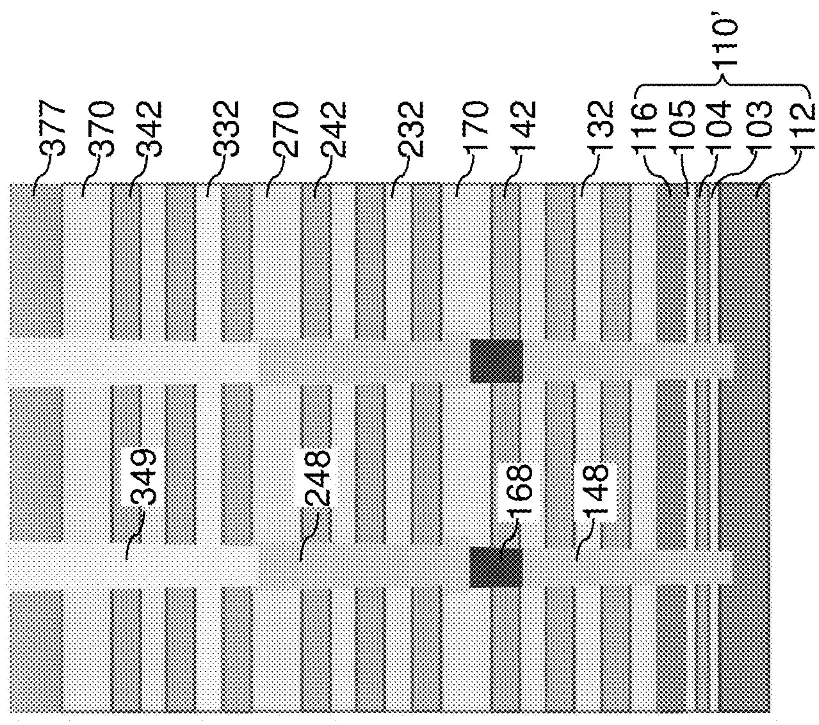

Referring to FIG. 12G, a third-tier alternating stack (332, 342) of third-tier insulating layers 332 and third-tier sacrificial material layers 342 can be formed over the second-tier alternating stack (232, 242). The third-tier insulating layers 332 may have the same material composition and may have the same thickness range as the first-tier insulating layers 132 and/or the second-tier insulating layers 232. The third-tier sacrificial material layers 342 may have the same material composition and may have the same thickness range as the first-tier sacrificial material layers 142 and/or the second-tier sacrificial material layers 242. The total number of repetitions of a pair of a third-tier insulating layer 332 and a third-tier sacrificial material layer 342 in the third-tier alternating stack (332, 342) may be in the same range as the total number of repetitions of a pair of an insulating layer and a sacrificial material layer in the first-tier alternating stack (132, 142) or in the second-tier alternating stack (232, 242). A third insulating cap layer 370 may be formed over the third-tier alternating stack (332, 342). Stepped surfaces may be formed by patterning the third-tier alternating stack (332, 342), and a third retro-stepped dielectric material portion (not shown) may be formed over the stepped surfaces.

The processing steps described above with reference to FIGS. 7A and 7B may be performed again with any needed changes to form third-tier openings, which may comprise third-tier memory openings 249 and third-tier support openings (not shown). For example, an additional etch mask layer 377 (which is also referred to as a second etch mask layer) comprising an additional carbon-based material can be formed over the third-tier structure. The additional carbon-based material may be a carbon hard mask material that can be employed to assist in enhancing an etch profile of openings to be subsequently formed through the third-tier structure. In one embodiment, the additional carbon-based material comprises carbon atoms at an atomic concentration greater than 90%, such as 95 to 100 atomic percent. The thickness of the second etch mask layer 377 may be in a range from 0.7 microns to 3 microns, such as from 0.8 microns to 2 microns, although lesser and greater thicknesses may also be employed. In one embodiment, the additional carbon-based material of the second etch mask layer 377 may comprise an inorganic carbon-based material such as amorphous carbon, diamond-like carbon (DLC), or a doped carbon material that may be amorphous or nanocrystalline. The additional carbon-based material may be the same as or may be different from the first carbon-based material and/or the second carbon-based material.

A photoresist layer (not shown) may be applied over the second etch mask layer 377, and may be lithographically patterned to form various openings therethrough. The pattern of the openings may be the same as the pattern of the various second-tier openings (249, 229), which is the same as the sacrificial second-tier opening fill material portions 248. The pattern of openings in the photoresist layer may be transferred through the second etch mask layer 377, and subsequently through the third-tier structure by a third anisotropic etch process to form various third-tier openings concurrently. The photoresist layer may be consumed during the third anisotropic etch process, and the second patterned etch mask layer 377 may be partially consumed and its remaining portion employed thereafter as an etch mask that defines the pattern of the third-tier openings. The various third-tier openings may include third-tier memory openings 349 and second-tier support openings (not shown).

The third-tier memory openings 349 are formed directly on a top surface of a respective one of the sacrificial second-tier memory opening fill material portions 248. In one embodiment, a top surface of a respective second-tier sacrificial memory opening fill structure 248 is physically exposed underneath each third-tier memory opening 349. The third-tier support openings (not shown) are formed directly on a top surface of a respective one of the sacrificial second-tier support opening fill material portions. The thickness of the remaining portion of the second etch mask layer 377 after the second anisotropic etch process may be in a range from 0.1 micron to 1 micron, such as from 0.3 micron to 0.7 micron, although lesser and greater thicknesses may also be employed.

Referring to FIG. 12H, the processing steps described above with reference to FIG. 8 may be performed again with any needed changes to remove the second carbon-based material of the second etch mask layer 377. An ashing process may be employed. Top portions of the second-tier sacrificial opening fill structures 248 may be collaterally removed during removal of the second etch mask layer 377. Generally, the second etch mask layer 377 may be removed employing an etch mask removal process that collaterally removes top portions of the second-tier sacrificial memory opening fill structures 248 and the second-tier sacrificial support opening fill structures (not shown). The vertical recess distance by which top surfaces of the second-tier sacrificial memory opening fill structures 248 and the second-tier sacrificial support opening fill structures are recessed may be in a range from 50 nm to 1 micron, such as from 100 nm to 500 nm. In one embodiment, each remaining portion of the second-tier sacrificial memory opening fill structures 248 and the second-tier sacrificial support opening fill structures may have a top surface that is formed underneath a horizontal plane including a bottom surface of a topmost second-tier sacrificial material layer 242 of the second-tier sacrificial material layers 242. In one embodiment, the number of second-tier sacrificial material layers 242 overlying the horizontal plane including the recessed top surface of the second-tier sacrificial memory opening fill structures 248 and the second-tier sacrificial support opening fill structures may be in a range from 1 to 10, such as from 1 to 5.

Figure 12I:
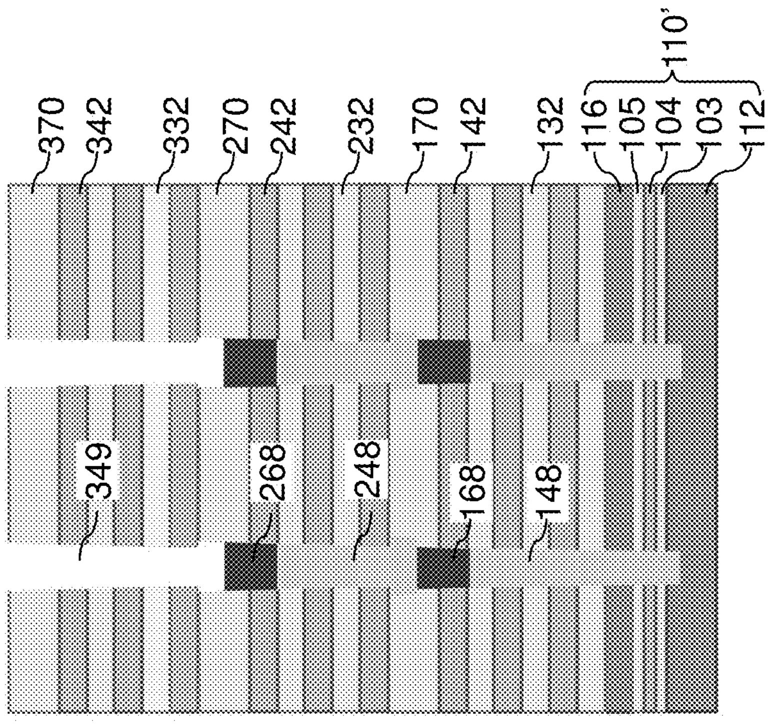

Referring to FIG. 12I, the processing steps described above with reference to FIG. 9 may be performed with any needed changes to grow second sacrificial pillar structure 268 from physically exposed top surfaces of the second-tier sacrificial memory opening fill structures 248 and the second-tier sacrificial support opening fill structures (not shown). An additional selective material deposition process can be performed to grows an additional sacrificial fill material from the top surfaces of the remaining portions of the second-tier sacrificial memory opening fill structures 248 and the second-tier sacrificial support opening fill structures (not shown). The additional sacrificial fill material is also referred to as a second sacrificial pillar material. The selective material deposition process suppresses growth of the additional sacrificial fill material from physically exposed surfaces of the second-tier alternating stack (232, 242), the third-tier alternating stack (332, 342), the second insulating cap layer 270, the third insulating cap layer 370, the second retro-stepped dielectric material portion 265, and the third retro-stepped dielectric material portion (not shown).

The additional sacrificial fill material that is grown during the additional selective material deposition process may comprise a carbon-based material, which includes any material that may be employed for the first sacrificial pillar structures. The additional carbon-based material may comprise, for example, amorphous carbon, diamond-like carbon, or a doped carbon material in an amorphous phase or in a nanocrystalline phase. In one embodiment, the additional carbon-based material may comprise carbon atoms at an atomic concentration greater than 90%, such as 95 to 100 atomic percent. The additional carbon-based material may or may not have a same material composition as the first carbon-based material and/or as the second carbon-based material and/or the third carbon-based material. The additional selective material deposition process may be a same type of deposition process as the selective material deposition process that forms the first sacrificial pillar structures 168.

The second sacrificial pillar structures 268 can be formed on the recessed top surfaces of the second-tier sacrificial memory opening fill structures 248 and the second-tier sacrificial support opening fill structures (not illustrated). According to an aspect of the present disclosure, the duration of the additional selective material deposition process may be selected such that the top surfaces of the second sacrificial pillar structures 268 are formed above a horizontal plane including the top surface of the topmost second-tier sacrificial material layer 242 of the second-tier sacrificial material layers 242, and underneath a horizontal plane including a topmost surface of the second-tier structure. In one embodiment, the top surfaces of the second sacrificial pillar structures 268 are formed above a horizontal plane including the bottom surface of the second insulating cap layer 270, and underneath a horizontal plane including a top surface of the second insulating cap layer 270.

Figure 12J:
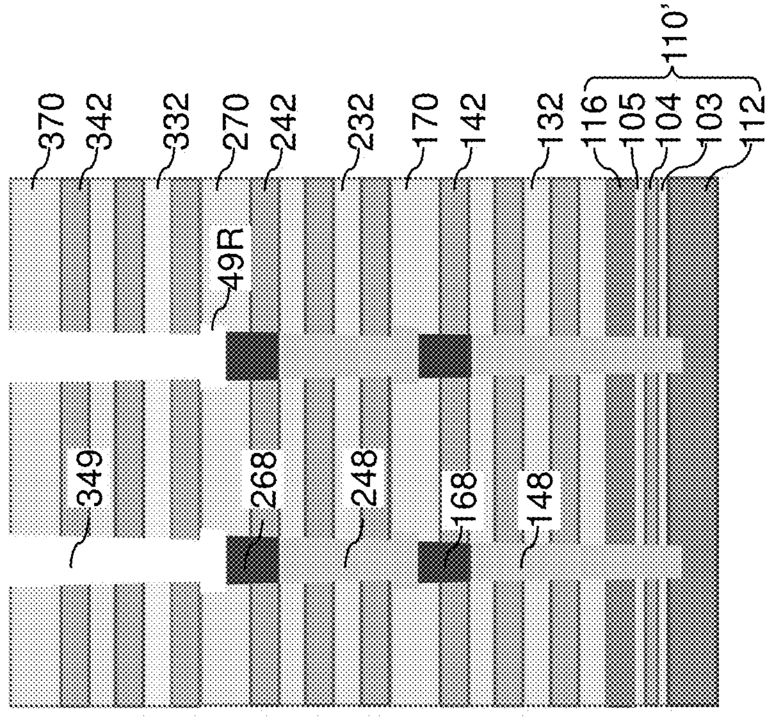

Referring to FIG. 12J, at least one isotropic etch process may be optionally performed to isotropically recess materials of the third-tier insulating layers 332 and the third-tier sacrificial material layers 342. In this case, each of the third-tier openings (which include the third-tier memory openings 349 and third-tier support openings) and optionally top portions of the second-tier opening (249, 229) that overlies top surfaces of the second sacrificial pillar structures 268 may be laterally expanded by the at least one isotropic etch process. In one embodiment, the third-tier memory openings 349 and the top portions of the second-tier memory openings 249 are laterally expanded by performing a first isotropic etch process and a second isotropic etch process. The first isotropic etch process may laterally recess physically exposed sidewalls of the third-tier insulating layers 332 and an upper subset of the second-tier insulating layers 232 within the second-tier alternating stack (232, 242) by a first lateral recess distance, which may be in a range from 0.5 nm to 5 nm. The second isotropic etch process may laterally recess physically exposed sidewalls of the third-tier sacrificial material layers 342 by a second lateral recess distance, which may be in a range from 0.5 nm to 5 nm.

The second isotropic etch process may be performed before or after the first isotropic etch process. In an illustrative example, the third-tier insulating layers 332, the second-tier insulating layers 232, and the second insulating cap layer 270 may comprise silicon oxide, and the first isotropic etch process may comprise a wet etch process employing dilute hydrofluoric acid. Further, the third-tier sacrificial material layers 342 and the second-tier sacrificial material layers 242 may comprise silicon nitride, and the second isotropic etch process may comprise a wet etch process employing phosphoric acid. In one embodiment, the third-tier memory openings 349 and the top portion of the second-tier memory openings 249 may be laterally expanded such that a lateral dimension (i.e., a maximum lateral extent such as a diameter or a major axis) of a bottom portion of a third-tier memory opening 349 has a greater lateral dimension than a lateral dimension (i.e., a maximum lateral extent such as a diameter or a major axis) of a bottom portion of an underlying second-tier memory opening 249 (i.e., the bottom portion of an underlying second-tier sacrificial memory opening fill structure 248). Further, a lateral dimension (i.e., a maximum lateral extent such as a diameter or a major axis) of a top-portion of the third-tier memory opening 349 has a greater lateral dimension than a lateral dimension (i.e., a maximum lateral extent such as a diameter or a major axis) of the underlying second-tier memory opening 249 at a height of a top surface of the topmost second-tier sacrificial material layer 242.

Optionally, lateral recesses 49R may be formed at the level of the second insulating cap layer 270 above the top surface of the second sacrificial pillar structures 268, as described above with respect to FIG. 12E. If the lateral recesses 49R are present in the memory opening 49, then the sidewalls of the upper portions of the first and second insulating cap layers (170, 270) may be laterally recessed relative to the sidewalls of the lower portions of the respective the first and second insulating cap layers (170, 270).

Figure 12K:
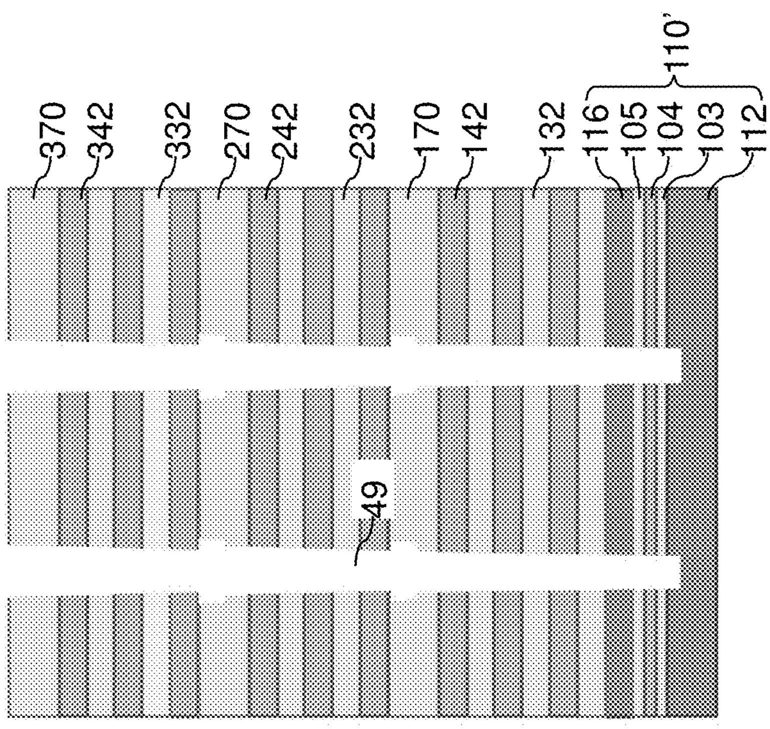

Referring to FIG. 12K, the sacrificial fill materials of the second sacrificial pillar structures 268, the sacrificial second-tier opening fill structures (which include the sacrificial second-tier memory opening fill structures 248), the first sacrificial pillar structures 168, and the sacrificial first-tier opening fill material portions (148, 128) may be removed by performing an ashing process or an anisotropic etch process. At least a center portion, and optionally the entirety, of each of the sacrificial pillar structures (168, 268) can be removed. In case an ashing process is employed to remove the sacrificial pillar structures (168, 268), the entirety of each sacrificial pillar structures (168, 268) is removed. In case an anisotropic etch process is employed to remove the sacrificial pillar structures (168, 268), a tubular portion of each sacrificial pillar structure (168, 268) may remain after the anisotropic etch process or the entirety of each sacrificial pillar structure (168, 268) may be removed. The entirety of the sacrificial second-tier opening fill material portions 148 and the sacrificial first-tier opening fill material portions (148, 128) can be removed. A memory opening 49, which is also referred to as an inter-tier memory opening 49, is formed in each combination of a third-tier memory openings 349 and a volume from which a second sacrificial pillar structure 268, a sacrificial second-tier memory opening fill material portion 248, a first sacrificial pillar structure 168, and a sacrificial first-tier memory opening fill material portion 148 are removed. A support opening 19, which is also referred to as an inter-tier support opening 19, is formed in each combination of a third-tier support openings 229 and a volume from which a second sacrificial pillar structure 268, a sacrificial second-tier support opening fill material portion, a first sacrificial pillar structure 168, and a sacrificial first-tier support opening fill material portion 128 are removed.

Figure 12L:
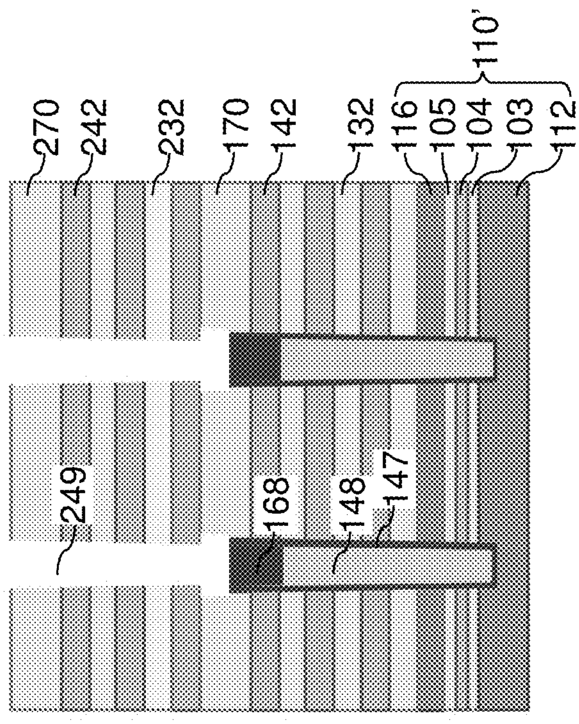
FIG. 12L is a vertical cross-sectional view of a second alternative embodiment of the exemplary structure after expanding second-tier openings and top portions of the first-tier opening according to an embodiment of the present disclosure.

Referring to FIG. 12L, a second alternative embodiment of the exemplary structure is illustrated at a processing step that corresponds to the processing steps of FIG. 9 or to the processing steps of FIG. 12D. In the second alternative embodiment, a sacrificial liner 147 may be formed on sidewalls of the first-tier openings (149, 129) prior to formation of sacrificial first-tier opening fill material portions (148, 128). The sacrificial liners 147 may comprise silicon oxide, silicon oxynitride, silicon oxycarbide, or any sacrificial material from which the carbon-based material of the sacrificial pillar structures 168 does not grow during the selective material deposition process. In the second alternative embodiment, the sacrificial liners 147 may be removed selective to the materials of the first-tier alternating stack (132, 142) after removal of the sacrificial first-tier opening fill material portions (148, 128) to provide inter-tier memory openings 49.

Figure 12M:
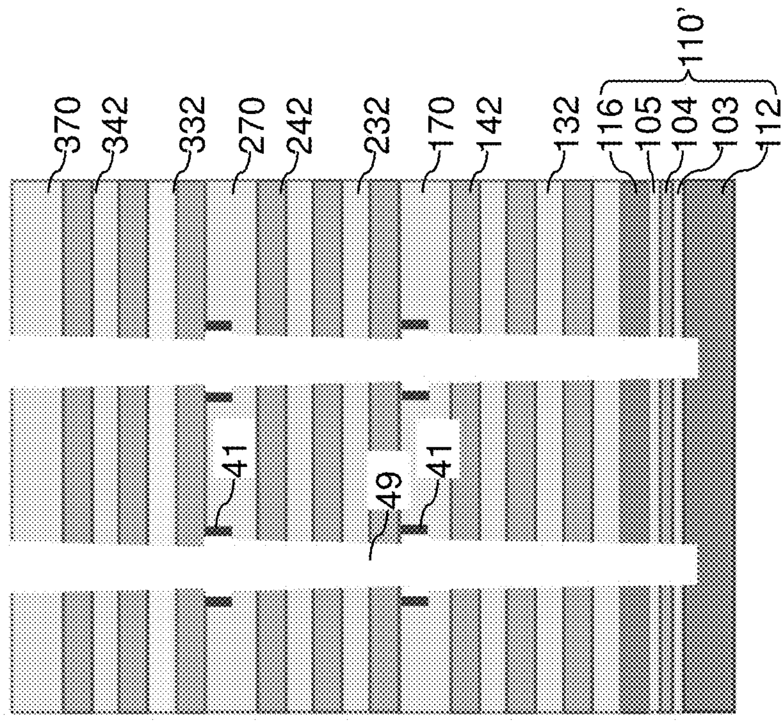
FIG. 12M is a vertical cross-sectional view of a third alternative embodiment of the exemplary structure after formation of inter-tier memory openings according to an embodiment of the present disclosure.

Referring to FIG. 12M, a third alternative embodiment of the exemplary structure may be derived from the exemplary structure of FIG. 10, the first alternative embodiment illustrated in FIG. 12J, or the second alternative embodiment illustrated in FIG. 12L by employing an anisotropic etch process to remove sacrificial fill materials. In this case, the sacrificial fill materials of the sacrificial opening fill structures and center portions of the sacrificial pillar structures (168, 268) are removed by performing an anisotropic etch process that anisotropically etches materials of the sacrificial opening fill structures and the sacrificial pillar structures (168, 268) selective to materials of the first-tier alternating stack (132, 142), the second-tier alternating stack (232, 242), and the optional third-tier alternating stack (332, 342). At least one tubular portion of the sacrificial pillar structures (168, 268) may remain around the inter-tier memory opening 49 after the anisotropic etch process. Each remaining tubular portion of the sacrificial pillar structures (168, 268) is herein referred to as a tubular carbon-based structure 41. The tubular carbon-based structures 41 comprise at least 90 atomic percent carbon, such as 95 to 100 atomic percent carbon. The tubular carbon-based structures 41 are located in the lateral recesses 49R in contact with upper portions of the sidewalls of the first and second insulating cap layers (170, 270) which face the memory openings 49.

Figure 12N:
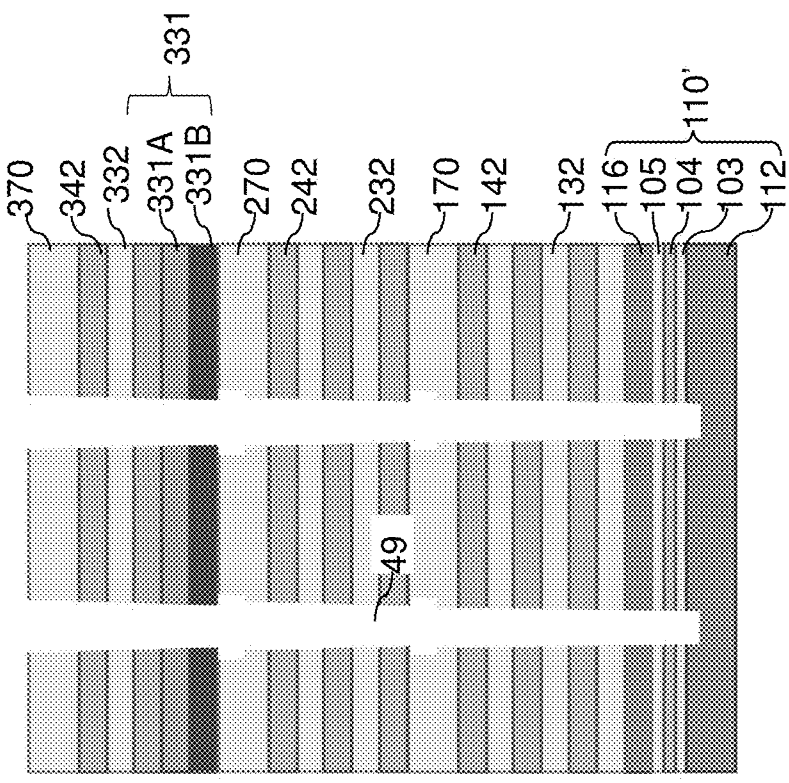
FIG. 12N is a vertical cross-sectional view of a fourth alternative embodiment of the exemplary structure after formation of inter-tier memory openings according to an embodiment of the present disclosure.

Referring to FIG. 12N, a fourth alternative embodiment of the exemplary structure may be derived from the exemplary structure of FIG. 10, the first alternative embodiment illustrated in FIG. 12J, the second alternative embodiment illustrated in FIG. 12L or the third alternative embodiment illustrated in FIG. 12L by forming at least one high etch rate layer 331 between the second-tier and the third-tier alternating stacks. The at least one high etch rate layer 331 may have a higher wet etch rate (e.g., at least 30% higher, such as 50 to 100% higher) than the third insulating layers 332 and the third sacrificial material layers 342 during the isotropic etch step described above with respect to FIG. 12J.

The at least one high etch rate layer 331 may comprise a high etch rate oxide layer 331A and a high etch rate nitride layer 331B formed over the second-tier alternating stack (232, 242) and over the second insulating cap layer 270 prior to forming the third-tier alternating stack (332, 342). The high etch rate oxide layer 331A may comprise a silicon oxide layer which has a higher wet etch rate (e.g., at least 30% higher, such as 50 to 100% higher) than the third insulating layers 332 during the isotropic etch step described above with respect to FIG. 12J. The high etch rate nitride layer 331A may comprise a silicon nitride layer which has a higher wet etch rate (e.g., at least 30% higher, such as 50 to 100% higher) than the third sacrificial material layers 342 during the isotropic etch step described above with respect to FIG. 12J. The third-tier alternating stack (332, 324) may be formed on the at least one high etch rate layer 331.

FIGS. 13A-13D illustrate sequential vertical cross-sectional views of a memory opening 49 during formation of a memory opening fill structure 58 according to an embodiment of the present disclosure. The same structural change occurs in each of the memory openings 49 and the support openings 19.

Figure 13B:
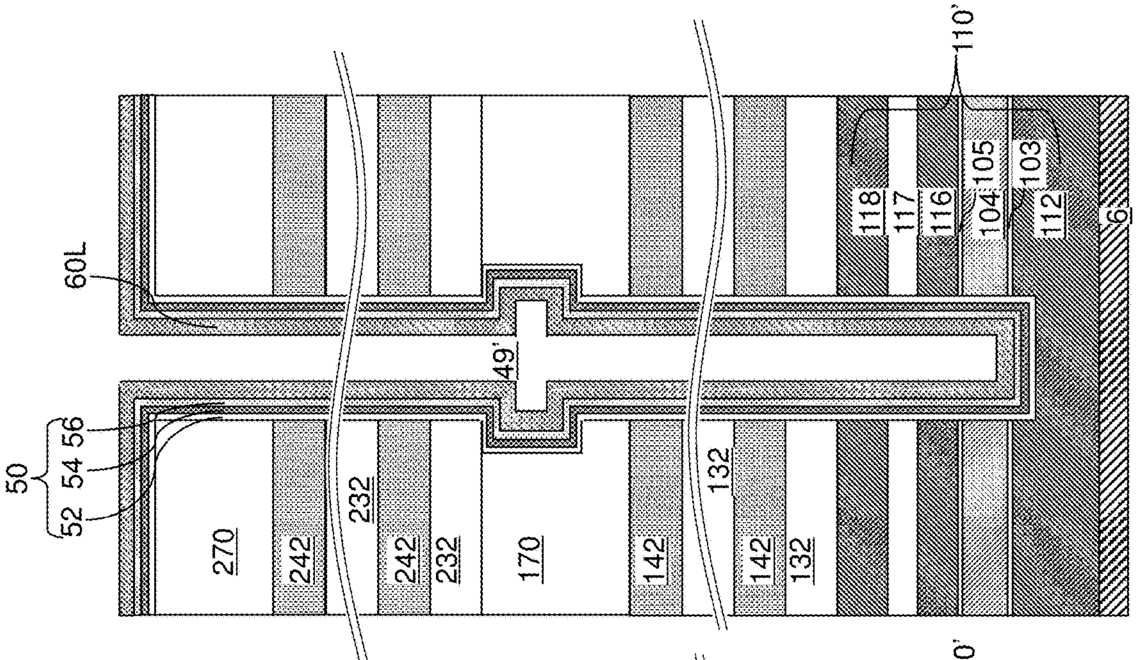
FIGS. 13A-13D illustrate sequential vertical cross-sectional views of a memory opening during formation of a memory opening fill structure according to an embodiment of the present disclosure.
Figure 13A:
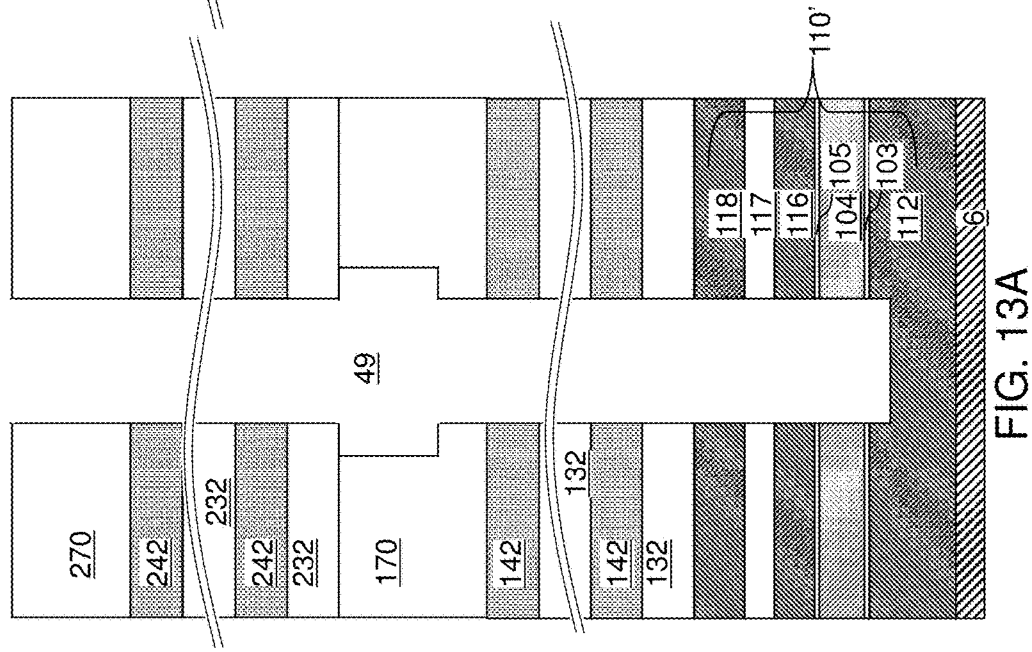

Referring to FIG. 13A, a memory opening 49 is illustrated, which may be a memory opening 49 formed by any of the previously described methods. The memory opening 49 extends through the first-tier structure and the second-tier structure.

Referring to FIG. 13B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 13D:
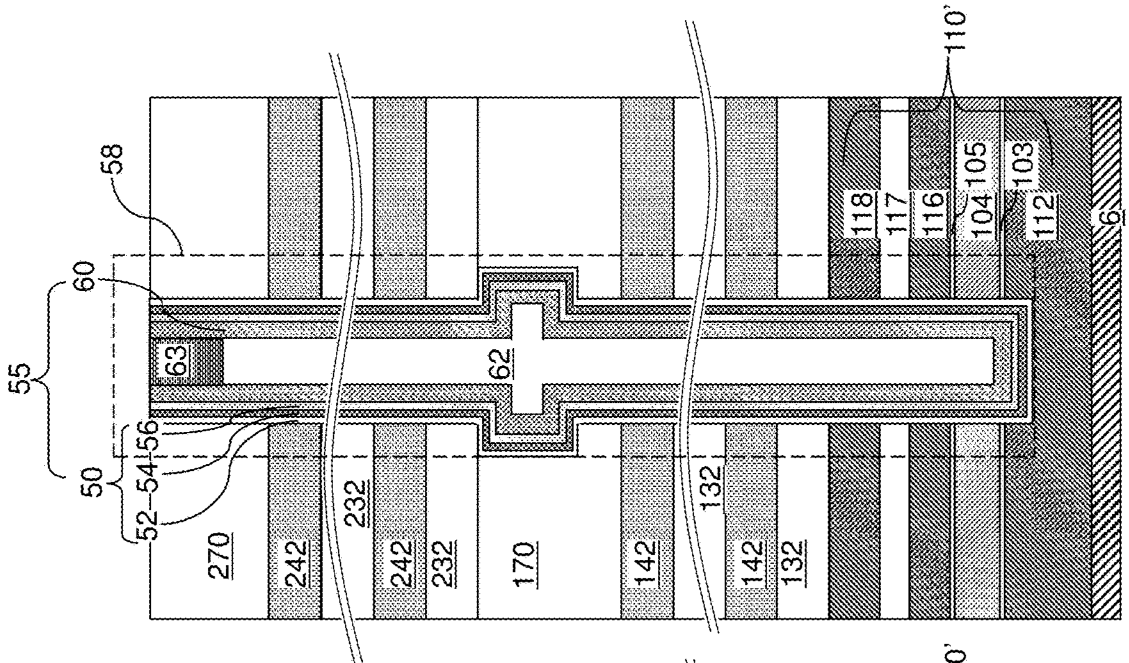
Figure 13C:
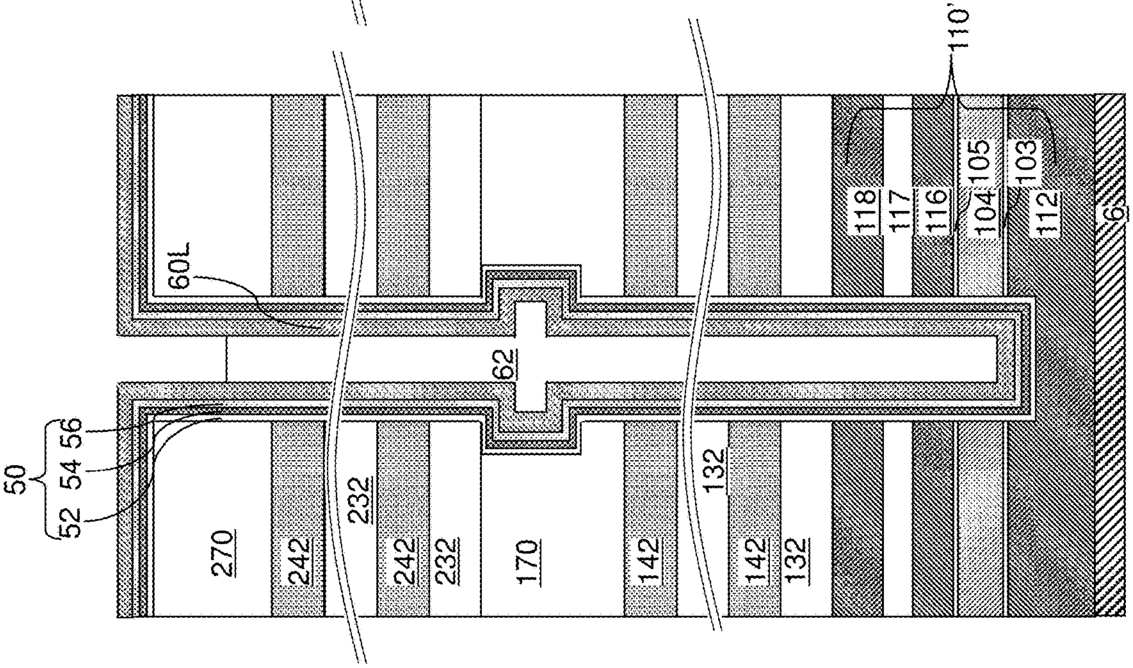

Referring to FIG. 13C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 13D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped poly silicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the memory opening fill structures 58, and support pillar structures that are formed in the support openings 19 collectively constitute a memory-level assembly.

Figure 13E:
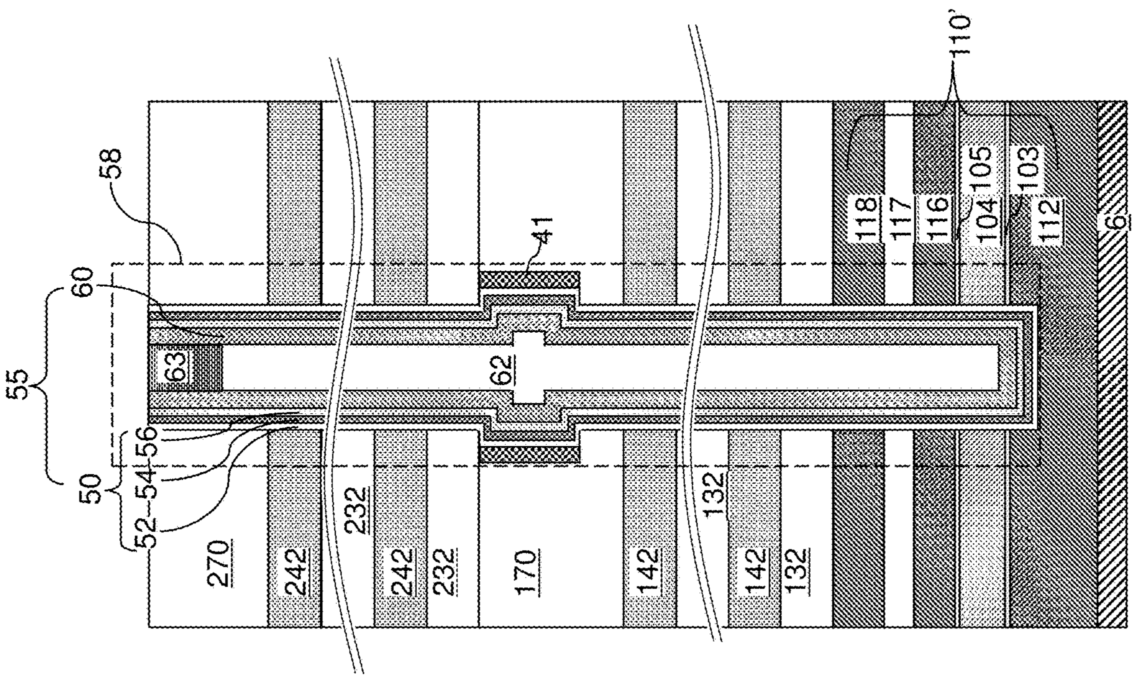
FIG. 13E is a vertical cross-sectional view of an alternative configuration of a memory opening fill structure according to an embodiment of the present disclosure.

Referring to FIG. 13E, an alternative configuration of a memory opening fill structure 58 according to an embodiment of the present disclosure. The alternative configuration may be formed by employing the third alternative embodiment of the exemplary structure illustrated in FIG. 12M. The memory opening fill structure 58 is formed by sequentially depositing a memory film 50 and a vertical semiconductor channel 60. The memory film 50 comprises the vertical stack of memory elements therein. A cylindrical surface segment of the memory film 50 is formed directly on an inner cylindrical sidewall of a tubular carbon-based structure 41, which is a remaining tubular portion of a respective sacrificial pillar structure (168, 268).

Figure 14A:
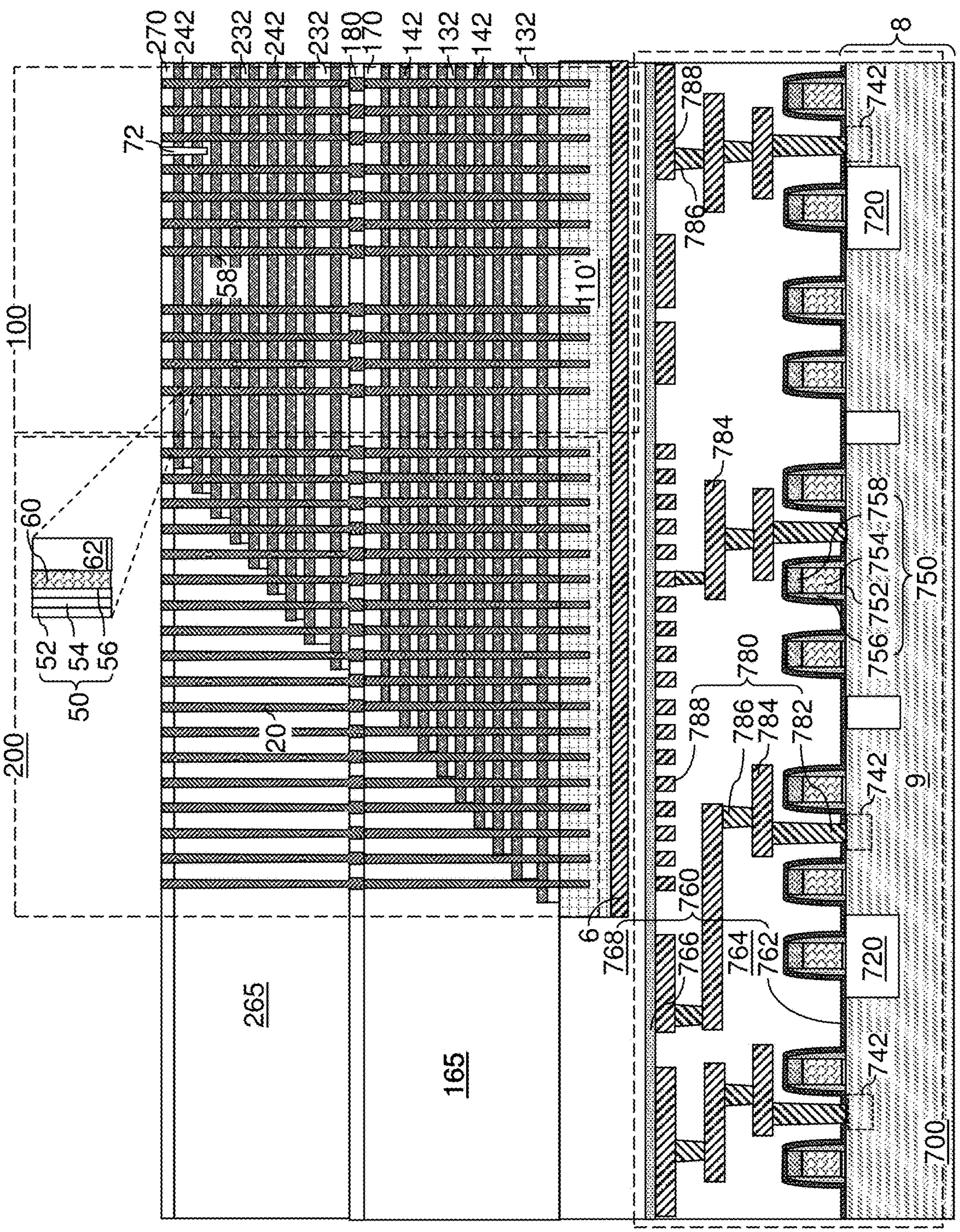
FIG. 14A is a vertical cross-sectional view of the exemplary structure after formation of memory opening fill structures and support pillar structures according to an embodiment of the present disclosure.
Figure 14B:
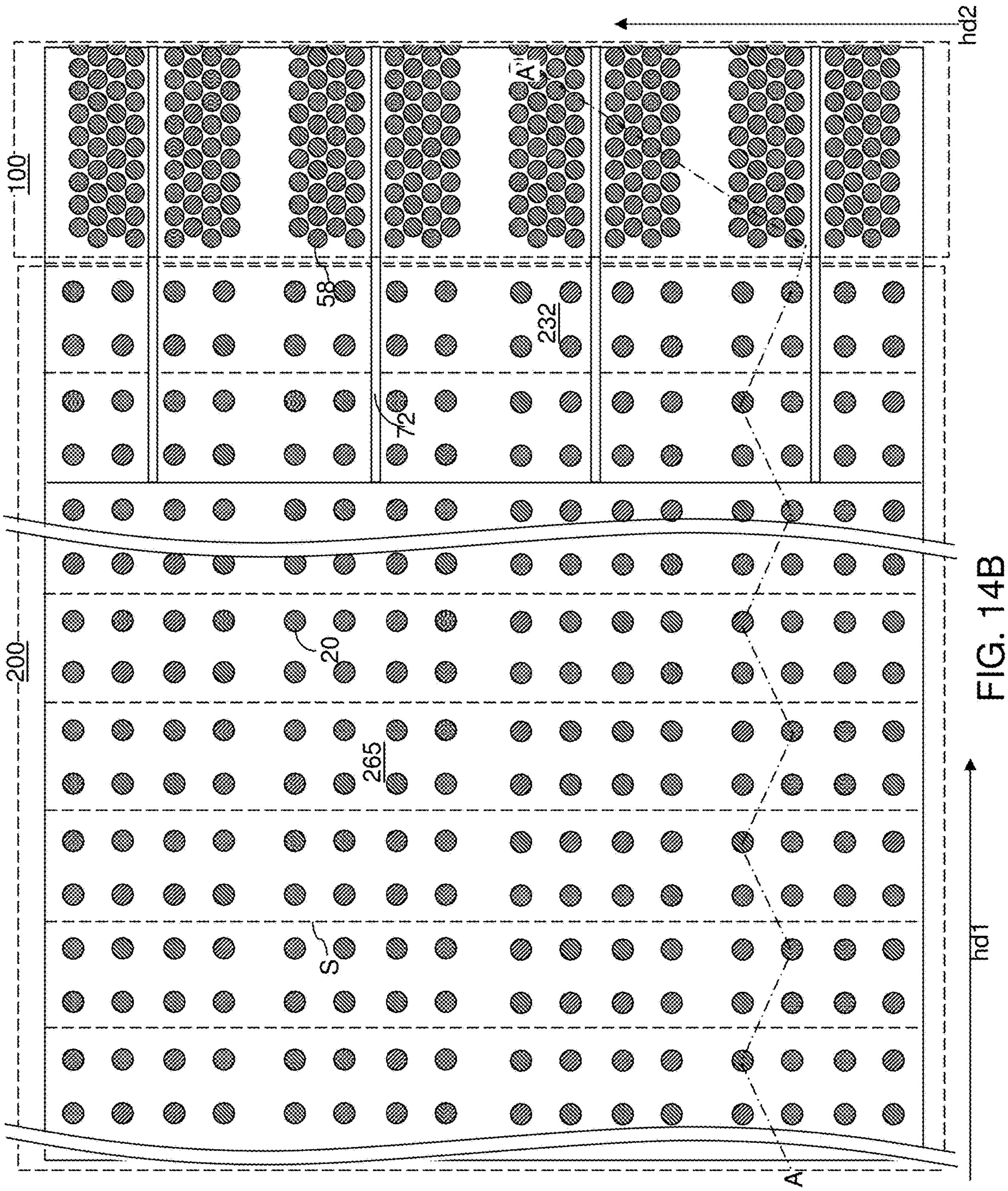
FIG. 14B is a top-down view of the exemplary structure of FIG. 14A. The hinged vertical plane A-A' corresponds to the plane of the vertical cross-sectional view of FIG. 14A.

Referring to FIGS. 14A and 14B, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 15A:
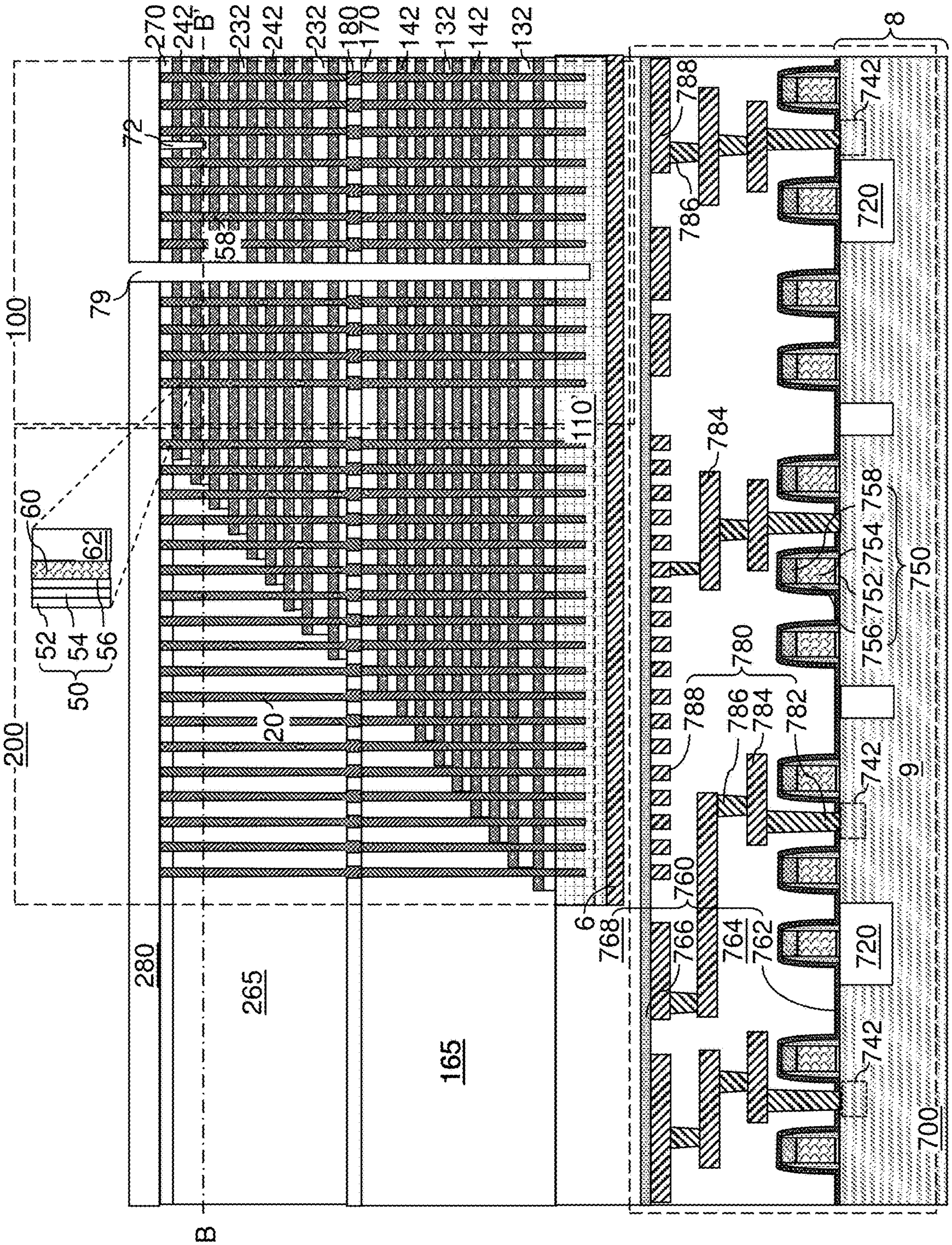
FIG. 15A is a vertical cross-sectional view of the exemplary structure after formation of a first contact-level dielectric layer and backside trenches according to an embodiment of the present disclosure.
Figure 15B:
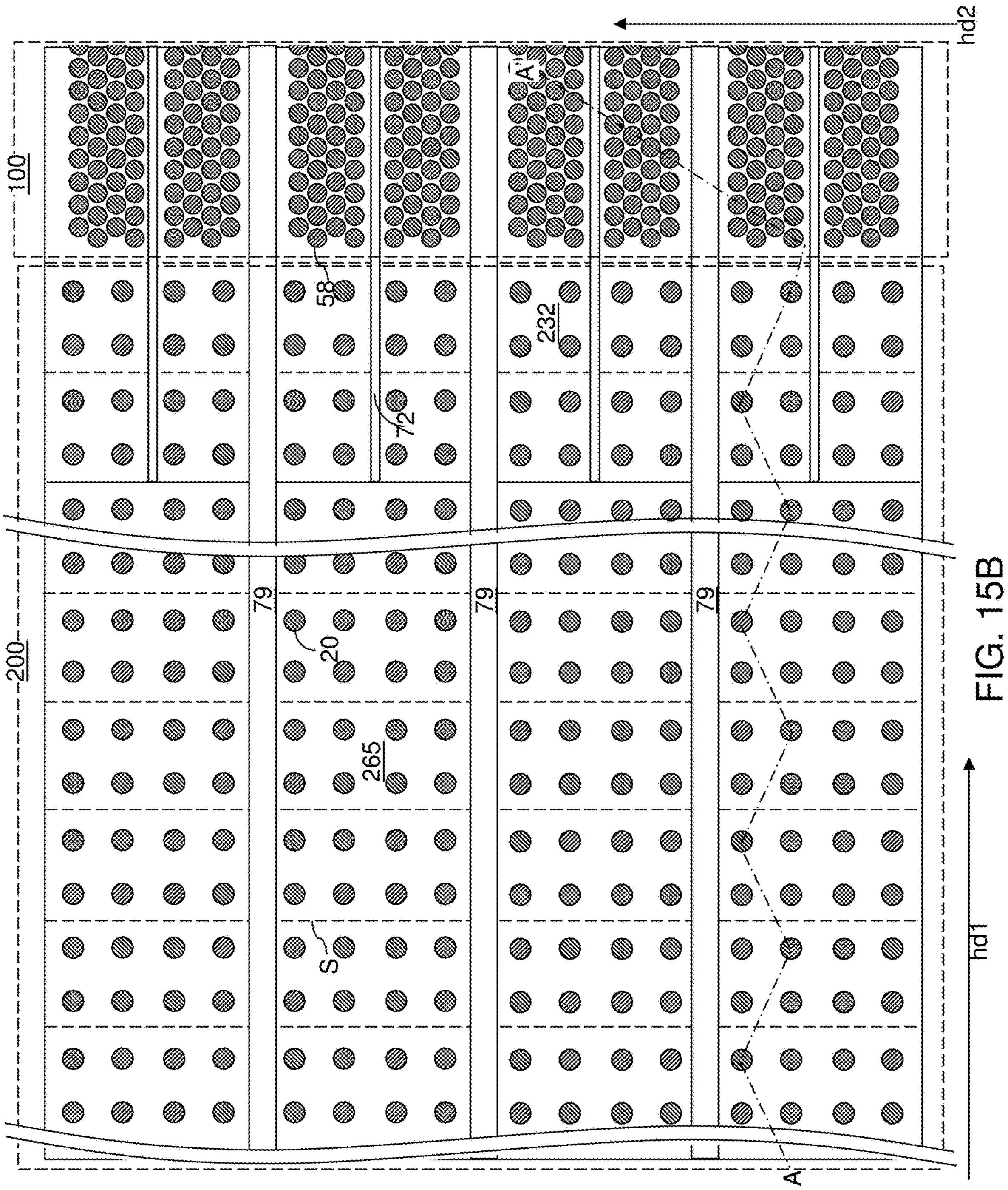
FIG. 15B is a horizontal cross-sectional view of the exemplary structure along the horizontal plane B-B' of FIG. 15A. The hinged vertical plane A-A' corresponds to the plane of the vertical cross-sectional view of FIG. 15A.

Referring to FIGS. 15A and 15B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 16:
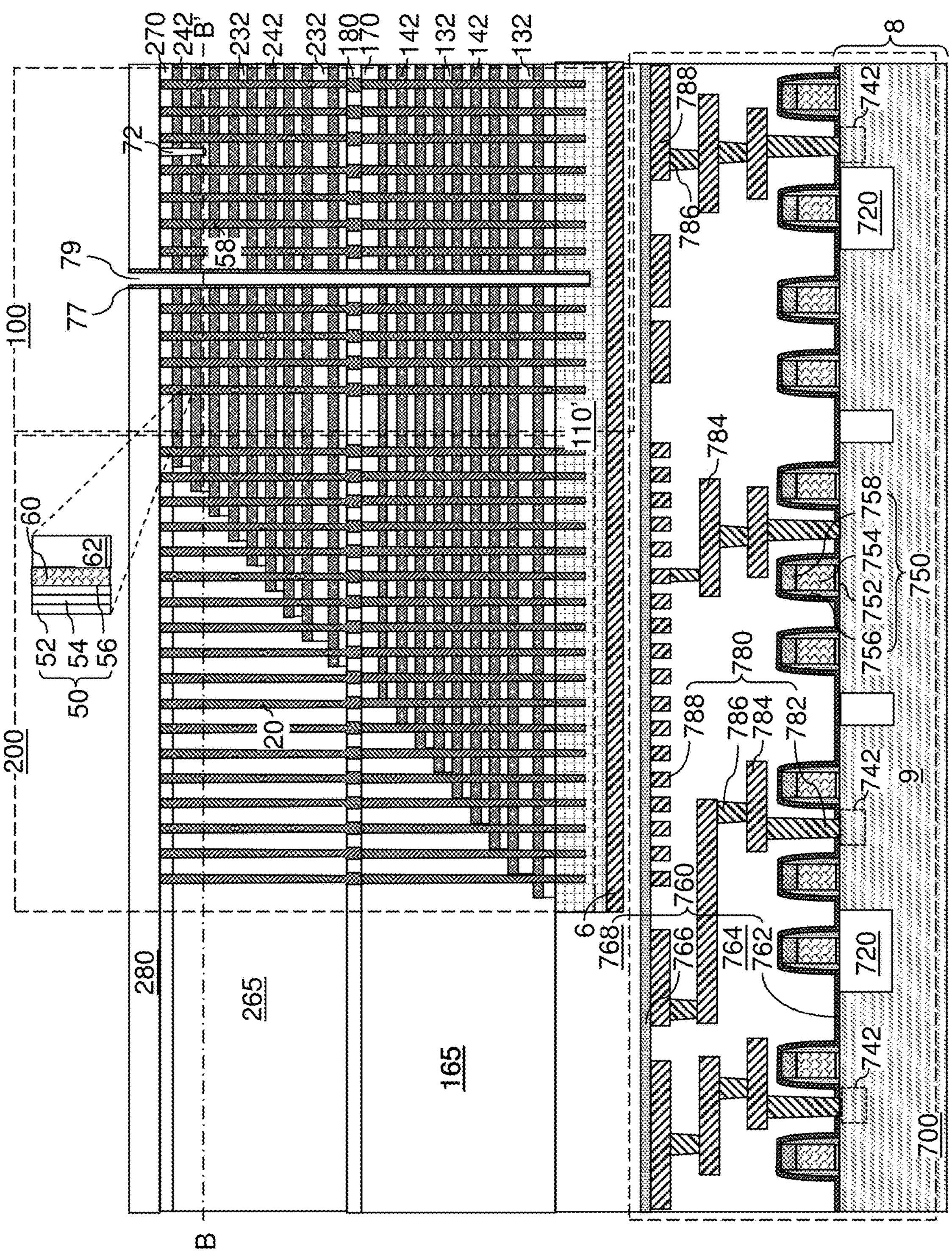
FIG. 16 is a vertical cross-sectional view of the exemplary structure after formation of backside trench spacers according to an embodiment of the present disclosure.
Figure 17A:
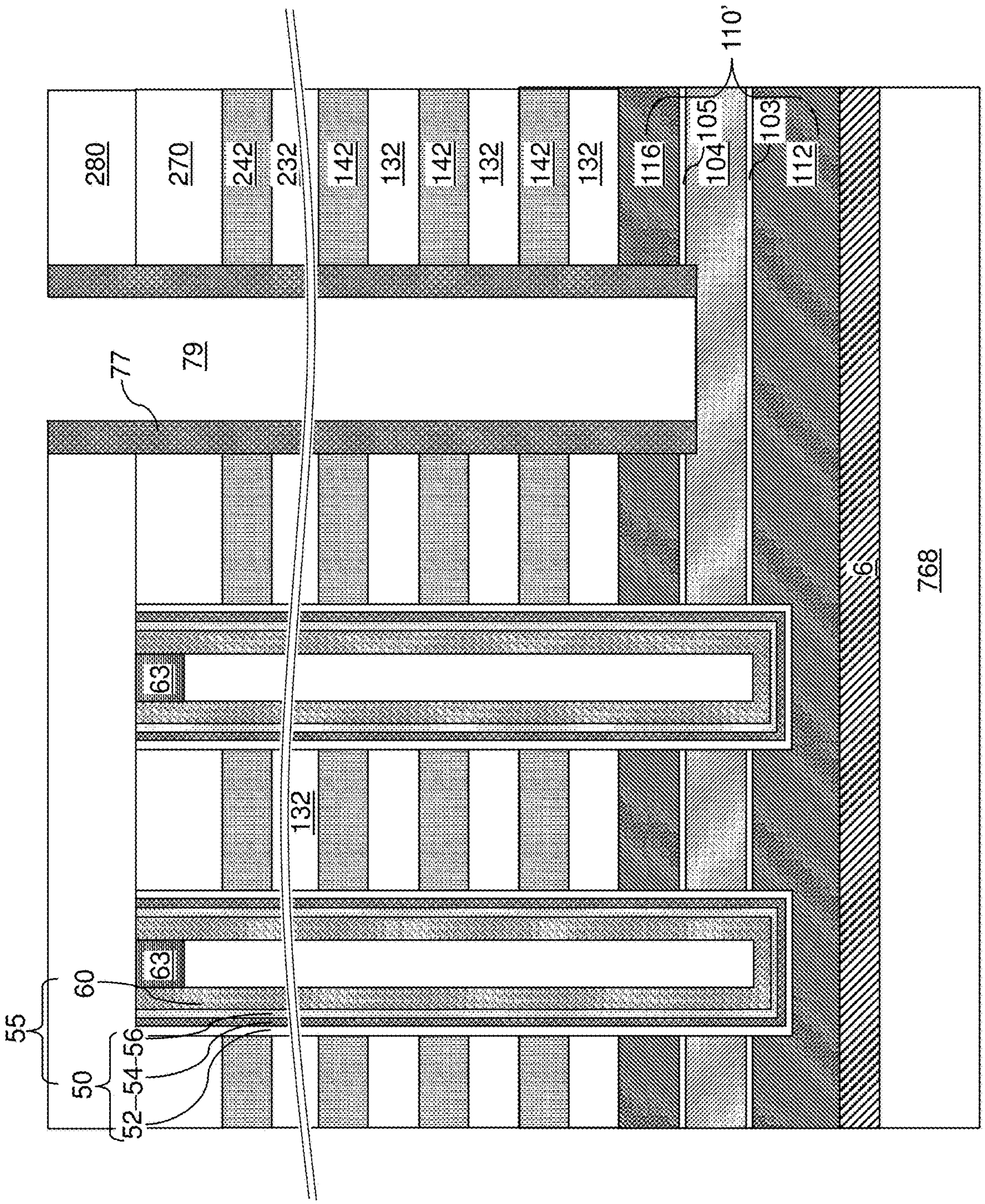
FIGS. 17A-17E illustrate sequential vertical cross-sectional views of memory opening fill structures and a backside trench during formation of source-level material layers according to an embodiment of the present disclosure.

Referring to FIGS. 16 and 17A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 17B:
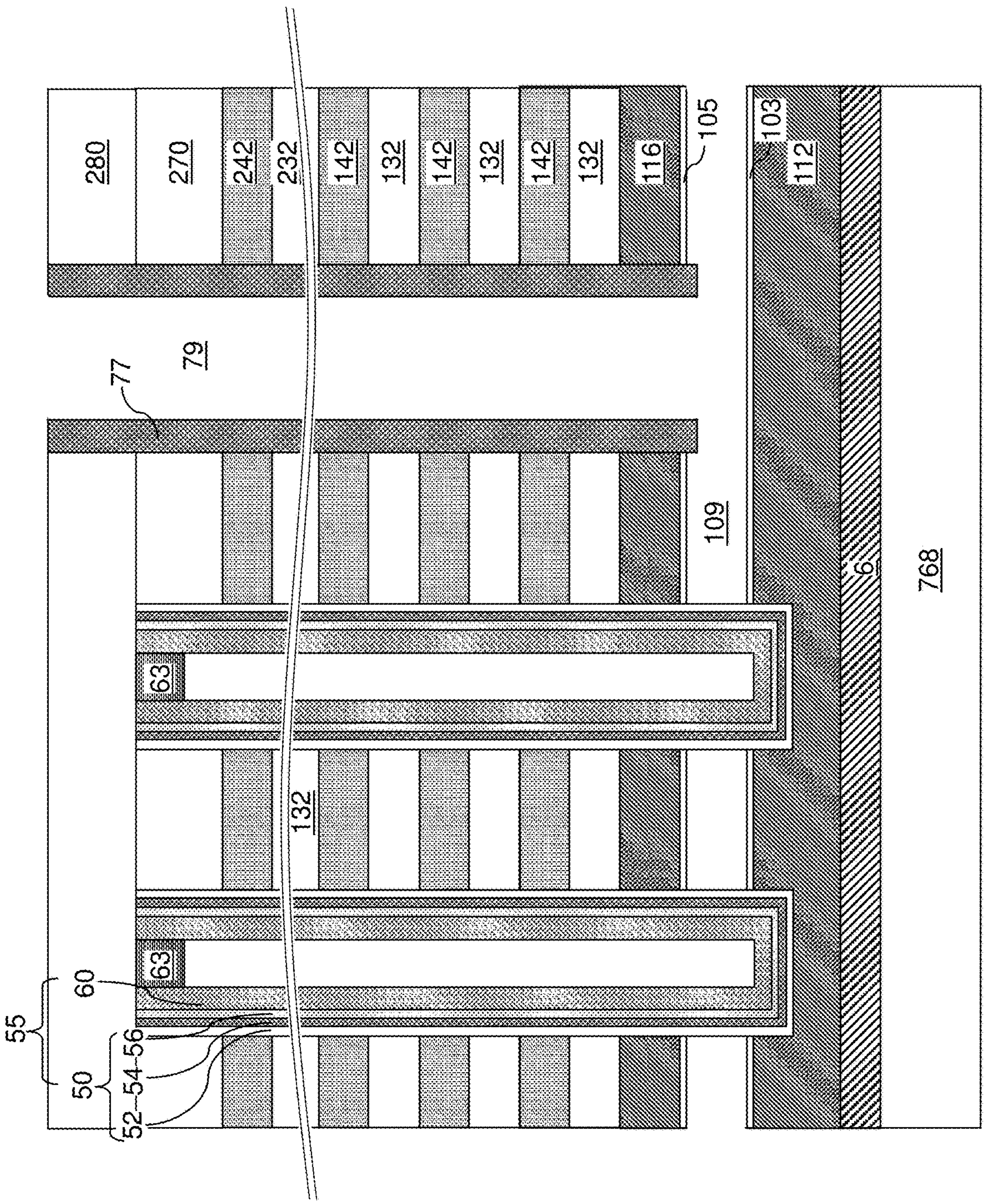

Referring to FIG. 17B, an etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 17C:
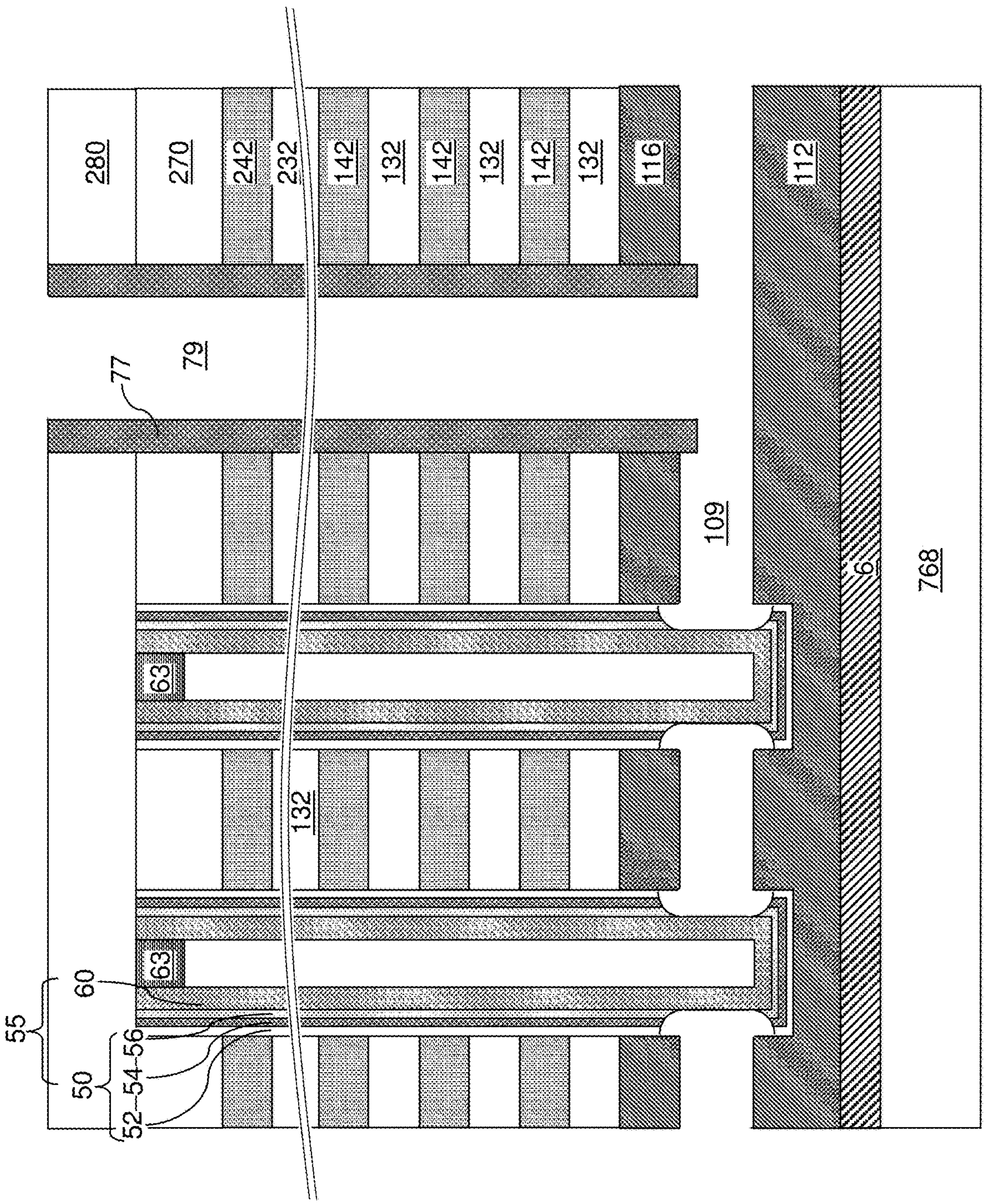

Referring to FIG. 17C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 17D:
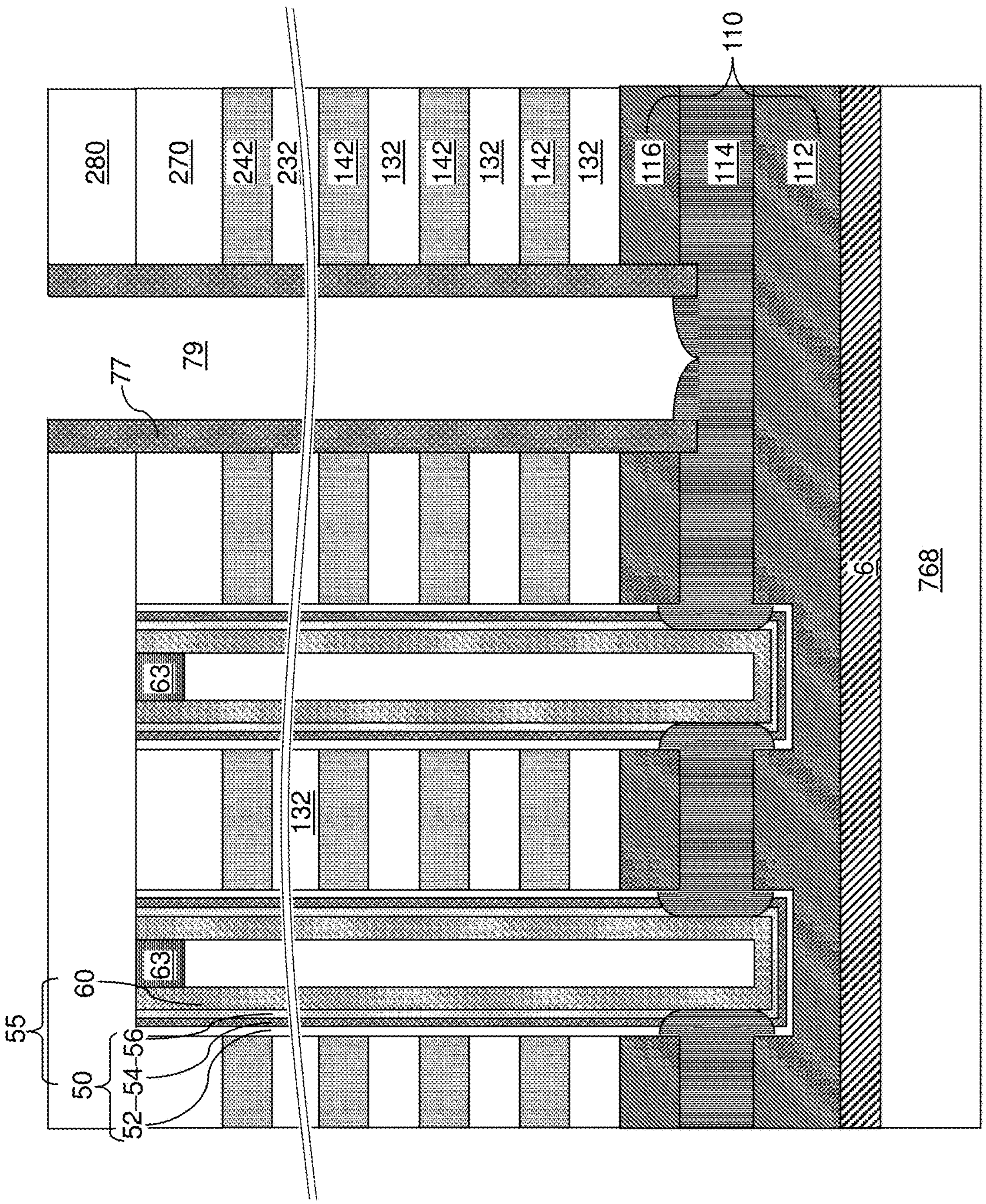

Referring to FIG. 17D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 17E:
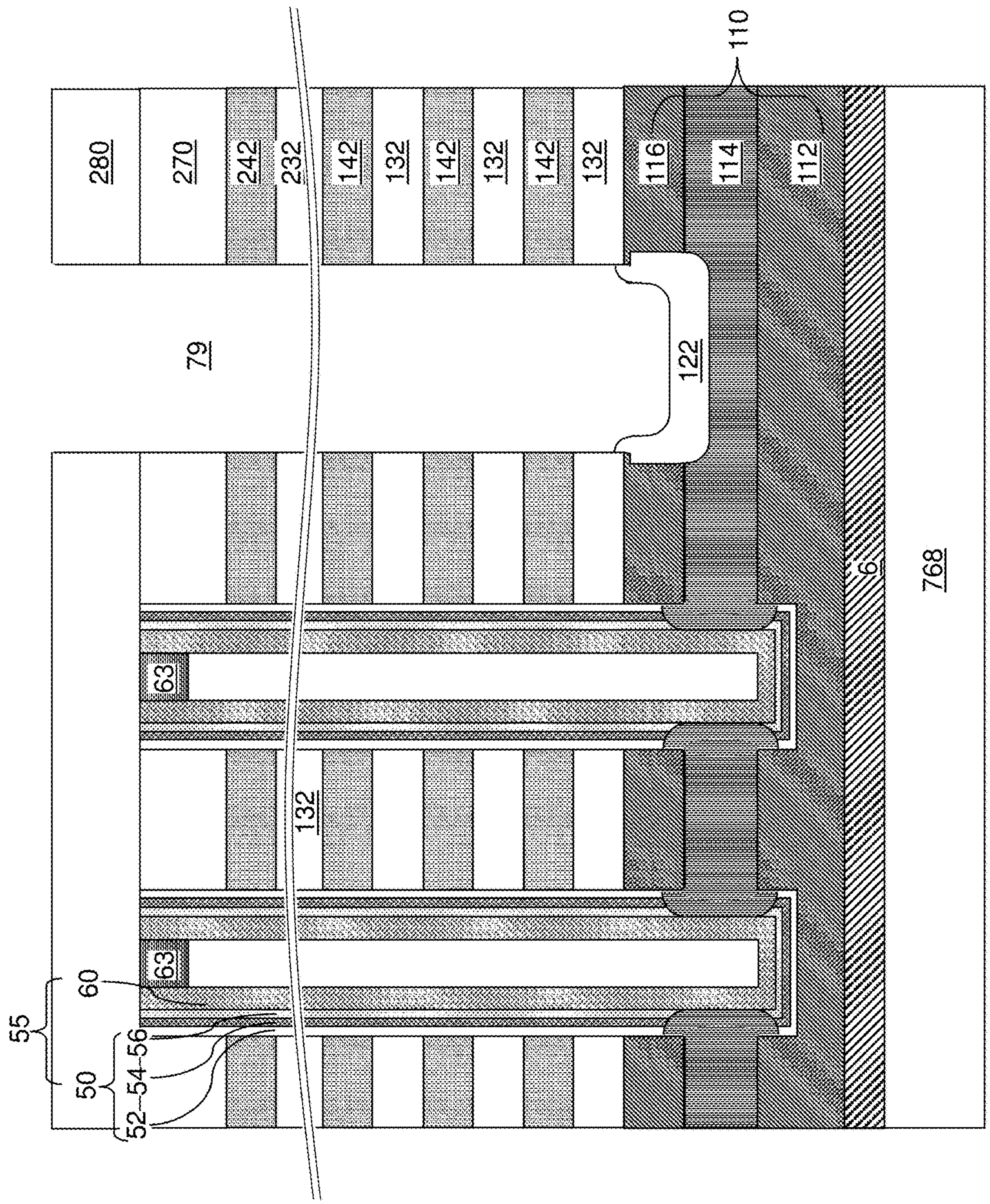
Figure 18:
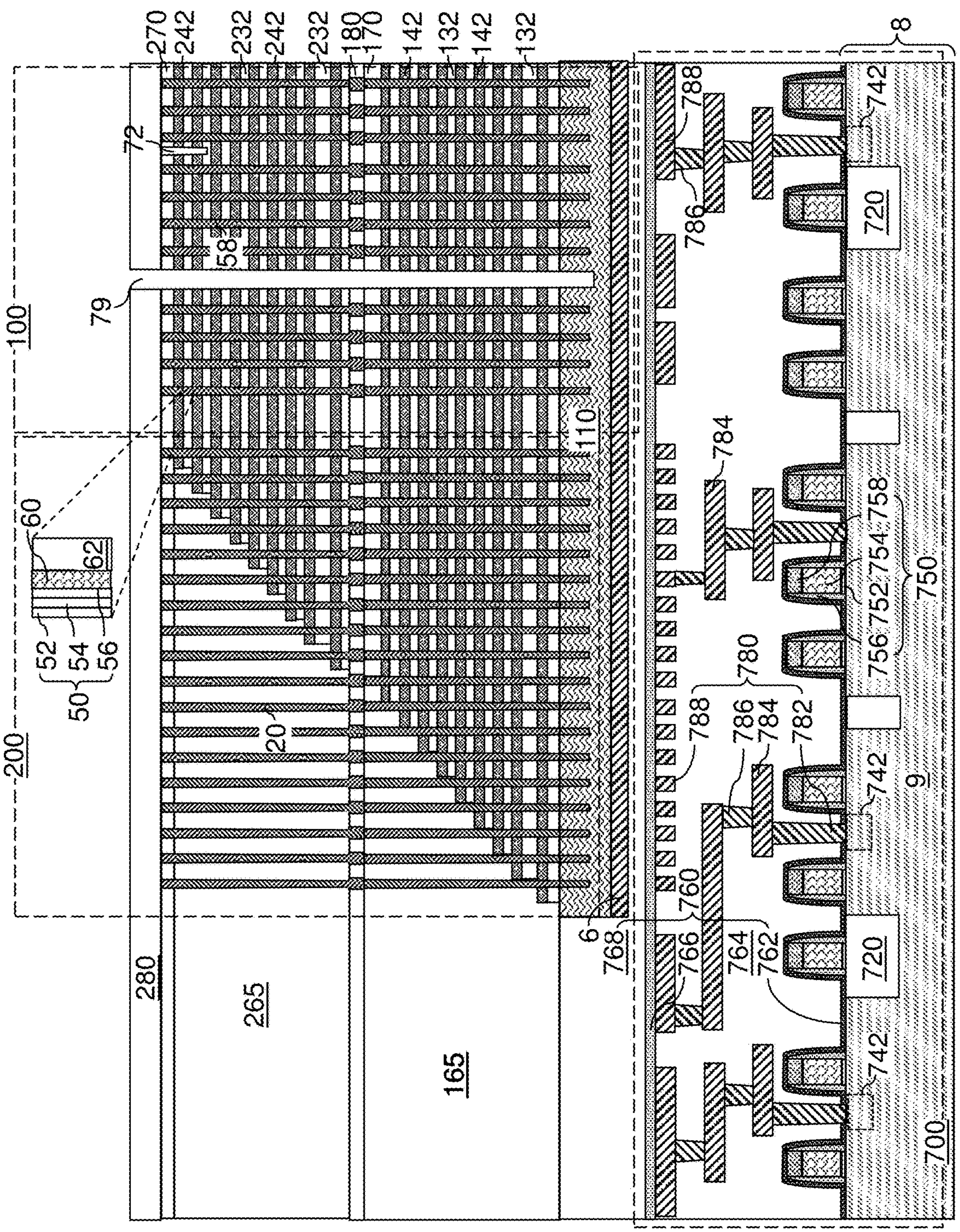
FIG. 18 is a vertical cross-sectional view of the exemplary structure after formation of source-level material layers according to an embodiment of the present disclosure.

Referring to FIGS. 17E and 18, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 19:
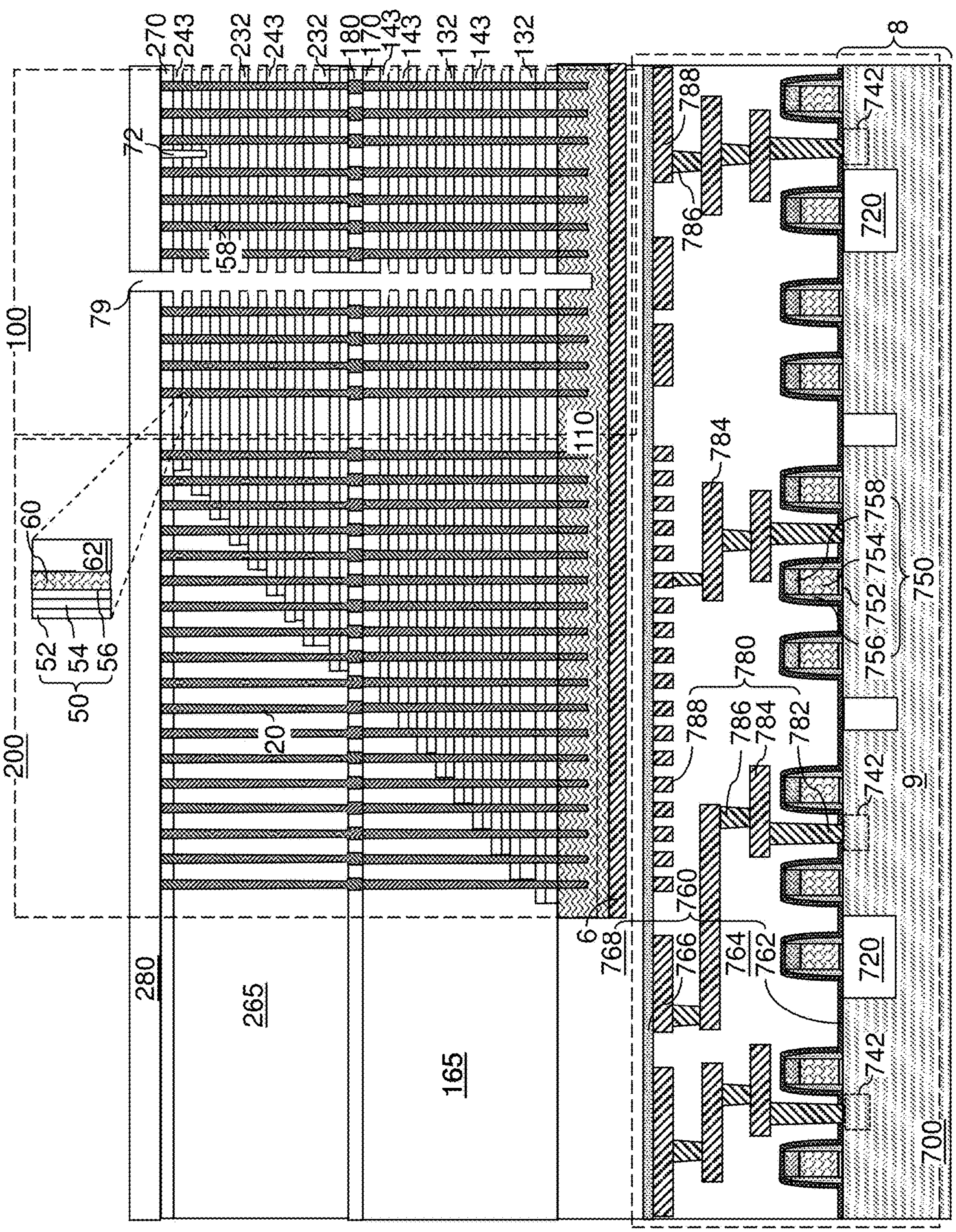
FIG. 19 is a vertical cross-sectional view of the exemplary structure after formation of backside recesses according to an embodiment of the present disclosure.

Referring to FIG. 19, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. In one embodiment, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials. The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 20A:
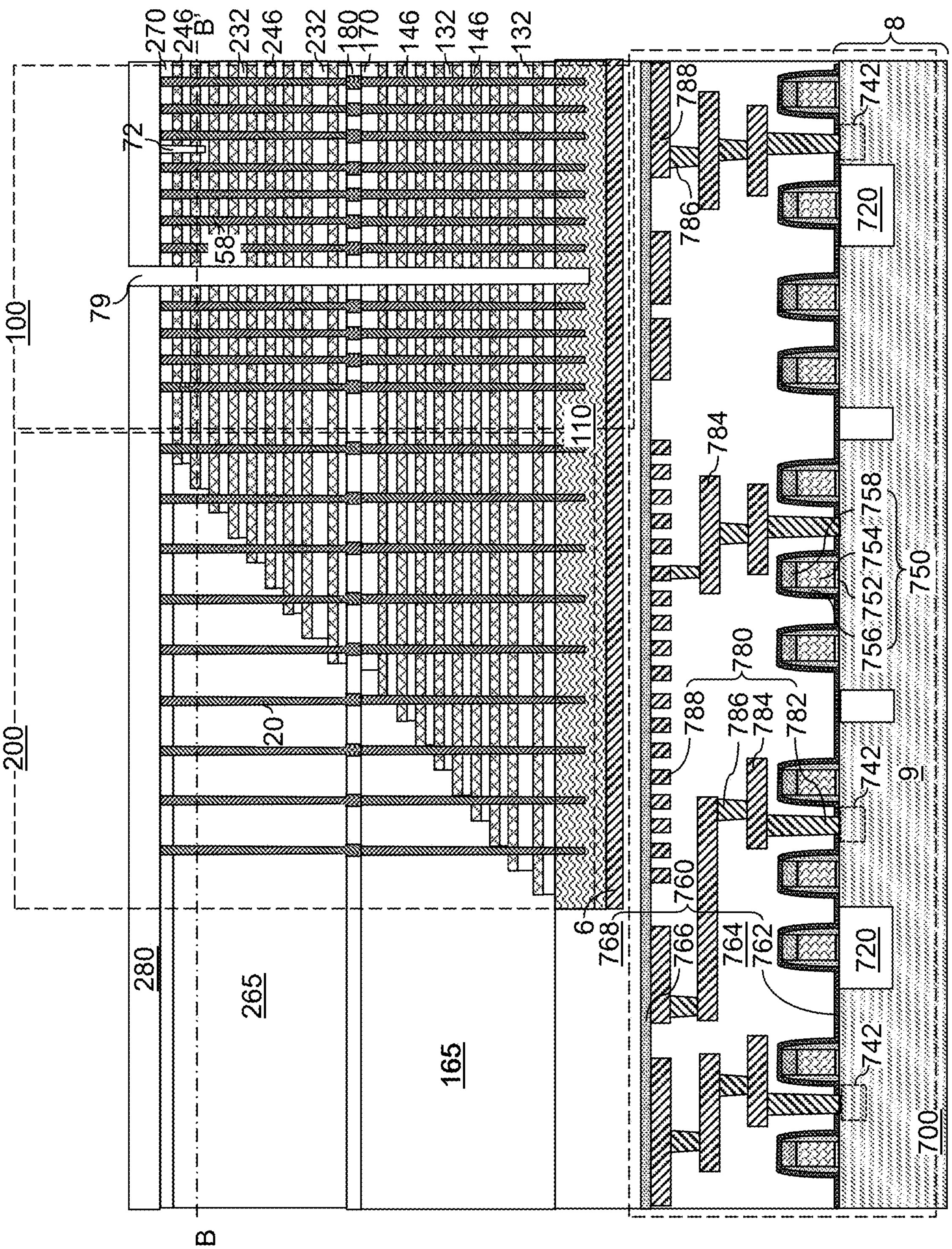
FIG. 20A is a vertical cross-sectional view of the exemplary structure after formation of electrically conductive layers according to an embodiment of the present disclosure.
Figure 20B:
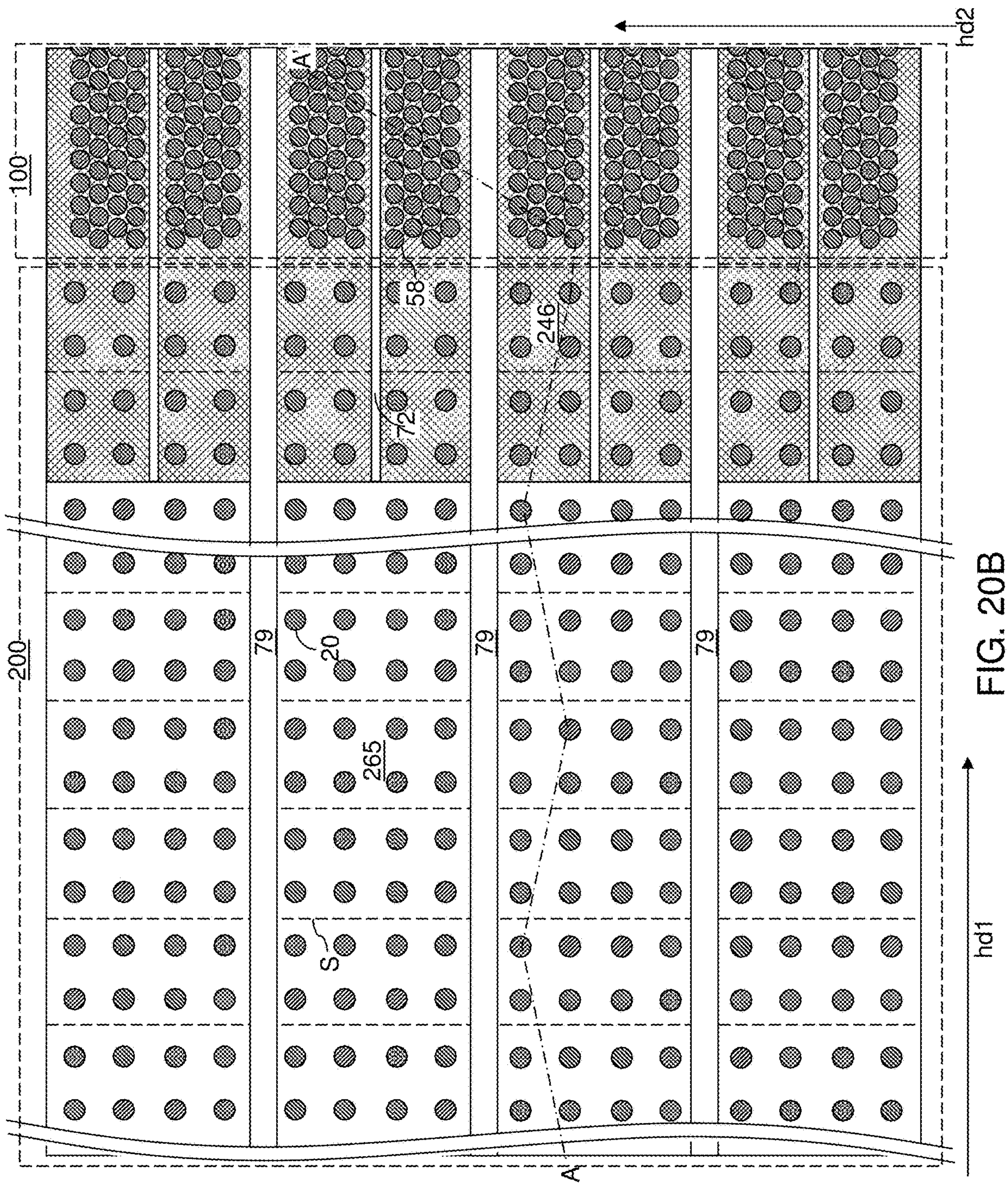
FIG. 20B is a horizontal cross-sectional view of the exemplary structure along the horizontal plane B-B' of FIG. 20A. The hinged vertical plane A-A' corresponds to the plane of the vertical cross-sectional view of FIG. 20A.
Figure 20C:
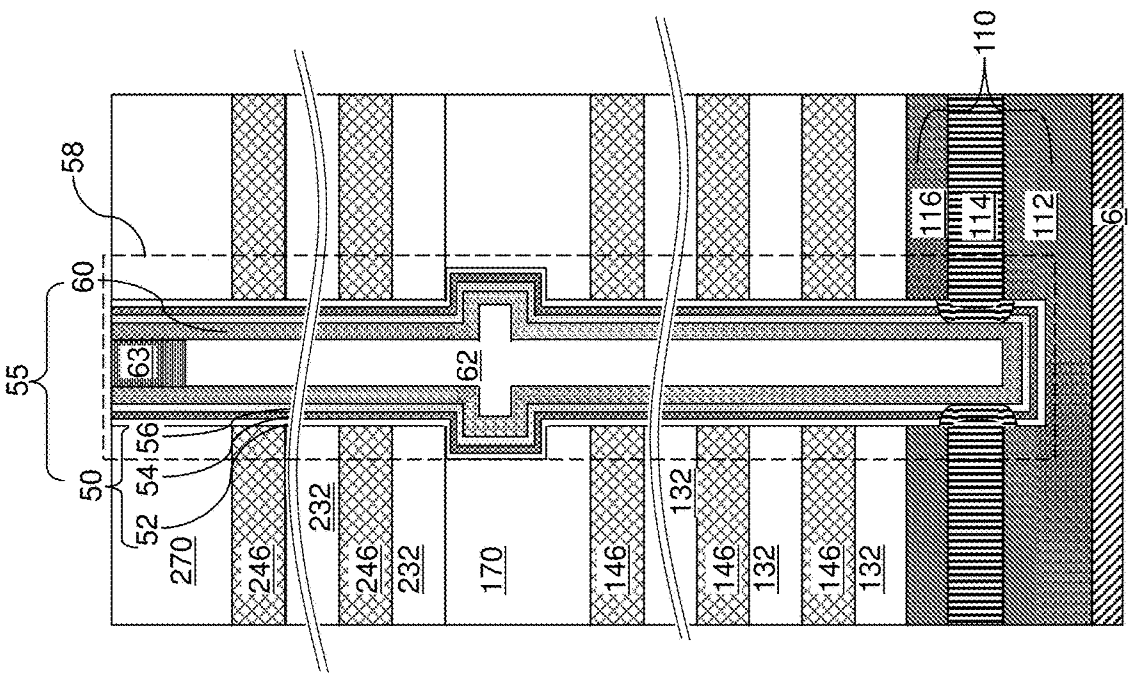
FIG. 20C is a magnified view of a portion of the exemplary structure of FIG. 20A around a memory opening fill structure.

Referring to FIGS. 20A-20C, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 20D:
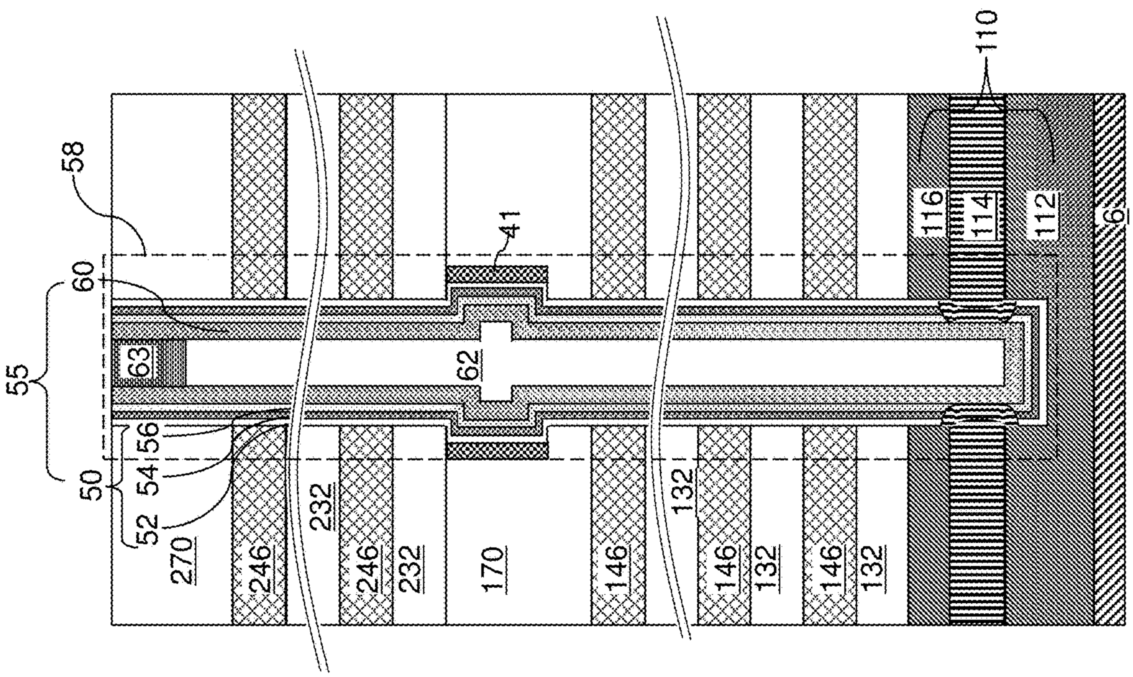
FIG. 20D is a magnified view of a portion of an alternative embodiment of the exemplary structure around a memory opening fill structure.

Referring to FIG. 20D, an alternative embodiment of the exemplary structure is illustrated around a memory opening fill structure 58. The alternative configuration may be formed by employing the third alternative embodiment of the exemplary structure illustrated in FIGS. 12M and 13E. A cylindrical surface segment of the memory film 50 contacts an inner cylindrical sidewall of a tubular carbon-based structure 41, which is a remaining tubular portion of a respective sacrificial pillar structure (168, 268).

Figure 21A:
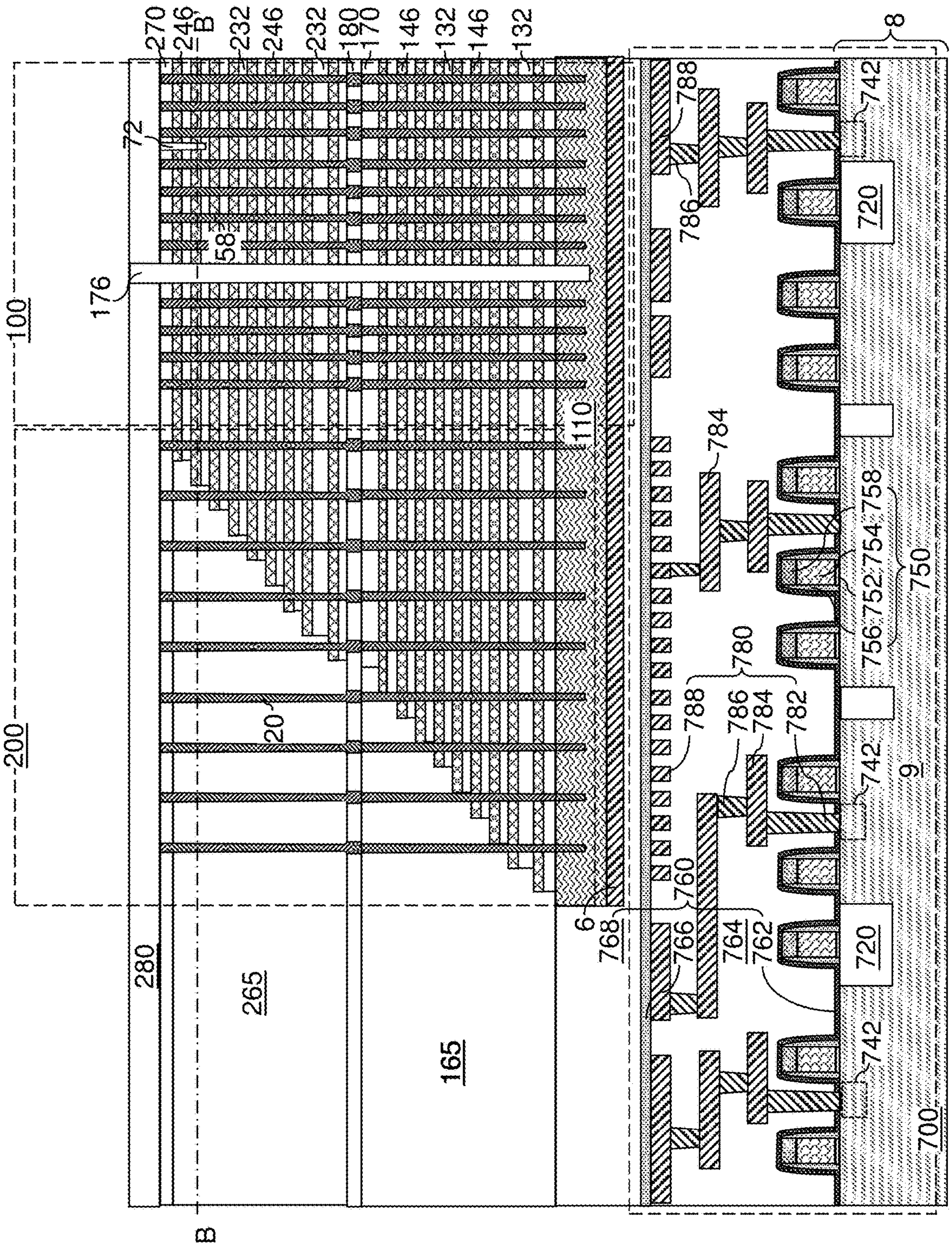
FIG. 21A is a vertical cross-sectional view of the exemplary structure after formation of backside trench fill structures in the backside trenches according to an embodiment of the present disclosure.
Figure 21B:
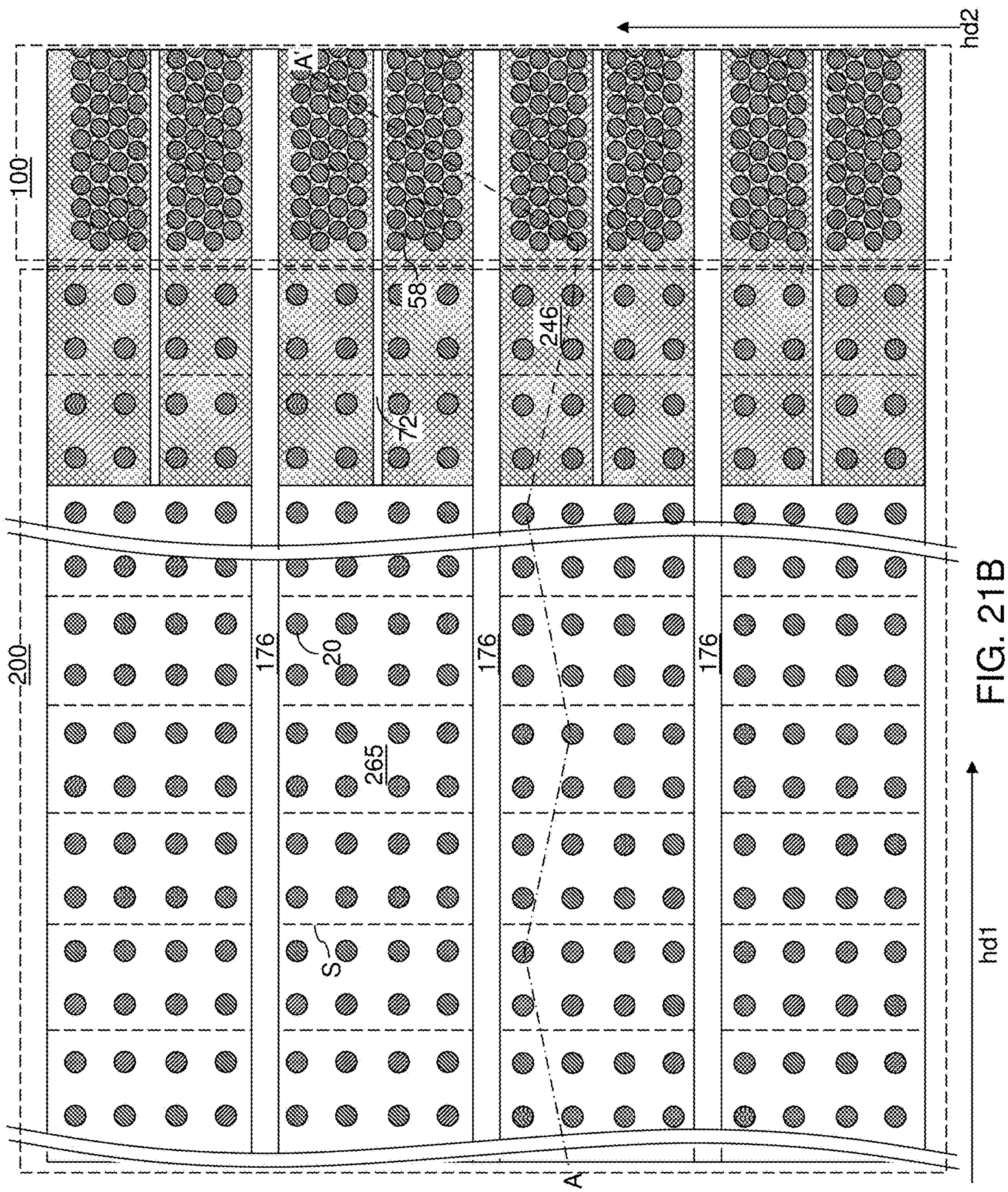
FIG. 21B is a horizontal cross-sectional view of the exemplary structure along the horizontal plane B-B' of FIG. 21A. The hinged vertical plane A-A' corresponds to the plane of the vertical cross-sectional view of FIG. 21A.

Referring to FIGS. 21A and 21B, a dielectric material layer may be conformally deposited in the backside trenches 79 and over the first contact-level dielectric layer 280 by a conformal deposition process. The dielectric material layer may include, for example, silicon oxide.

Figure 22A:
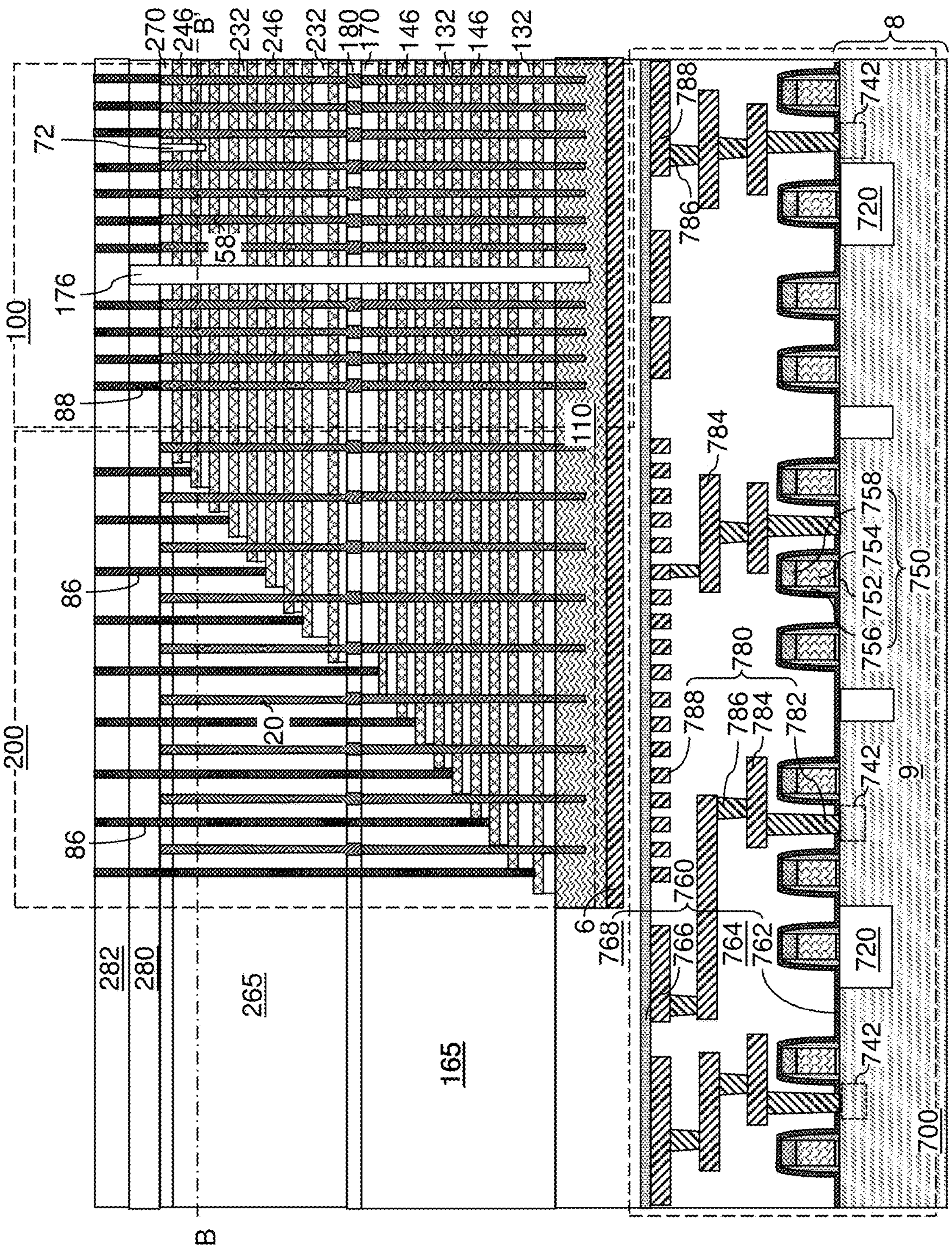
FIG. 22A is a vertical cross-sectional view of the exemplary structure after formation of a second contact-level dielectric layer and various contact via structures according to an embodiment of the present disclosure.
Figure 22B:
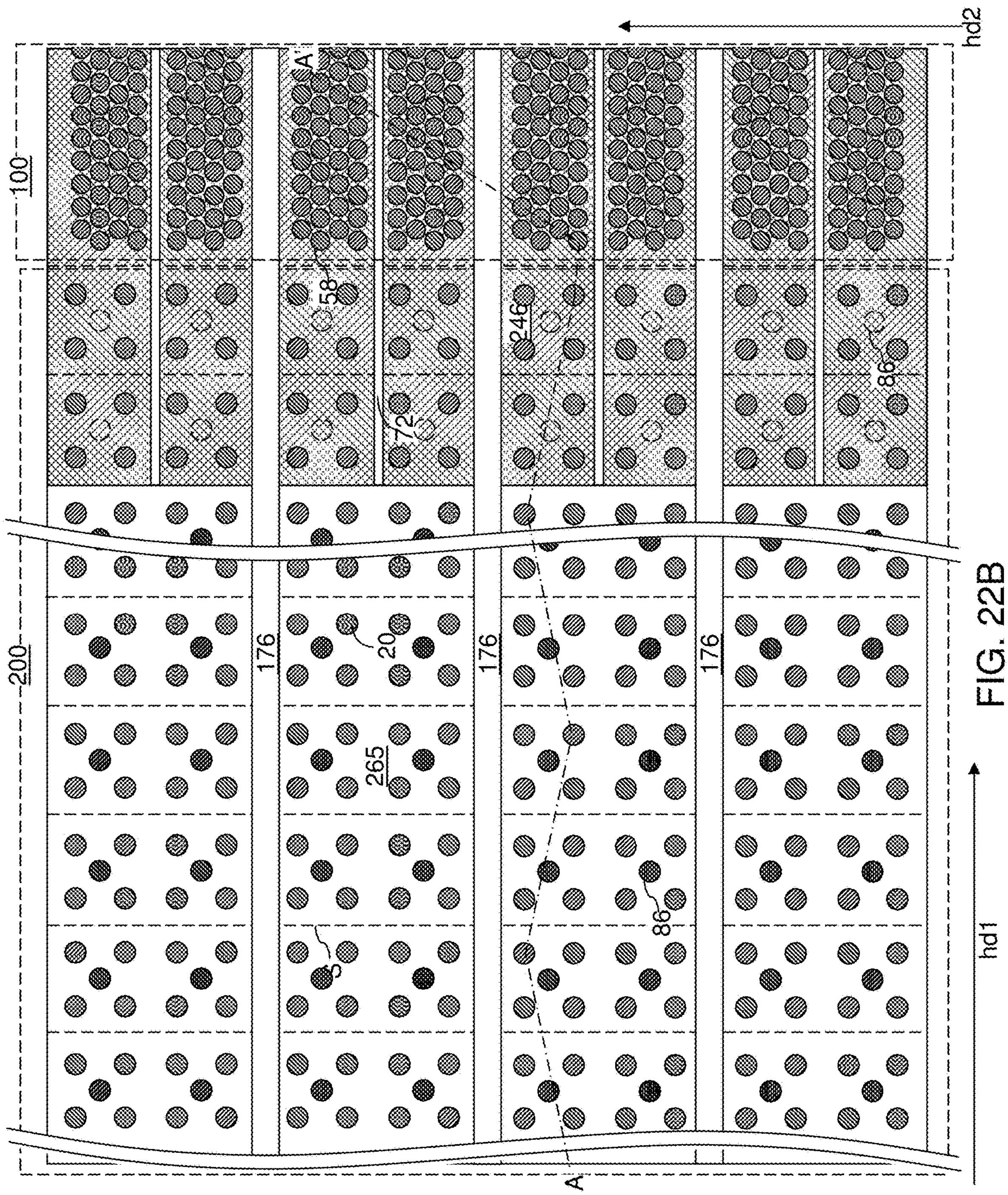
FIG. 22B is a horizontal cross-sectional view of the exemplary structure along the vertical plane B-B' of FIG. 22A. The hinged vertical plane A-A' corresponds to the plane of the vertical cross-sectional view of FIG. 22A.

Referring to FIGS. 22A and 22B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 23:
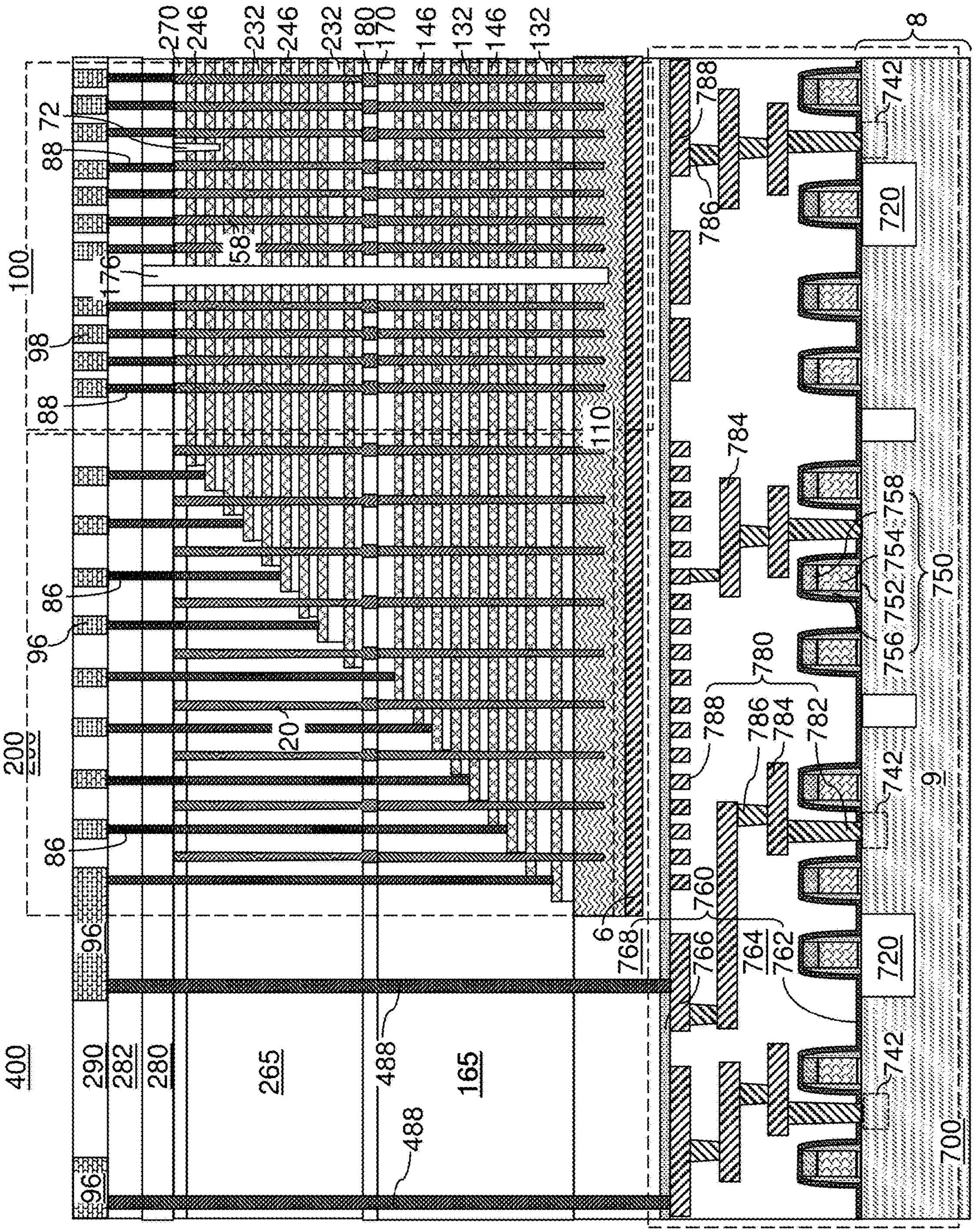
FIG. 23 is a vertical cross-sectional view of the exemplary structure after formation of through-memory-level via structures and upper metal line structures according to an embodiment of the present disclosure.

Referring to FIG. 23, peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in the peripheral device region 400. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Referring to all drawings and according to various embodiments of the present disclosure, a memory device is provided, which comprises: a first-tier alternating stack (132, 146) of first-tier insulating layers 132 and first-tier electrically conductive layers 146; a second-tier alternating stack (232, 246) of second-tier insulating layers 232 and second-tier electrically conductive layers 246 located over the first-tier alternating stack (132, 146); a memory opening fill structure 58 vertically extending through the second-tier alternating stack (232, 246) and the first-tier alternating stack (132, 146) and comprising a memory film 50 and a vertical semiconductor channel 60; and a tubular carbon-based structure 41 laterally surrounded by a topmost first-tier insulating layer 132 within the first-tier alternating stack (132, 146) and laterally surrounding, and contacting, the memory opening fill structure 58.

In one embodiment, the tubular carbon-based structure 41 comprises carbon atoms at an atomic concentration greater than 90%. In one embodiment, the tubular carbon-based structure 41 comprises: an annular top surface located within a horizontal plane including an interface between the first-tier alternating stack (132, 146) and the second-tier alternating stack (232, 246); and an annular bottom surface located above a horizontal plane including a topmost first-tier electrically conductive layer within the first-tier alternating stack (132, 146).

According to another aspect of the present disclosure, a memory device is provided, which comprises: a first-tier alternating stack (132, 146) of first-tier insulating layers 132 and first-tier electrically conductive layers 146; a second-tier alternating stack (232, 246) of second-tier insulating layers 232 and second-tier electrically conductive layers 246 located over the first-tier alternating stack (132, 146); and a memory opening fill structure 58 vertically extending through the second-tier alternating stack (232, 246) and the first-tier alternating stack (132, 146) and comprising a memory film 50 and a vertical semiconductor channel 60, wherein the memory opening fill structure 58 comprises: a first straight section comprising a first cylindrical straight sidewall that vertically extends through each of the first-tier electrically conductive layers 146, a second straight section comprising a second cylindrical straight sidewall that vertically extends through each of the second-tier electrically conductive layers 246, and a laterally-protruding section that laterally protrudes outward from a top periphery of the first cylindrical straight sidewall and from a bottom periphery of the second cylindrical straight sidewall; and wherein a bottom portion of the second straight section has a greater lateral dimension than a top portion of the first straight section.

In one embodiment, the memory device further comprises a third-tier alternating stack (332, 346) of third-tier insulating layers 332 and third-tier electrically conductive layers 346 located over the second-tier alternating stack (232, 246), wherein the memory opening fill structure 58 comprises: a third straight section comprising a third cylindrical straight sidewall that vertically extends through each of the third-tier electrically conductive layers 346, and an additional laterally-protruding section that laterally protrudes outward from a top periphery of the second cylindrical straight sidewall and from a bottom periphery of the third cylindrical straight sidewall; and wherein a bottom portion of the third straight section has a greater lateral dimension than a top portion of the second straight section.

In one embodiment, the memory device further comprises at least one of a layered double oxide layer 231A and an oxygen doped nitride layer 231B located between the second-tier alternating stack (232, 246) and the third-tier alternating stack (332, 346).

In one embodiment, the memory device further comprises a tubular carbon-based structure 41 laterally surrounded by a topmost first-tier insulating layer 132 within the first-tier alternating stack (132, 146) and laterally surrounding, and contacting, the memory opening fill structure 58.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:

forming a first-tier structure including a first-tier alternating stack of first-tier insulating layers and first-tier sacrificial material layers over a substrate;

forming a first-tier memory opening through the first-tier alternating stack;

forming a first-tier sacrificial memory opening fill structure in the first-tier memory opening;

forming a second-tier structure including a second-tier alternating stack of second-tier insulating layers and second-tier sacrificial material layers over the first-tier structure;

forming an etch mask layer comprising an opening therethrough over the second-tier alternating stack;

forming a second-tier memory opening through the second-tier alternating stack, wherein a top surface of the first-tier sacrificial memory opening fill structure is physically exposed underneath the second-tier memory opening;

removing the etch mask layer employing an etch mask removal process that collaterally removes a top portion of the first-tier sacrificial memory opening fill structure;

forming a sacrificial pillar structure by performing a selective material deposition process that grows a sacrificial fill material from a top surface of a remaining portion of the first-tier sacrificial memory opening fill structure while suppressing growth of the sacrificial fill material from physically exposed surfaces of the first-tier alternating stack and the second-tier alternating stack;

forming an inter-tier memory opening by removing the first-tier sacrificial memory opening fill structure and at least a central portion of the sacrificial pillar structure;

forming a memory opening fill structure in the inter-tier memory opening, wherein the memory opening fill structure comprises a vertical stack of memory elements that are formed at levels of the first-tier sacrificial material layers and the second-tier sacrificial material layers; and replacing the first-tier sacrificial material layers and the second-tier sacrificial material layers with electrically conductive layers.

2. The method of claim 1, wherein:

the first-tier sacrificial memory opening fill structure comprises a first carbon-based material;

the etch mask layer comprises a second carbon-based material; and the sacrificial pillar structure comprises a third carbon-based material.

3. The method of claim 2, wherein:

the first carbon-based material comprises carbon atoms at an atomic concentration greater than 90%;

the second carbon-based material comprises carbon atoms at an atomic concentration greater than 90%; and the third carbon-based material comprises carbon atoms at an atomic concentration greater than 90%.

4. The method of claim 3, wherein:

the first, second and third carbon-based material comprises amorphous carbon;

the first-tier insulating layers and the second-tier insulating layers comprise silicon oxide layers; and the first-tier sacrificial material layers and the second-tier sacrificial material layer comprise silicon nitride layers.

5. The method of claim 4, wherein the first-tier sacrificial memory opening fill structure and the sacrificial pillar structure are removed by ashing.

6. The method of claim 1, wherein:

the remaining portion of the first-tier sacrificial memory opening fill structure has a top surface located underneath a horizontal plane including a bottom surface of a topmost first-tier sacrificial material layer of the first-tier sacrificial material layers; and a top surface of the sacrificial pillar structure is formed above a horizontal plane including a top surface of a topmost first-tier sacrificial material layer of the first-tier sacrificial material layers, and underneath a horizontal plane including a topmost surface of the first-tier structure.

7. The method of claim 1, further comprising:

forming a sacrificial liner on a sidewall of the first-tier memory opening, wherein the first-tier sacrificial memory opening fill structure is formed on the sacrificial liner; and removing the sacrificial liner after the removing the first-tier sacrificial memory opening fill structure.

8. The method of claim 1, further comprising laterally expanding the second-tier memory opening and a top portion of the first-tier memory opening that overlies a top surface of the sacrificial pillar structure.

9. The method of claim 8, wherein:

the second-tier memory opening and the top portion of the first-tier memory opening are laterally expanded such that a lateral dimension of a bottom portion of the second-tier memory opening has a greater lateral dimension than a lateral dimension of a bottom portion of the first-tier memory opening, and a lateral dimension of a top-portion of the second-tier memory opening has a greater lateral dimension than a lateral dimension of the first-tier memory opening at a height of a top surface of a topmost first-tier sacrificial material layer of the first-tier sacrificial material layers; and the second-tier memory opening and the top portion of the first-tier memory opening are laterally expanded by performing:

a first isotropic etch process that laterally recesses physically exposed sidewalls of the second-tier insulating layers and a topmost first-tier insulating layer within the first-tier alternating stack by a first lateral recess distance; and a second isotropic etch process that laterally recesses physically exposed sidewalls of the second-tier sacrificial material layers by a second lateral recess distance.

10. The method of claim 1, further comprising:

forming a second-tier sacrificial memory opening fill structure in the second-tier memory opening and on the sacrificial pillar structure;

forming a third-tier alternating stack of third-tier insulating layers and third-tier sacrificial material layers over the second-tier alternating stack;

forming an additional etch mask layer over the third-tier alternating stack;

forming a third-tier memory opening through the third-tier alternating stack, wherein a top surface of the second-tier sacrificial memory opening fill structure is physically exposed underneath the third-tier memory opening;

removing the additional etch mask layer employing an additional etch mask removal process that collaterally removes a top portion of the second-tier sacrificial memory opening fill structure;

forming an additional sacrificial pillar structure by performing an additional selective material deposition process that grows an additional sacrificial fill material from a top surface of a remaining portion of the second-tier sacrificial memory opening fill structure while suppressing growth of the additional sacrificial fill material from physically exposed surfaces of the second-tier alternating stack and the third-tier alternating stack, wherein the inter-tier memory opening is formed by removing the second-tier sacrificial memory opening fill structure and at least a central portion of the additional sacrificial pillar structure.

11. The method of claim 10, further comprising forming at least one oxide layer and at least one nitride layer over the second-tier alternating stack followed by forming the third-tier alternating stack, wherein the at least one oxide layer has a higher wet etch rate than the third-tier insulating layers, and the at least one nitride layer has a higher wet etch rate than the third-tier sacrificial material layers.

12. The method of claim 10, further comprising laterally expanding the third-tier memory opening and a top portion of the second-tier memory opening that overlies a top surface of the additional sacrificial pillar structure, wherein the additional sacrificial pillar structure and the second-tier sacrificial memory opening fill structure are removed after laterally expanding the third-tier memory opening.

13. The method of claim 1, wherein:

the first-tier sacrificial memory opening fill structure and the central portion of the sacrificial pillar structure are removed by performing an anisotropic etch process that etches materials of the first-tier sacrificial memory opening fill structure and the sacrificial pillar structure selective to materials of the first-tier alternating stack and the second-tier alternating stack; and a tubular portion of the sacrificial pillar structure remains around the inter-tier memory opening after the anisotropic etch process.

14. The method of claim 13, wherein:

the memory opening fill structure is formed by sequentially depositing a memory film and a vertical semiconductor channel;

the memory film comprises the vertical stack of memory elements therein; and a cylindrical surface segment of the memory film is formed directly on an inner cylindrical sidewall of the tubular portion of the sacrificial pillar structure.

* * * * *